United States Patent
Miyatani

(10) Patent No.: US 11,451,715 B2
(45) Date of Patent: Sep. 20, 2022

(54) IMAGING APPARATUS, EXPOSURE CONTROLLING METHOD, AND IMAGING DEVICE

(71) Applicant: SONY CORPORATION, Tokyo (JP)

(72) Inventor: Yoshitaka Miyatani, Tokyo (JP)

(73) Assignee: SONY CORPORATION, Tokyo (JP)

( * ) Notice: Subject to any disclaimer, the term of this patent is extended or adjusted under 35 U.S.C. 154(b) by 68 days.

(21) Appl. No.: 16/755,324

(22) PCT Filed: Oct. 19, 2018

(86) PCT No.: PCT/JP2018/038940
§ 371 (c)(1),
(2) Date: Apr. 10, 2020

(87) PCT Pub. No.: WO2019/078333
PCT Pub. Date: Apr. 25, 2019

(65) Prior Publication Data
US 2021/0203829 A1    Jul. 1, 2021

(30) Foreign Application Priority Data

Oct. 19, 2017  (JP) .............................. JP2017-202771

(51) Int. Cl.
*H04N 5/235* (2006.01)
*H04N 5/232* (2006.01)
(Continued)

(52) U.S. Cl.
CPC ............ *H04N 5/2353* (2013.01); *G02B 5/20* (2013.01); *H01L 27/14621* (2013.01); *H01L 27/14643* (2013.01)

(58) Field of Classification Search
CPC .. H04N 5/2353; H04N 5/235; H04N 5/23229; H04N 5/23299; H04N 5/238;
(Continued)

(56) References Cited

U.S. PATENT DOCUMENTS

2009/0095912 A1* 4/2009 Slinger ................... G06T 1/164
250/363.06
2010/0097514 A1* 4/2010 McCarten ............. H04N 5/225
348/340
(Continued)

FOREIGN PATENT DOCUMENTS

CN        101080675 A        11/2007
CN        108370406 A         8/2018
(Continued)

OTHER PUBLICATIONS

Office Action for CN Patent Application No. 201880066128.4, dated Apr. 30, 2021, 05 pages of Office Action and 06 pages of English Translation.
(Continued)

*Primary Examiner* — Marly S Camargo
(74) *Attorney, Agent, or Firm* — Chip Law Group

(57) ABSTRACT

The present disclosure relates to an imaging apparatus, an exposure controlling method, a program, and an imaging device by which the restoration accuracy of an image can be improved. The imaging apparatus includes: an imaging device including a plurality of directive pixel output units that receives incident light from an imaging target entering without the intervention of any of an imaging lens and a pinhole and has a configuration capable of independently setting an incident angle directivity indicative of a directivity to an incident angle of the incident light and a non-directive pixel output unit that receives the incident light entering without the intervention of any of an imaging lens and a pinhole and does not have a configuration for providing the incident angle directivity; and an exposure controlling section configured to perform exposure control of the plurality of directive pixel output units on the basis of a non-directive detection signal that is a detection signal outputted from the non-directive pixel output unit. The
(Continued)

present disclosure can be applied, for example, to an imaging apparatus that performs imaging without using an imaging lens.

19 Claims, 35 Drawing Sheets

(51) Int. Cl.
*H04N 5/238* (2006.01)
*H04N 5/369* (2011.01)
*G02B 5/20* (2006.01)
*H01L 27/146* (2006.01)

(58) Field of Classification Search
CPC ........ H04N 5/3696; H04N 5/335; G02B 5/20; G02B 5/205; G03B 19/00; G03B 7/08; G03B 7/091; H01L 27/14643; H01L 27/14621; G01T 1/295
See application file for complete search history.

(56) References Cited

U.S. PATENT DOCUMENTS

| | | | |
|---|---|---|---|
| 2011/0074942 A1* | 3/2011 | Endo | A61B 1/04 348/68 |
| 2011/0174998 A1 | 7/2011 | Molnar et al. | |
| 2014/0111661 A1* | 4/2014 | Watanabe | H04N 5/228 348/208.6 |
| 2014/0368618 A1* | 12/2014 | Ushinaga | H04N 13/02 348/49 |
| 2015/0293018 A1 | 10/2015 | Stork et al. | |
| 2017/0230575 A1 | 8/2017 | Endsley et al. | |
| 2018/0047766 A1* | 2/2018 | Pyo | H01L 27/1463 |

FOREIGN PATENT DOCUMENTS

| | | | | |
|---|---|---|---|---|
| CN | 108702440 A | | 10/2018 | |
| JP | 2013-223054 A | | 10/2013 | |
| JP | 2015-121751 A | | 7/2015 | |
| JP | 2016-510910 A | | 4/2016 | |
| JP | 2017011513 A | * | 1/2017 | ....... H04N 5/232122 |
| WO | 2016/123529 A1 | | 8/2016 | |
| WO | 2016/208405 A1 | | 12/2016 | |
| WO | 2017/145348 A1 | | 8/2017 | |
| WO | 2017/149687 A1 | | 9/2017 | |

OTHER PUBLICATIONS

Asif, et al, "FlatCam: Replacing Lenses with Masks and Computation", IEEE International Conference on Computer Vision Workshop (ICCVW), Feb. 15, 2016, pp. 663-666.

International Search Report and Written Opinion of PCT Application No. PCT/JP2018/038940, dated Dec. 25, 2018, 07 pages of ISRWO.

Asif, et al, "FlatCam: Replacing Lenses with Masks and Computation", IEEE International Conference on Computer Vision Workshop (ICCVW), Dec. 7-13, 2015, 04 pages.

Asif, et al., "FlatCam: Replacing Lenses with Masks and Computation", IEEE, International Conference on Computer Vision Workshop (ICCVW), 2015, 04 pages.

Office Action for EP Patent Application No. 18869368.3, dated May 25, 2022, 05 pages of Office Action.

* cited by examiner

IMAGING APPARATUS, EXPOSURE CONTROLLING METHOD, AND IMAGING DEVICE

CROSS REFERENCE TO RELATED APPLICATIONS

This application is a U.S. National Phase of International Patent Application No. PCT/JP2018/038940 filed on Oct. 19, 2018, which claims priority benefit of Japanese Patent Application No. JP 2017-202771 filed in the Japan Patent Office on Oct. 19, 2017. Each of the above-referenced applications is hereby incorporated herein by reference in its entirety.

TECHNICAL FIELD

The present disclosure relates to an imaging apparatus, an exposure controlling method, a program, and an imaging device, and particularly to an imaging apparatus, an exposure controlling method, a program, and an imaging device by which the restoration accuracy of an image can be improved.

BACKGROUND ART

Conventionally, an imaging apparatus is proposed in which, without using an imaging lens, light from an imaging target is modulated and imaged by an optical filter including a lattice optical filter or a diffraction grating that covers a light reception face of an imaging device and the image in which an image of the imaging target is formed is restored by a predetermined calculation process (refer to, for example, NPL 1, PTL 1, and PTL 2).

CITATION LIST

Non Patent Literature

[NPL 1]
M. Salman Asif and four others, "Flatcam: Replacing lenses with masks and computation," "2015 IEEE International Conference on Computer Vision Workshop (ICCVW)," 2015, pp. 663-666

PATENT LITERATURE

[PTL 1]
JP-T-2016-510910
[PTL 2]
PCT Patent Publication No. WO2016/123529

SUMMARY

Technical Problem

Incidentally, in the imaging apparatus exemplified in NPL 1, PTL 1, and PTL 2, since a calculation process is performed using all detection signals outputted from pixels of an imaging device, if saturation occurs even with one pixel, the influence of this is had on the overall imaging apparatus and the restoration accuracy of the image degrades. As a result, the image quality of the restored image degrades.

The present disclosure has been made in view of such a situation as described above and contemplates improvement of the restoration accuracy of an image.

Solution to Problem

An imaging apparatus of a first aspect of the present disclosure includes: an imaging device including a plurality of directive pixel output units that receives incident light from an imaging target entering without intervention of any of an imaging lens and a pinhole and has a configuration capable of independently setting an incident angle directivity indicative of a directivity to an incident angle of the incident light and a non-directive pixel output unit that receives the incident light entering without the intervention of any of an imaging lens and a pinhole and does not have a configuration for providing the incident angle directivity; and an exposure controlling section configured to perform exposure control of the plurality of directive pixel output units on the basis of a non-directive detection signal that is a detection signal outputted from the non-directive pixel output unit.

An exposure controlling method of a second aspect of the present disclosure includes an exposure controlling step of performing exposure control of a plurality of directive pixel output units, which receives incident light from an imaging target entering without intervention of any of an imaging lens and a pinhole and has a configuration capable of independently setting an incident angle directivity indicative of a directivity to an incident angle of the incident light, on the basis of a non-directive detection signal that is a detection signal outputted from a non-directive pixel output unit that receives the incident light entering without the intervention of any of an imaging lens and a pinhole and does not have a configuration for providing the incident angle directivity.

A program of a third aspect of the present disclosure causes a computer of an imaging apparatus, which includes an imaging device including a plurality of directive pixel output units that receives incident light from an imaging target entering without intervention of any of an imaging lens and a pinhole and has a configuration capable of independently setting an incident angle directivity indicative of a directivity to an incident angle of the incident light and a non-directive pixel output unit that receives the incident light entering without the intervention of any of an imaging lens and a pinhole and does not have a configuration for providing the incident angle directivity, to execute a process including an exposure controlling step of performing exposure control of the plurality of directive pixel output units on the basis of a non-directive detection signal that is a detection signal outputted from the non-directive pixel output unit.

An imaging device of a fourth aspect of the present disclosure includes: a plurality of directive pixel output units that receives incident light from an imaging target entering without intervention of any of an imaging lens and a pinhole and has a configuration capable of independently setting an incident angle directivity indicative of a directivity to an incident angle of the incident light; and a non-directive pixel output unit that receives the incident light entering without the intervention of any of an imaging lens and a pinhole and does not have a configuration for providing the incident angle directivity, has a light reception sensitivity higher than that of the directive pixel output units, and is used for exposure control of the plurality of directive pixel output units.

In the first to third aspects of the present disclosure, exposure control of a plurality of directive pixel output units, which receives incident light from an imaging target entering without intervention of any of an imaging lens and a pinhole and has a configuration capable of independently setting an incident angle directivity indicative of a directivity to an incident angle of the incident light is performed on the basis of a non-directive detection signal that is a detection signal outputted from a non-directive pixel output unit that receives the incident light entering without the intervention of any of an imaging lens and a pinhole and does not have a configuration for providing the incident angle directivity.

In the fourth aspect of the present disclosure, by a plurality of directive pixel output units having a configuration capable of independently setting an incident angle directivity indicative of a directivity to an incident angle of incident light from an imaging target and a non-directive pixel output unit that does not have a configuration for providing the incident angle directivity, has a light reception sensitivity higher than that of the directive pixel output units, and is used for exposure control of the plurality of directive pixel output units, the incident light is received without the intervention of any of an imaging lens and a pinhole.

Advantageous Effects of Invention

According to the first to fourth aspects of the present disclosure, the restoration accuracy of an image can be improved.

It is to be noted that the advantageous effect described here is not necessarily restrictive, and other advantageous effects described in the present disclosure may be applicable.

DESCRIPTION OF EMBODIMENTS

In the following, preferred embodiments of the present disclosure are described with reference to the accompanying drawings. It is to be noted that components having a substantially same functional configuration are denoted by the same reference signs and overlapping description of them is suitably omitted.

Further, the description is given in the following order.
1. Overview of Imaging Apparatus of Present Disclosure
2. Example of Basic Configuration of Imaging Apparatus of Present Disclosure
3. First Embodiment: Example in Which Exposure Time of Imaging Device Is Controlled
4. Second Embodiment: Example in Which ND Filter Is Used
5. Modifications
6. Others 1. Overview of Imaging Apparatus of Present Disclosure First, an overview of the imaging apparatus of the present disclosure is described.

Figure 1:
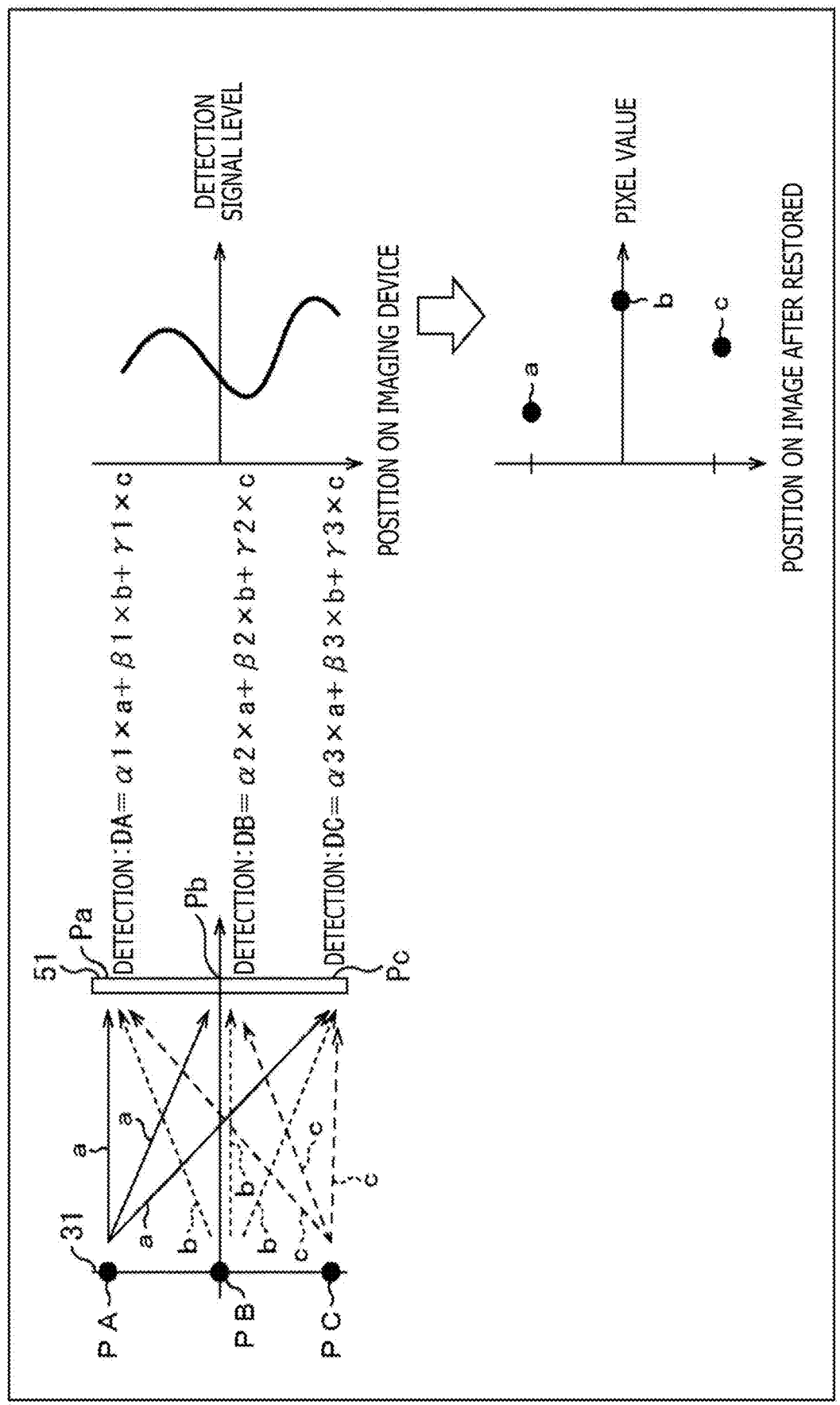
FIG. 1 is a view illustrating a principle of imaging by an imaging apparatus to which the technology of the present disclosure is applied.

The imaging apparatus of the present disclosure uses an imaging device 51 in which the detection sensitivity of each pixel has incident angle directivity as depicted in the upper left of FIG. 1. Here, that the detection sensitivity of each pixel has incident angle directivity signifies that the light reception sensitivity characteristic according to the incident angle of incident light to a pixel is made different for each pixel. However, the light reception sensitivity need not be fully different among all pixels but may be same in some of the pixels.

Here, it is assumed that, for example, all imaging targets are a set of point light sources and light is emitted in every direction from each point light source. For example, it is assumed that, for example, an imaging target face 31 of an imaging target in the upper left of FIG. 1 includes a point light source PA to a point light source PC and the point light sources PA to PC emit a plurality of rays of light of a light intensity a to a light intensity c around. Further, in the following description, it is assumed that the imaging device 51 includes, at positions Pa to Pc thereof, pixels having incident angle directivities different from one another (hereinafter referred to as pixels Pa to Pc).

In this case, as indicated in the upper left of FIG. 1, rays of light of a same light intensity emitted from the same point light source enter pixels of the imaging device 51. For example, rays of light of the light intensity a emitted from the point light source PA individually enter the pixels Pa to Pc of the imaging device 51. On the other hand, rays of light emitted from a same point light source enter the pixels at incident angles different from one another. For example, rays of light of the point light source PA enter the pixels Pa to Pc at incident angles different from one another.

Here, since the incident angle directivities of the pixels Pa to Pc are different from one another, rays of light of a same light intensity emitted from the same point light source are detected with sensitivities different among the different pixels. As a result, the rays of light of the same light intensity are detected at signal levels different from one another by the different pixels. For example, the detection signal level in regard to a ray of light of the light intensity a from the point light source PA has different values from one another at the pixels Pa to Pc.

Then, the light reception sensitivity level of each pixel for a ray of light from each point light source is calculated by multiplying the light intensity of the ray of light by a coefficient indicative of a light reception sensitivity (namely, incident angle directivity) at the incident angle of the ray of light. For example, the detection signal level of the pixel Pa for a ray of light from the point light source PA is calculated by multiplying the light intensity a of the ray of light of the point light source PA by a coefficient indicative of the incident angle directivity of the pixel Pa at the incident angle of the ray of light to the pixel Pa.

Accordingly, the detection signal levels DA, DB, and DC at the pixels Pc, Pb, and Pa are represented by the following expressions (1) to (3), respectively.

$$DA = \alpha 1 \times a + \beta 1 \times b + \gamma 1 \times c \quad (1)$$

$$DB = \alpha 2 \times a + \beta 2 \times b + \gamma 2 \times c \quad (2)$$

$$DC = \alpha 3 \times a + \beta 3 \times b + \gamma 3 \times c \quad (3)$$

Here, the coefficient $\alpha 1$ is a coefficient indicative of the incident angle directivity of the pixel Pc at the incident angle of a ray of light from the point light source PA to the pixel Pc, and is set according to the incident angle. Further, $\alpha 1 \times a$ indicates the detection signal level at the pixel Pc for the ray of light from the point light source PA.

The coefficient $\beta 1$ is a coefficient indicative of the incident angle directivity of the pixel Pc at the incident angle of a ray of light from the point light source PB to the pixel Pc, and is set according to the incident angle. Further, $\beta 1 \times b$ indicates the detection signal level at the pixel Pc for the ray of light from the point light source PB.

The coefficient $\gamma 1$ is a coefficient indicative of the incident angle directivity of the pixel Pc at the incident angle of a ray of light y from the point light source PC to the pixel Pc, and is set according to the incident angle. Further, $\gamma 1 \times c$ indicates the detection signal level at the pixel Pc for the ray of light from the point light source PC.

In this manner, the detection signal level DA of the pixel Pa is calculated by the product sum of the light intensities a, b, and c of light rays at the pixel Pc from the point light sources PA, PB, and PC and the coefficients $\alpha 1$, $\beta 1$, and $\gamma 1$ indicative of the incident angle directivities according to the respective incident angles.

Similarly, the detection signal level DB of the pixel Pb is calculated by the product sum of the light intensities a, b, and c of rays of light at the pixel Pb from the point light sources PA, PB, and PC and the coefficients $\alpha 2$, $\beta 2$, and $\gamma 2$ indicative of the incident angle directivities according to the respective incident angles as indicated by the expression (2). Further, the detection signal level DC of the pixel Pc is calculated by the product sum of the light intensities a, b, and c of rays of light at the pixel Pa from the point light sources PA, PB, and PC and the coefficients $\alpha 2$, $\beta 2$, and $\gamma 2$ indicative of the incident angle directivities according to the respective incident angles as indicated by the expression (3).

However, the detection signal levels DA, DB, and DC at the pixels Pa, Pb, and Pc are mixtures of the light intensities a, b, and c of rays of light emitted from the point light sources PA, PB, and PC as indicated by the expressions (1) to (3). Accordingly, as indicated at the upper right of FIG. 1, the detection signal level at the imaging device 51 is different from the light intensities of the point light sources on the imaging target face 31. Accordingly, the image obtained by the imaging device 51 is different from an image in which an image of the imaging target face 31 is formed.

On the other hand, by creating simultaneous equations including the expressions (1) to (3) and solving the created simultaneous equations, the light intensities a to c of light rays of the point light sources PA to PC are found. Then, by arranging the pixels having pixel values according to the calculated light intensities a to c in accordance with the arrangement (relative positions) of the point light sources PA to PC, a restoration image in which the image of the imaging target face 31 is formed as depicted in the lower right of FIG. 1 is restored.

It is to be noted that an aggregation of coefficients (for example, the coefficients $\alpha 1$, $\beta 1$, and $\gamma 1$) for each expression configuring simultaneous equations is hereinafter referred to as coefficient set. Further, an aggregation of a plurality of coefficient sets corresponding to a plurality of expressions included in simultaneous equations (for example, the coefficient set $\alpha 1$, $\beta 1$, and $\gamma 1$, coefficient set $\alpha 2$, $\beta 2$, and $\gamma 2$ and coefficient set $\alpha 3$, $\beta 3$, and $\gamma 3$) is hereinafter referred to as coefficient set group.

In this manner, it becomes possible to implement an imaging apparatus that includes, as essential components, the imaging device 51 having an incident angle directivity at each pixel without the necessity for an imaging lens, a pinhole and the optical filter disclosed in PTL 1 and NPL 1 (hereinafter referred to as patent document and so forth). As a result, since an imaging lens, a pinhole and the optical filter disclosed in the patent document and so forth do not become essential components, reduction in height of the imaging apparatus, namely, in thickness of the configuration for implementing an imaging function in the entering direction of light, becomes possible.

Further, since the essential component is only the imaging device 51, it is possible to improve the degree of freedom in design. For example, although, in a conventional imaging apparatus that uses an imaging lens, it is necessary to arrange a plurality of pixels of an imaging device in a two-dimensional array in accordance with a position at which an image of an imaging target is to be formed by the imaging lens, an imaging apparatus that uses the imaging device 51 does not have the necessity. Therefore, the degree of freedom in arrangement of pixels is improved, and it is possible to freely arrange pixels, for example, within a range into which light from an imaging target enters. Accordingly, it is possible to arrange pixels in a circular range, to arrange pixels in a hollow square region or to arrange pixels dispersedly in a plurality of regions.

Then, by creating such simultaneous equations as indicated by the expressions (1) to (3) given hereinabove using coefficients according to incident angles of rays of light from point light sources on the imaging target face 31 to pixels irrespective of the arrangement of the pixels and solving the simultaneous equations, the light intensity of the light ray from each point light source can be found. Then, by arranging the pixels having the pixel values according to the calculated light intensities of the point light sources in accordance with the arrangement of the point light sources on the imaging target face 31, a restoration image in which an image of the imaging target face 31 is formed can be restored.

2. Example of Basic Configuration of Imaging Apparatus of Present Disclosure

Now, an example of a basic configuration of the imaging apparatus of the present disclosure is described with reference to FIGS. 2 to 25.

<Example of Configuration of Imaging Apparatus 101>

Figure 2:
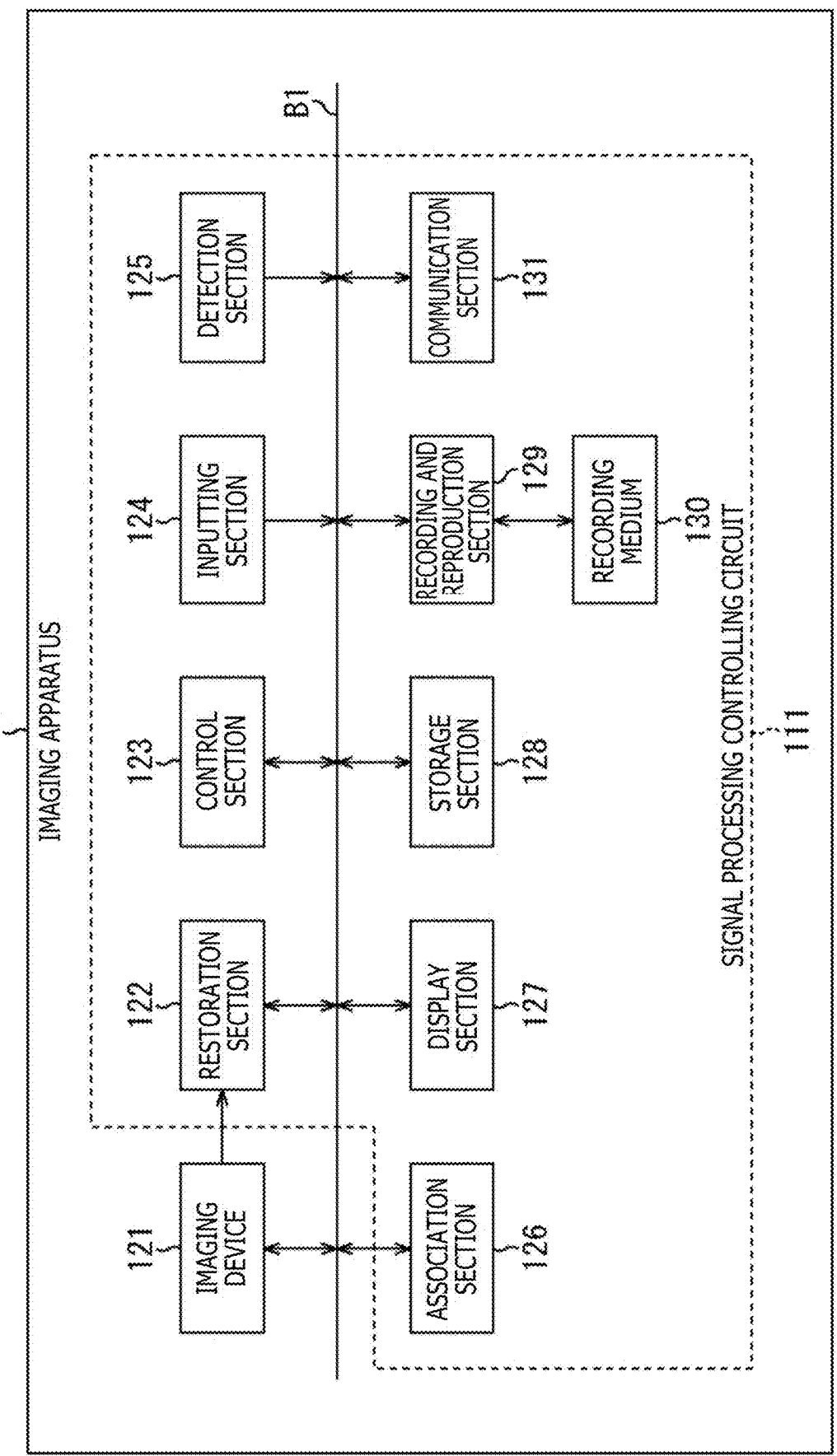
FIG. 2 is a block diagram depicting an example of a basic configuration of the imaging apparatus to which the technology of the present disclosure is applied.

FIG. 2 is a block diagram depicting an example of a configuration of the imaging apparatus 101 that is a basic imaging apparatus to which the technology of the present disclosure is applied.

The imaging apparatus 101 includes an imaging device 121, a restoration section 122, a control section 123, an inputting section 124, a detection section 125, an association section 126, a display section 127, a storage section 128, a recording and reproduction section 129, a recording medium 130, and a communication section 131. Further, a signal processing controlling section 111 that performs signal processing, control of the imaging apparatus 101, and so forth includes the restoration section 122, the control section 123, the inputting section 124, the detection section 125, the association section 126, the display section 127, the storage section 128, the recording and reproduction section 129, the recording medium 130, and the communication section 131. It is to be noted that the imaging apparatus 101 does not include any imaging lens (imaging lens-free).

Further, the imaging device 121, the restoration section 122, the control section 123, the inputting section 124, the detection section 125, the association section 126, the display section 127, the storage section 128, the recording and reproduction section 129, and the communication section 131 are connected to one another through a bus B1 such that they perform transmission, reception, and so forth of data through the bus B1. It is to be noted that, in order to simplify description, description of the bus B1 in the case where the components of the imaging apparatus 101 perform transmission, reception, and so forth of data through the bus B1 is omitted. For example, in the case where the inputting section 124 data supplies to the control section 123 through the bus B1, this is described such that the inputting section 124 supplies data to the control section 123.

The imaging device 121 corresponds to the imaging device 51 described hereinabove with reference to FIG. 1 and is an imaging device that includes pixels having an incident angle directivity and outputs an image including a detection signal indicative of a detection signal level according to a light amount of incident light to the restoration section 122 or the bus B1.

More particularly, the imaging device 121 may be, in a basic structure, an imaging device similar to an imaging device of a general, for example, CMOS (Complementary Metal Oxide Semiconductor) image sensor or the like. However, the imaging device 121 is different in configuration of pixels configuring a pixel array from a general one and has a configuration that pixels have an incident angle directivity as hereinafter described, for example, with reference to FIGS. 3 to 5. Further, the imaging device 121 is different in (changes) light reception sensitivity in response to the incident angle of incident light for each pixel and has an incident angle directivity for an incident angle of incident light in a unit of a pixel.

It is to be noted that, since an image outputted from the imaging device 121 is an image including detection signals in which an image of an imaging target is not formed as depicted, for example, in the upper right of FIG. 1 described hereinabove, the imaging target cannot be recognized visually. In other words, although a detection image including detection signals outputted from the imaging device 121 is an aggregation of pixel signals, it is an image on which the imaging target cannot be recognized, even if the user sees, by the user (image on which the imaging target cannot be visually recognized).

Therefore, in the following description, an image including a detection signal where an image of an imaging target is not formed as depicted in the upper right of FIG. 1, namely, an image captured by the imaging device 121, is referred to as detection image.

It is to be noted that the imaging device 121 may not be configured as a pixel array and, for example, may be configured as a line sensor. Further, the incident angle directivity need not be all different in a unit of a pixel, but some pixels may have a same incident angle directivity.

The restoration section 122 acquires, from the storage section 128, a coefficient set group corresponding to an imaging target distance corresponding to a distance from the imaging device 51 to the imaging target face 31 (imaging target face corresponding to a restoration image) in FIG. 1 and corresponding to the coefficients $\alpha 1$ to $\alpha 3$, $\beta 1$ to $\beta 3$, and $\gamma 1$ to $\gamma 3$ described hereinabove. Further, the restoration section 122 creates such simultaneous equations as indicated by the expressions (1) to (3) given hereinabove using detection signal levels of the pixels of a detection image outputted from the imaging device 121 and the acquired coefficient set group. Then, the restoration section 122 solves the created simultaneous equations to calculate pixel values of the pixels configuring the image in which an image of the imaging target depicted at the right lower portion of FIG. 1 is formed. Consequently, an image in which the imaging target can be recognized by visual observation of the user (imaging target can be visually recognized) is restored from the detection image. In the following description, the image restored from the detection image is referred to as restoration image. However, in the case where the imaging device 121 has sensitivity only to light other than that in a visually recognizable frequency band such as ultraviolet light, although also the restored image does not become an image on which an imaging target can be identified as in an ordinary image, also in this instance, the restored image is referred to as restoration image.

Further, in the following description, a restoration image that is an image in a state in which an image of an imaging target is formed but is an image before color separation such as a demosaic process or a synchronization process is referred to as RAW image, and a detection image captured by the imaging device 121 is distinguished not as a RAW image although it is an image according to an array of color filters.

It is to be noted that the number of pixels of the imaging device 121 and the pixel number of pixels that configure a restoration image need not necessary be equal to each other.

Further, the restoration section 122 performs, for a restoration image, a demosaic process, $\gamma$ correction, white balance adjustment, a conversion process into a predetermined compression format and so forth as occasion demands. Then, the restoration section 122 outputs the restoration image to the bus B1.

The control section 123 includes, for example, various types of processors and controls the components of the imaging apparatus 101.

The inputting section 124 includes inputting devices for performing an operation of the imaging apparatus 101 and inputting of data to be used for processing and so forth (for example, keys, switches, buttons, dials, a touch panel, a remote controller, and so forth). The inputting section 124 outputs an operation signal, inputted data, and so forth to the bus B1.

The detection section 125 includes various types of sensors and so forth to be used for detection of a state of the imaging apparatus 101 and an imaging target. For example, the detection section 125 includes an acceleration sensor and a gyro sensor for detecting the posture or a movement of the imaging apparatus 101, a position detection sensor for detecting the position of the imaging apparatus 101 (for example, a GNSS (Global Navigation Satellite System) receiver and so forth), a distance measurement sensor for detecting an imaging target distance and so forth. The detection section 125 outputs a signal representative of a result of the detection to the bus B1.

The association section 126 performs association between a detection image obtained by the imaging device 121 and metadata corresponding to the detection image. The metadata includes, for example, a coefficient set group, an imaging target distance and so forth for restoring a restoration image using a detection image that is a target.

It is to be noted that the method for associating a detection image and metadata with each other is not specifically restricted if it can specify a corresponding relation between the detection image and the metadata. For example, by applying metadata to image data including a detection image, by applying a same ID to a detection image and metadata, or by recording a detection image and metadata into a same recording medium 130, the detection image and the metadata can be associated with each other.

The display section 127 is configured, for example, from a display and performs display of various kinds of information (for example, a restoration image or the like). It is to be noted that also it is possible to configure the display section 127 such that it includes a sound outputting section such as a speaker to perform outputting of sound.

The storage section 128 includes one or more storage devices such as a ROM (Read Only Memory), a RAM (Random Access Memory) and a flash memory and stores a program, data and so forth used, for example, in processing of the imaging apparatus 101. For example, the storage section 128 stores coefficient set groups corresponding to the coefficients $\alpha 1$ to $\alpha 3$, $\beta 1$ to $\beta 3$, and $\gamma 1$ to $\gamma 3$ described hereinabove in an associated relation with various imaging target distances. More particularly, for each of imaging target faces 31 at different imaging target distances, the storage section 128 stores a coefficient set group including coefficients for the pixels 121a of the imaging device 121 with respect to each point light source set on the imaging target face 31.

The recording and reproduction section 129 performs recording of data into the recording medium 130 and reproduction (reading out) of data recorded in the recording medium 130. For example, the recording and reproduction section 129 records a restoration image into the recording medium 130 and reads out the restoration image from the recording medium 130. Further, the recording and reproduction section 129 records a detection image and corresponding metadata into the recording medium 130 and reads out them from the recording medium 130.

The recording medium 130 is one or a combination of, for example, an HDD (Hard Disk Drive), an SSD (Solid State Drive), a magnetic disk, an optical disk, a magneto-optical disk, a semiconductor memory, and so forth.

The communication section 131 performs communication with a different apparatus (for example, a different imaging apparatus, a signal processing apparatus or the like) by a predetermined communication method. It is to be noted that the communication method of the communication section 131 may be any of wired communication and wireless communication. Also it is possible for the communication section 131 to be made ready for a plurality of communication methods.

<First Example of Configuration of Imaging Device 121>

Now, a first example of a configuration of the imaging device 121 of the imaging apparatus 101 of FIG. 2 is described with reference to FIGS. 3 and 4.

Figure 3:
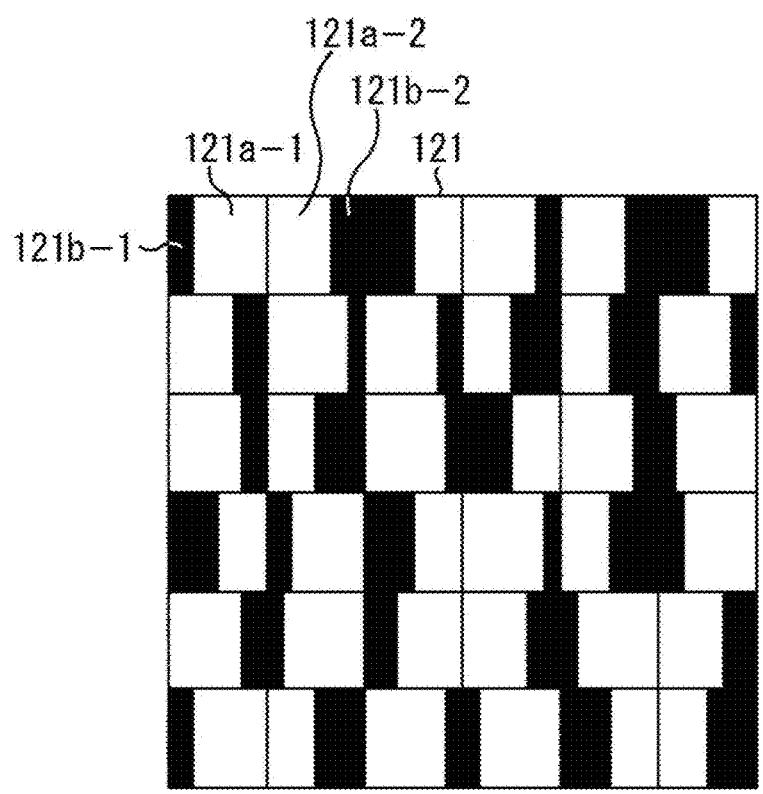
FIG. 3 is a view depicting an example of a configuration of a pixel array section of an imaging device of FIG. 2.

FIG. 3 depicts a front elevational view of part of the pixel array section of the imaging device 121. It is to be noted that, although FIG. 3 depicts an example of a case in which the number of pixels of the pixel array section is vertical six pixels×horizontal six pixels, the pixel number of the pixel array section is not limited to this.

In the imaging device 121 of FIG. 3, a light shielding film 121b that is one of modulation elements is provided for each pixel 121a such that it covers part of a light reception region (light reception face) of the photodiode of the pixel 121a, and incident light entering each pixel 121a is optically modulated in response to an incident angle. Then, for example, by providing the light shielding film 121b for a range different for each pixel 121a, the light reception sensitivity to the incident angle of incident light becomes different for each pixel 121a, and the pixels 121a have incident angle directivities different from one another.

For example, the pixel 121a-1 and the pixel 121a-2 are different from each other in range over which the light reception region of the photodiode is shielded by the light shielding film 121b-1 and the light shielding film 121b-2 (different in at least one of the shielded region (position) and the shielded area). In particular, in the pixel 121a-1, the light shielding film 121b-1 is provided such that it shields a left side portion of the light reception region of the photodiode with a predetermined width. On the other hand, in the pixel 121a-2, the light shielding film 121b-2 is provided such that it shields a right side portion of the light reception region with a predetermined width. It is to be noted that the width over which the light reception region of the photodiode is shielded by the light shielding film 121b-1 and the width over which the light reception region of the photodiode is shielded by the light shielding film 121b-2 may be different from each other or may be equal to each other. Also in the other pixels 121a, the light shielding films 121b are arrayed at random in the pixel array such that the pixels are shielded over the ranges of the light reception regions different from one another.

It is to be noted that, as the ratio at which the light shielding film 121b covers the light reception region of a pixel increases, the amount of light that can be received by the photodiode decreases. Accordingly, the area of the light shielding film 121b is preferably made an area of such a degree that a desired light amount can be assured, and for example, the area may be restricted such that it is approximately ¾ the light reception region in the maximum. This makes it possible to assure a light amount equal to or greater than a desired amount. However, if a non-shielded range of a width corresponding to the wavelength of light to be received is provided for each pixel, then it is possible to receive a minimal light amount. That is, for example, in the case of a B pixel (blue pixel), although the wavelength is approximately 500 nm, it is possible to receive a minimal light amount if it is not shielded to an extent of the width corresponding to the wavelength or more.

Figure 4:
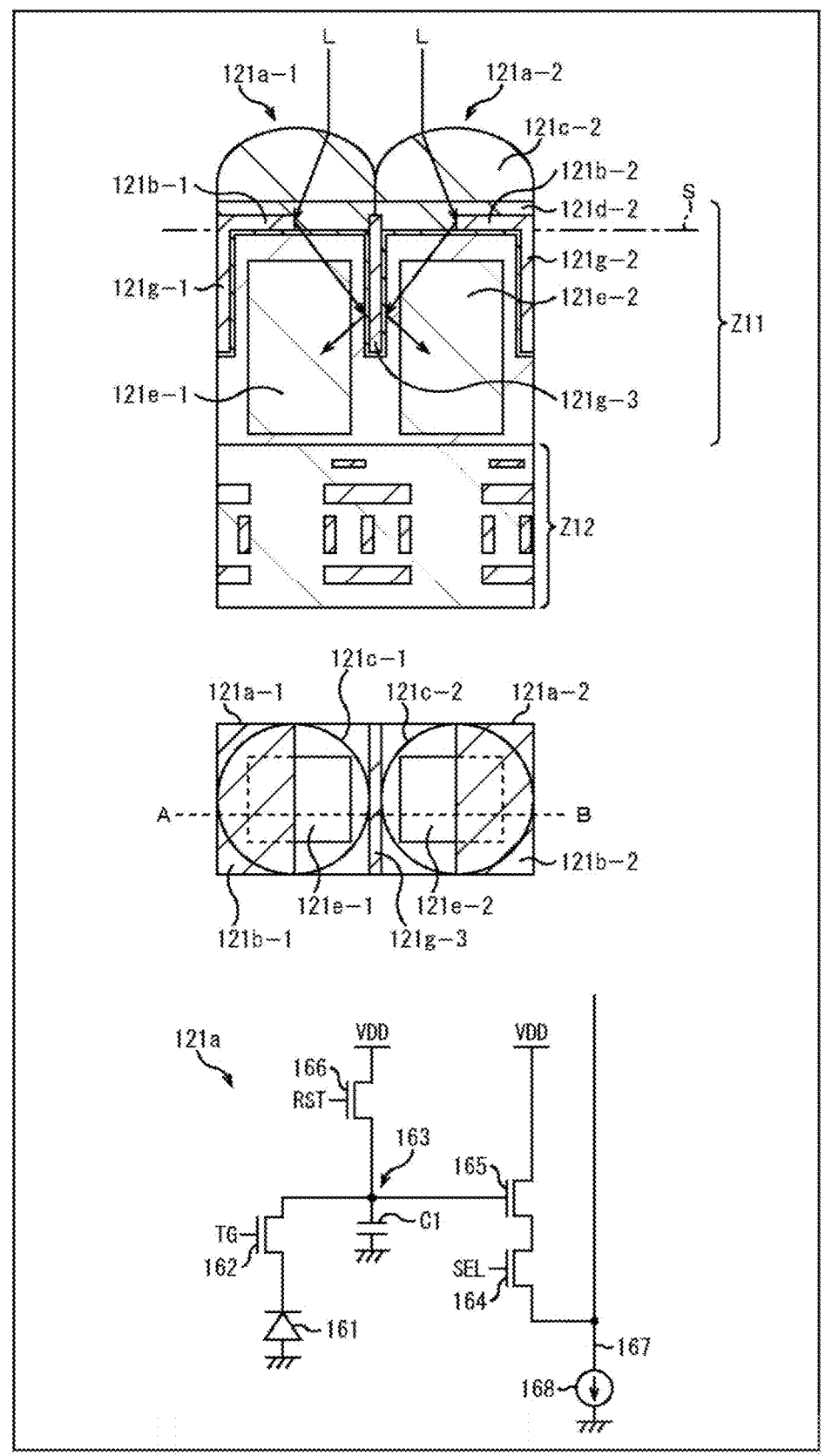
FIG. 4 is a view illustrating a first example of a configuration of the imaging device of FIG. 2.

An upper stage of FIG. 4 is a side elevational sectional view of the first configuration example of the imaging device 121, and a middle stage of FIG. 4 is a top plan view of the first configuration example of the imaging device 121. Further, the side elevational sectional view at the upper stage of FIG. 4 is an AB cross section at the middle stage of FIG. 4. Further, a lower stage of FIG. 4 depicts an example of a circuit configuration of the imaging device 121.

In the imaging device 121 at the upper stage of FIG. 4, incident light enters from above to below in the figure. The pixels 121a-1 and 121a-2 adjacent each other have a wiring layer Z12 in a lowermost layer in the figure and a photoelectric conversion layer Z11 is provided on the wiring layer Z12 such that they are configured as those of the so-called backside illumination type.

It is to be noted that, in the case where there is no necessity to distinguish the pixels 121a-1 and 121a-2 from each other, each of them is referred to merely as pixel 121a with the number at the end of the reference sign omitted. In the following description of the specification, also other components are sometimes denoted by reference signs with the number at the end of the reference sign omitted.

Further, in FIG. 4, only a side elevational view and a top plan view for two pixels configuring the pixel array of the imaging device 121 are depicted, and needless to say, although a greater number of pixels 121a are arranged, illustration of them is omitted.

Further, the pixels 121a-1 and 121a-2 include photodiodes 121e-1 and 121e-2 in the photoelectric conversion layer Z11, respectively. Further, on the photodiodes 121e-1 and 121e-2, on-chip lenses 121c-1 and 121c-2 and color filters 121d-1 and 121d-2 are stacked from above, respectively.

The on-chip lenses 121c-1 and 121c-2 condense incident light on the photodiodes 121e-1 and 121e-2.

The color filters 121d-1 and 121d-2 are optical filters each of which transmits light of a specific wavelength such as, for example, red, green, blue, infrared, or white. It is to be noted that, in the case of white, the color filters 121d-1 and 121d-2 may be transparent filters or may not be provided.

On a boundary between pixels in the photoelectric conversion layer Z11 of the pixels 121a-1 and 121a-2, light shielding films 121g-1 to 121g-3 are formed and suppress incident light L from entering an adjacent pixel as depicted, for example, in FIG. 4 thereby to suppress occurrence of crosstalk.

Further, as depicted at the upper and middle stages of FIG. 4, the light shielding films 121b-1 and 121b-2 shield part of a light reception face S as viewed from above. In the light reception face S of the photodiodes 121e-1 and 121e-2 of the pixels 121a-1 and 121a-2, different ranges are shielded by the light shielding films 121b-1 and 121b-2, and consequently, incident angle directivities different from each other are set independently for each pixel. However, the range to be shielded need not be differ among all pixels 121a of the imaging device 121, and pixels 121a that are shielded over a same range may exist partly.

It is to be noted that, as depicted at the upper stage of FIG. 4, the light shielding film 121b-1 and the light shielding film 121g-1 are connected to each other and are configured in an L shape as viewed from the side. Similarly, the light shielding film 121b-2 and the light shielding film 121g-2 are connected to each other and are configured in an L shape as viewed from the side. Further, the light shielding film 121b-1, the light shielding film 121b-2, and the light shielding films 121g-1 to 121g-3 include metal and, for example, include tungsten (W), aluminum (Al) or an alloy of Al and copper (Cu). Further, the light shielding film 121b-1, the light shielding film 121b-2, and the light shielding films 121g-1 to 121g-3 may be formed simultaneously from a metal same as that of wires by a process same as a process by which the wires are formed in a semiconductor process. It is to be noted that the film thicknesses of the light shielding film 121b-1, the light shielding film 121b-2, and the light shielding films 121g-1 to 121g-3 may not be a same thickness depending upon the position.

Further as depicted at the lower stage of FIG. 4, the pixel 121a includes a photodiode 161 (corresponding to the photodiode 121e), a transfer transistor 162, an FD (Floating Diffusion) portion 163, a selection transistor 164, an amplification transistor 165 and a reset transistor 166 and is connected to a current source 168 through a vertical signal line 167.

The photodiode 161 is grounded at the anode electrode thereof and connected at the cathode electrode thereof to the gate electrode of the amplification transistor 165 through the transfer transistor 162.

The transfer transistor 162 is driven in accordance with a transfer signal TG. If the transfer signal TG supplied to the gate electrode of the transfer transistor 162 becomes the high level, then the transfer transistor 162 is turned on. Consequently, charge accumulated in the photodiode 161 is transferred to the FD portion 163 through the transfer transistor 162.

The amplification transistor 165 serves as an inputting portion of a source follower circuit that is a reading out circuit for reading out a signal obtained by photoelectric conversion by the photodiode 161, and outputs a pixel signal of a level according to the charge accumulated in the FD portion 163 to the vertical signal line 167. In particular, the amplification transistor 165 is connected at the drain terminal thereof to the power supply VDD and connected at the source terminal thereof to the vertical signal line 167 through the selection transistor 164 such that it cooperates with the current source 168 connected at one end of the vertical signal line 167 to configure a source follower.

The FD portion 163 is a floating diffusion region having charge capacitance C1 provided between the transfer transistor 162 and the amplification transistor 165 and temporarily accumulates charge transferred from the photodiode 161 through the transfer transistor 162. The FD portion 163 is a charge detection portion for converting charge into a voltage, and the charge accumulated in the FD portion 163 is converted into a voltage by the amplification transistor 165.

The selection transistor 164 is driven in accordance with a selection signal SEL such that, when the selection signal SEL supplied to the gate electrode thereof becomes the high level, then the selection transistor 164 is turned on to connect the amplification transistor 165 and the vertical signal line 167 to each other.

The reset transistor 166 is driven in accordance with a reset signal RST. For example, if the reset signal RST supplied to the gate electrode of the reset transistor 166 becomes the high level, then the reset transistor 166 is turned on and discharges charge accumulated in the FD portion 163 to the power supply VDD to reset the FD portion 163.

For example, the pixel circuit depicted at the lower stage of FIG. 4 operates in the following manner.

In particular, as first operation, the reset transistor 166 and the transfer transistor 162 are turned on to discharge charge accumulated in the FD portion 163 to the power supply VDD to reset the FD portion 163.

As second operation, the reset transistor 166 and the transfer transistor 162 are turned off to enter an exposure period, within which charge according to the light amount of incident light is accumulated by the photodiode 161.

As third operation, the reset transistor 166 is turned on to reset the FD portion 163, whereafter the reset transistor 166 is turned off. By this operation, the FD portion 163 is set to a reference potential.

As fourth operation, the potential of the FD portion 163 in the reset state is outputted as a reference potential from the amplification transistor 165.

As fifth operation, the transfer transistor 162 is turned on and charge accumulated in the photodiode 161 is transferred to the FD portion 163.

As sixth operation, the potential of the FD portion 163 to which the charge of the photodiode is transferred is outputted as a signal potential from the amplification transistor 165.

Then, a signal when the reference potential is subtracted from the signal potential by CDS (correlated double sampling) is outputted as a detection signal (pixel signal) of the pixel 121*a*. This value of the detection signal (output pixel value) is modulated in accordance with the incident angle of incident light from the imaging target and differs in characteristic (directivity) depending upon the incident angle (has an incident angle directivity).

<Second Example of Configuration of Imaging Device 121>

Figure 5:
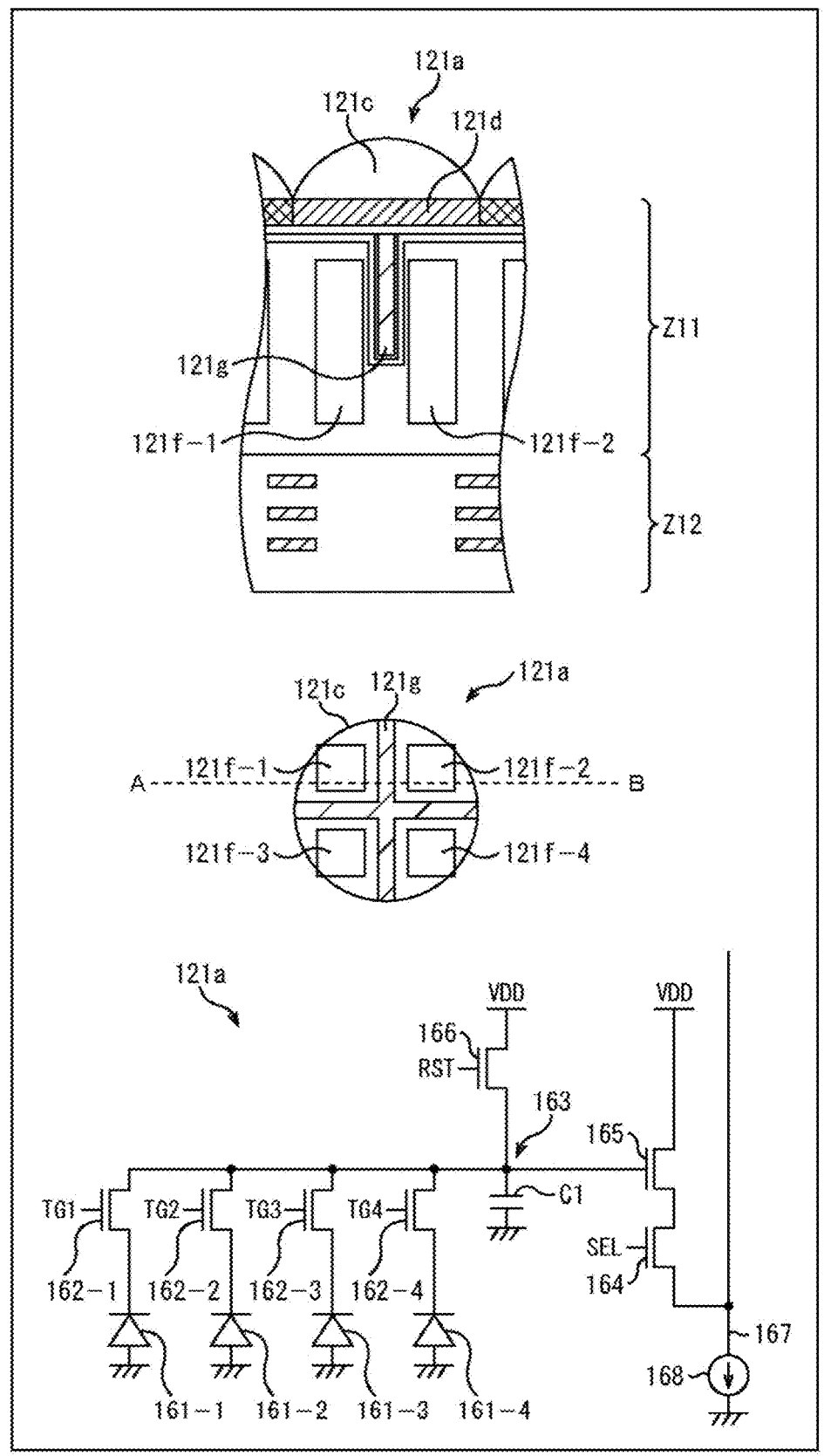
FIG. 5 is a view illustrating a second example of a configuration of the imaging device of FIG. 2.

FIG. 5 is a view depicting a second example of a configuration of the imaging device 121. At an upper stage of FIG. 5, a side elevational sectional view of a pixel 121*a* of the imaging device 121 of the second example of a configuration is depicted, and at a middle stage of FIG. 5, a top plan view of the imaging device 121 is depicted. Further, the side elevational view at the upper stage of FIG. 5 depicts an AB cross section at the middle stage of FIG. 5. Further, a lower stage of FIG. 5 depicts an example of a circuit configuration of the imaging device 121.

The imaging device 121 of FIG. 5 is different in configuration from the imaging device 121 of FIG. 4 in that four photodiodes 121*f*-1 to 121*f*-4 are formed on one pixel 121*a* and a light shielding film 121*g* is formed in a region that separates the photodiodes 121*f*-1 to 121*f*-4 from each other. In particular, in the imaging device 121 of FIG. 5, the light shielding film 121*g* is formed in a "+" shape as viewed from above. It is to be noted that such common components as described above are denoted by the same reference signs to those of FIG. 4 and detailed description of them is omitted.

In the imaging device 121 of FIG. 5, the photodiodes 121*f*-1 to 121*f*-4 are separated from each other by the light shielding film 121*g* to prevent occurrence of electric and optical crosstalk between the photodiodes 121*f*-1 to 121*f*-4. In other words, the light shielding film 121*g* of FIG. 5 is provided to prevent crosstalk similarly to the light shielding film 121*g* of the imaging device 121 of FIG. 4 but not to provide an incident angle directivity.

Further, in the imaging device 121 of FIG. 5, one FD portion 163 is shared by the four photodiodes 121*f*-1 to 121*f*-4. A lower stage of FIG. 5 depicts an example of a circuit configuration in which the one FD portion 163 is shared by the four photodiodes 121*f*-1 to 121*f*-4. It is to be noted that description of the same components at the lower stage of FIG. 5 as those at the lower stage of FIG. 4 is omitted.

At the lower stage of FIG. 5, the circuit configuration is different from the circuit configuration at the lower stage of FIG. 4 in that, in place of the photodiode 161 (corresponding to the photodiode 121*e* at the upper stage of FIG. 4) and the transfer transistor 162, photodiodes 161-1 to 161-4 (corresponding to the photodiodes 121*f*-1 to 121*f*-4 at the upper stage of FIG. 5) and transfer transistors 162-1 to 162-4 are provided and the FD portion 163 is shared.

By such a configuration as just described, charge accumulated in the photodiodes 121*f*-1 to 121*f*-4 is transferred to the common FD portion 163 provided at the connection portion between the photodiodes 121*f*-1 to 121*f*-4 and the gate electrode of the amplification transistor 165 and having a predetermined capacitance. Then, a signal according to the level of the charge held in the FD portion 163 is read out as a detection signal (pixel signal) (it is to be noted, however, that a CDS process is performed as described above).

Therefore, charge accumulated in the photodiodes 121*f*-1 to 121*f*-4 can selectively contribute in various combinations to an output of the pixel 121*a*, namely, to the detection signal. In particular, by configuring the photodiodes 121*f*-1 to 121*f*-4 such that charge can be read out from them independently of each other and making the photodiodes 121*f*-1 to 121*f*-4 that contribute to the output (degrees with which the photodiodes 121*f*-1 to 121*f*-4 contribute to the output) different from each other, a different incident angle directivity can be obtained.

For example, by transferring charge of the photodiode 121*f*-1 and the photodiode 121*f*-3 to the FD portion 163 and adding signals obtained by reading out the charge, an incident angle directivity in the leftward and rightward direction can be obtained. Similarly, by transferring charge of the photodiode 121*f*-1 and the photodiode 121*f*-2 to the FD portion 163 and adding signals obtained by reading out the charge, an incident angle directivity in the upward and downward direction can be obtained.

Further, a signal obtained based on charge selectively read out independently from the four photodiodes 121*f*-1 to 121*f*-4 becomes a detection signal corresponding to one pixel configuring a detection image.

It is to be noted that the contribution of (charge of) each photodiode 121*f* to the detection signal can be implemented not only, for example, by whether or not charge (detection value) of each photodiode 121*f* is to be transferred to the FD portion 163 but also by resetting the charge accumulated in the photodiodes 121*f* before the charge is transferred to the FD portion 163 using an electronic shutter function. For example, if the charge of a photodiode 121*f* is reset immediately before transfer to the FD portion 163, then the photodiode 121*f* does not at all contribute to the detection signal. On the other hand, by providing a period of time between resetting of charge of a photodiode 121*f* and transfer of the charge to the FD portion 163, the photodiode 121*f* partially contributes to the detection signal.

As described above, in the case of the imaging device 121 of FIG. 5, by changing the combination of those of the four photodiodes 121*f*-1 to 121*f*-4 that are to be used for a detection signal, a different incident angle directivity can be provided to each pixel. Further, the detection signal outputted from each pixel 121*a* of the imaging device 121 of FIG. 5 has a value (output pixel value) modulated in response to the incident angle of incident light from an imaging target, and the characteristic (directivity) differs (has a different incident angle directivity) depending upon the incident angle.

It is to be noted that a unit with which a detection signal corresponding to one pixel of a detection image is hereinafter referred to as pixel output unit. The pixel output unit includes at least one or more photodiodes, and normally, each pixel 121*a* of the imaging device 121 corresponds to one pixel output unit.

For example, in the imaging device 121 of FIG. 4, since one photodiode 121*e* is provided for each one pixel 121*a*, each one pixel output unit includes one photodiode 121*e*. In other words, one pixel output unit includes one photodiode 121*e*.

Further, by making the light shielding states of the pixels 121*a* by the light shielding films 121*b* different from each other, the incident angle directivities of the pixel output units can be made different from each other. Further, in the imaging device 121 of FIG. 4, the incident light to each pixel 121*a* is optically modulated using the light shielding film 121*b*, and as a result, from signals outputted from the photodiodes 121*e* of the pixels 121*a*, a detection signal for one pixel of the detection image that reflects an incident angle directivity is obtained. In other words, the imaging device 121 of FIG. 4 includes a plurality of pixel output units for receiving incident light from an imaging target, which enters without the intervention of any of an imaging lens and a pinhole, and each of the pixel output units includes one photodiode 121*e* and a characteristic (incident angle directivity) of incident light from an imaging target to the incident angle is set for each pixel output unit.

On the other hand, in the imaging device 121 of FIG. 5, since four photodiodes 121*f*-1 to 121*f*-4 are provided for one pixel 121*a*, one pixel output unit includes the four photodiodes 121*e*. In other words, one pixel output unit includes the four photodiodes 121*f*. On the other hand, an individual pixel output unit is not configured from a single substance of each photodiode 121*e*.

Further, by making the photodiodes 121*f* that contribute to a detection signal from among the four photodiodes 121*f*-1 to 121*f*-4 are made different for each pixel 121*a* as described above, the incident angle directivity for each pixel output unit becomes different. In other words, in the imaging device 121 of FIG. 5, a range that does not contribute to an output (detection signal) among the four photodiodes 121*f*-1 to 121*f*-4 functions similarly to the shielded region. Then, by a combination of signals outputted from the photodiodes 121*f*-1 to 121*f*-4, a detection signal for one pixel of a detection image that reflects an incident angle directivity is obtained. In particular, the imaging device 121 of FIG. 5 includes a plurality of pixel output units for receiving incident light from an imaging target, which enters without the intervention of any of an imaging lens and a pinhole, and each pixel output unit includes a plurality of photodiodes (for example, the photodiodes 121*f*-1 to 121*f*-4) and, by making (the degree of) the photodiodes that contribute to an output different, characteristics (incident angle directivities) of the pixel output units of incident light from an imaging target to the incident angle become different from each other.

It is to be noted that, since, in the imaging device 121 of FIG. 5, incident light enters all of the photodiodes 121*f*-1 to 121*f*-4 without being optically modulated, the detection signal is not a signal obtained by optical modulation. Further, in the following description, the photodiode 121*f* that does not contribute to a detection signal is referred to also as photodiode 121*f* that does not contribute to a pixel output unit or an output.

It is to be noted that, while FIG. 5 depicts an example in which the light reception face of a pixel output unit (pixel 121*a*) is equally divided into four and photodiodes 121*f* having a light reception face of an equal magnitude are arranged in each pixel output unit, namely, an example in which a photodiode is equally divided into four, the dividing number and the dividing position of a photodiode can be set arbitrarily.

For example, a photodiode need not necessarily be divided equally, and the dividing position of the photodiode may be made different for each pixel output unit. This makes it possible to make the incident angle directivity different in different pixel output units even if the photodiodes 121*f* at same positions are made contribute to an output between a plurality of pixel output units. Further, for example, by making the dividing number different between different pixel output units, it becomes possible to set the incident angle directivity more freely. Furthermore, for example, both the dividing number and the dividing position may be made different between different pixel output units.

Further, both the imaging device 121 of FIG. 4 and the imaging device 121 of FIG. 5 are configured such that each pixel output unit can set an incident angle directivity independently. Meanwhile, the imaging apparatus disclosed in NPL 1, PTL 1, and PTL 2 described hereinabove are not configured such that each pixel output unit of an imaging device can set an incident angle directivity independently. It is to be noted that, in the imaging device 121 of FIG. 4, the incident angle directivity of each pixel output unit is set by the light shielding film 121*b* upon manufacturing. On the other hand, in the imaging device 121 of FIG. 5, although the dividing number or the dividing position of a photodiode of each pixel output unit is set upon manufacturing, the incident angle directivity of each pixel output unit (combination of photodiodes that are made contribute to an output) can be set at the time of use (for example, at the time of imaging). It is to be noted that both the imaging device 121 of FIG. 4 and the imaging device 121 of FIG. 5 need not have a configuration for causing all pixel output units to have an incident angle directivity.

It is to be noted that, as described hereinabove, although each pixel of an imaging device usually corresponds to one pixel output unit, one pixel output unit sometimes includes a plurality of pixels. The following description is given assuming that, unless otherwise specified, each pixel of an imaging device corresponds to one pixel output unit.

<Principle of Generation of Incident Angle Directivity>

Figure 6:
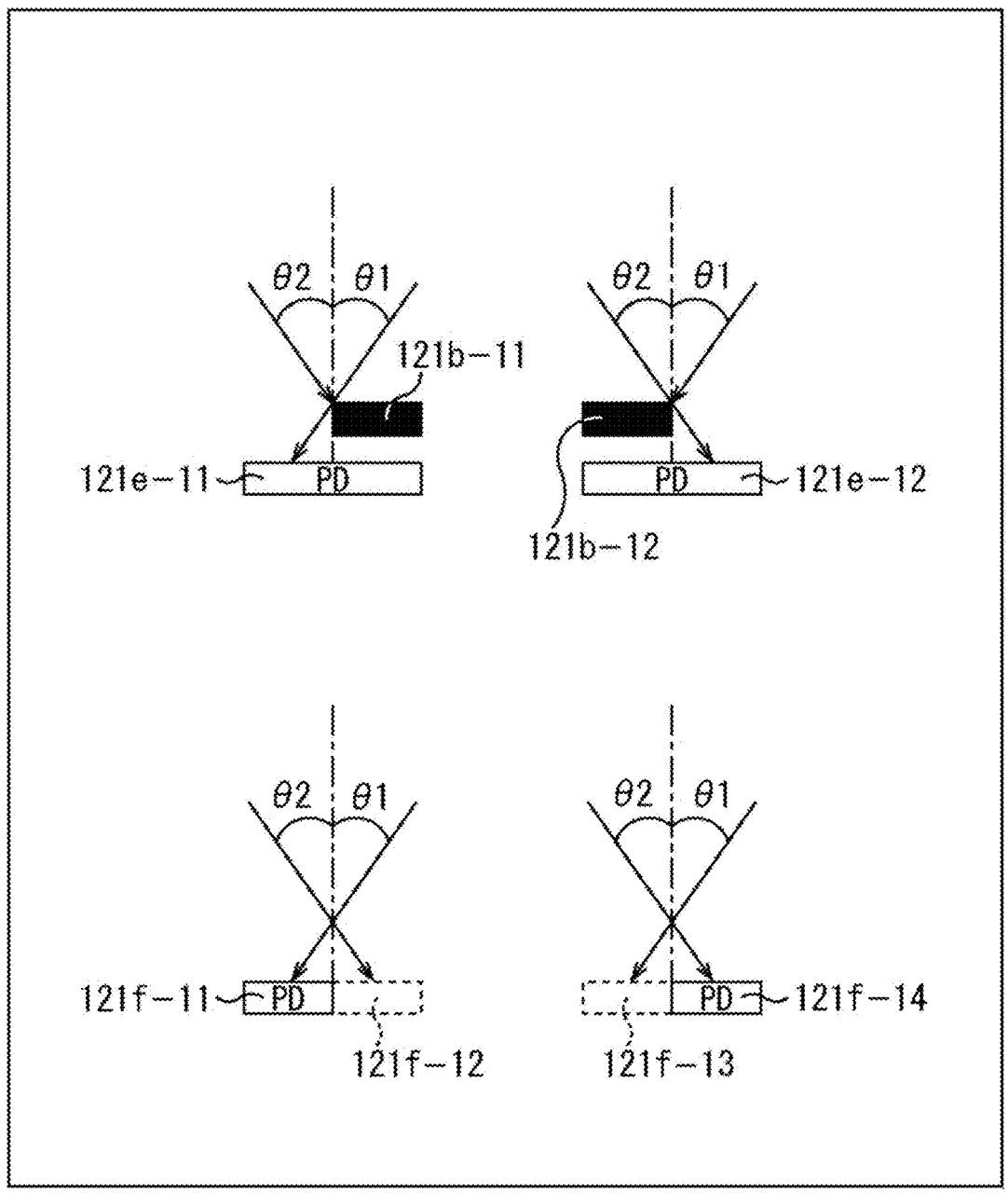
FIG. 6 is a view illustrating a principle of generation of incident angle directivity.

The incident angle directivity of each pixel of the imaging device 121 is generated, for example, by such a principle as depicted in FIG. 6. It is to be noted that that an upper left portion and an upper right portion of FIG. 6 are views illustrating a generation principle of an incident angle directivity in the imaging device 121 of FIG. 4, and a left lower portion and a right lower portion of FIG. 6 are views illustrating a generation principle of an incident angle directivity in the imaging device 121 of FIG. 5.

Each of pixels at the upper left portion and the upper right portion of FIG. 6 includes one photodiode 121e. In contrast, each of pixels at the left lower portion and the right lower portion of FIG. 6 includes two photodiodes 121f. It is to be noted that, although an example in which one pixel includes two photodiodes 121f is depicted here, this is for the convenience of description, and the number of photodiodes 121f provided in one pixel may be any other number.

In the pixel at the upper left portion of FIG. 6, the light shielding film 121b-11 is formed such that it shields a right half of the light reception face of the photodiode 121e-11. Meanwhile, in the pixel at the upper right portion of FIG. 6, the light shielding film 121b-12 is formed such that it shields a left half of the light reception face of the photodiode 121e-12. It is to be noted that a chain line in the figure is an auxiliary line that passes the center of the light reception face of the photodiode 121e in the horizontal direction and is perpendicular to the light reception face.

For example, at the pixel at the upper left portion of FIG. 6, incident light from the upper right direction having an incident angle θ1 to the chain line in the figure is liable to be received by a left half range of the photodiode 121e-11 that is not shielded by the light shielding film 121b-11. In contrast, incident light from the upper left direction having an incident angle θ2 to the chain line in the figure is less liable to be received by the left half range of the photodiode 121e-11 that is not shielded by the light shielding film 121b-11. Accordingly, the pixel at the upper left portion of FIG. 6 has an incident angle directivity that is high in light reception sensitivity to incident light from the upper right of the figure but is low in light reception sensitivity to incident light from the upper left.

On the other hand, for example, in the pixel at the upper right portion of FIG. 6, incident light from the upper right direction having an incident angle θ1 is less liable to be received by the left half range of the photodiode 121e-12 that is shielded by the light shielding film 121b-12. In contrast, incident light from the upper left direction having an incident angle θ2 is liable to be received by the right half range of the photodiode 121e-12 that is not shielded by the light shielding film 121b-12. Accordingly, the pixel at the upper right portion of FIG. 6 has an incident angle directivity that it is low in light reception sensitivity to incident light from the upper right of the figure but is high in light reception sensitivity to incident light from the upper left.

Meanwhile, the pixel at the lower left portion of FIG. 6 is configured such that it has photodiodes 121f-11 and 121f-12 on the left and right in the figure and, by reading a detection signal of any one of them, an incident angle directivity is provided without the provision of the light shielding film 121b.

In particular, at the pixel at the lower left portion of FIG. 6, by reading out a signal only of the photodiode 121f-11 provided on the left side in the figure, an incident angle directivity similar to that of the pixel at the upper left portion of FIG. 6 can be obtained. In particular, since incident light from the upper right direction having the incident angle θ1 to the chain line in the figure enters the photodiode 121f-11 and a signal corresponding to the reception light amount is read out from the photodiode 121f-11, this contributes to a detection signal to be outputted from this pixel. In contrast, although incident light from the upper left direction having the incident angle θ2 to the chain line in the figure enters the photodiode 121f-12, since it is not read out from the photodiode 121f-12, it does not contribute to a detection signal to be outputted from this pixel.

Similarly, in the case where a pixel includes two photodiodes 121f-13 and 121f-14 like the pixel at the lower right portion of FIG. 6, by reading only a signal of the photodiode 121f-14 provided on the right side in the figure, an incident angle directivity similar to that of the pixel at the upper right portion of FIG. 6 can be obtained. In particular, although incident light from the upper right direction having the incident angle θ1 enters the photodiode 121f-13, since a signal is not read out from the photodiode 121f-13, this does not contribute to a detection signal to be outputted from this pixel. In contrast, since incident light from the upper left direction having the incident angle θ2 enters the photodiode 121f-14 and a signal corresponding to the received light amount is read out from the photodiode 121f-14, this contributes to a detection signal to be outputted from this pixel.

It is to be noted that, while the pixels at the upper portion of FIG. 6 indicate examples in which a range that is shielded and a range that is not shielded are separated at a central position of the pixel (light reception face of the photodiode 121e) in the horizontal direction, the ranges may be separated at a different position. Further, although the pixels at the lower portion of FIG. 6 indicate examples in which the two photodiodes 121f are separated at a central position of the pixel in the horizontal direction, they may be separated at a different position. By changing the position at which the light shielding ranges or the photodiodes 121f are separated in this manner, it is possible to generate different incident angle directivities from each other.

<Incident Angle Directivity in Configuration Including On-Chip Lens>

Now, an incident angle directivity in a configuration including an on-chip lens 121c is described with reference to FIG. 7.

Figure 7:
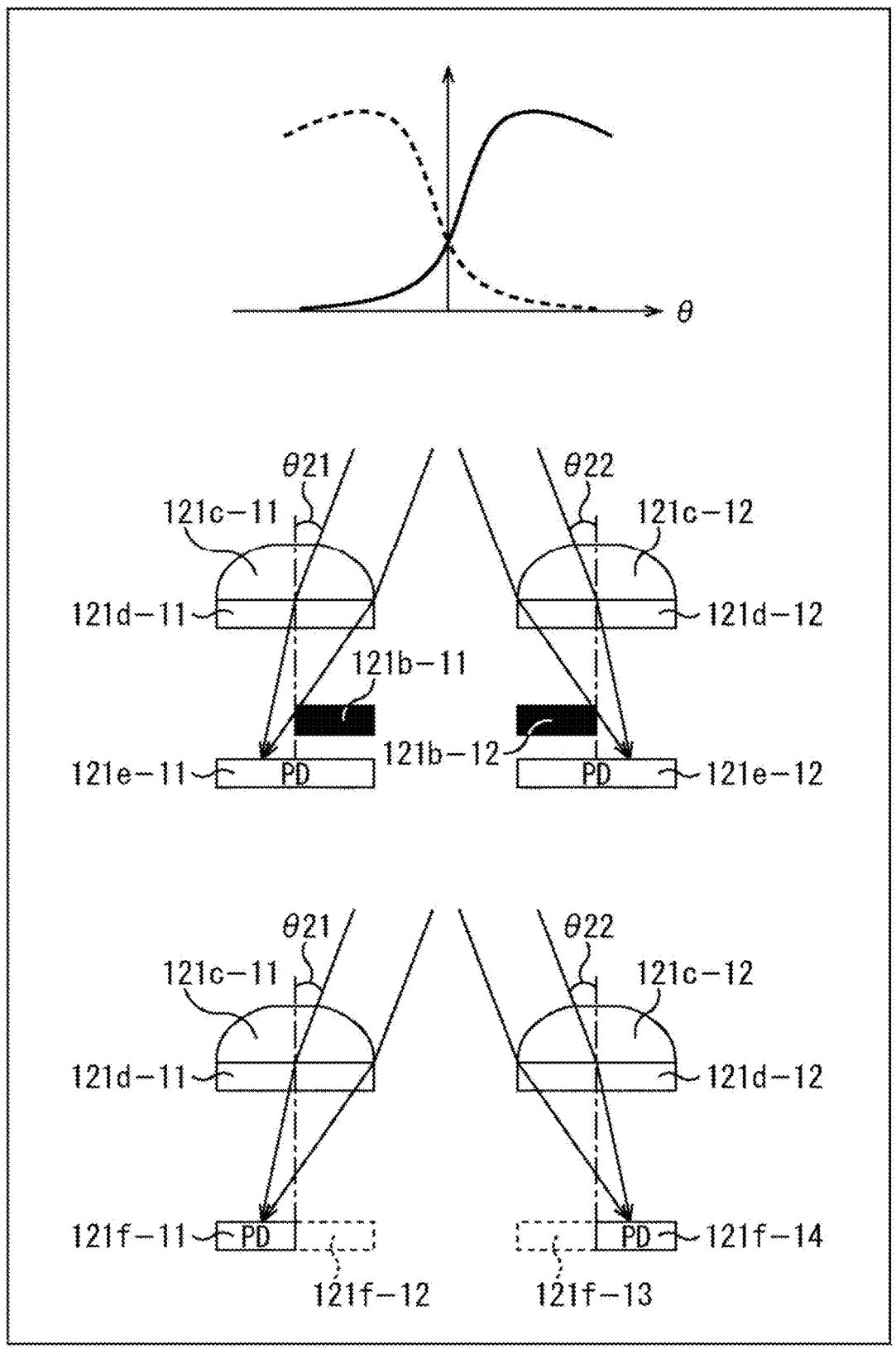
FIG. 7 is a view illustrating a change of incident angle directivity utilizing an on-chip lens.

A graph at an upper stage of FIG. 7 indicates incident angle directivities of pixels at middle and lower stages of FIG. 7. It is to be noted that the axis of abscissa indicates the incident angle θ and the axis of ordinate indicates the detection signal level. It is to be noted that the incident angle θ is defined such that it is 0 degrees where the direction of incident light coincides with a chain line on the left side at the middle stage of FIG. 7 and the incident angle θ21 side on the left side at the middle stage of FIG. 7 is the positive direction while the incident angle θ22 side on the right side at the middle stage of FIG. 7 is the negative direction. Accordingly, incident light entering the on-chip lens 121c from the upper right has an incident angle greater than that of incident light entering from the upper left. In particular, the incident angle θ increases (increases in the positive direction) as the advancing direction of incident light is inclined to the left and decreases (increases in the negative direction) as the advancing direction of incident light is inclined to the right.

Further, the pixel at the left portion at the middle stage of FIG. 7 is configured such that an on-chip lens 121c-11 that condenses incident light and a color filter 121d-11 that passes light of a predetermined wavelength are added to the pixel at the left portion at the upper stage of FIG. 6. In particular, in this pixel, the on-chip lens 121c-11, color filter 121d-11, light shielding film 121b-11, and photodiode 121e-11 are stacked in order from the entering direction of light in the upper portion in the figure.

Similarly, the pixel at the right portion at the middle stage of FIG. 7, the pixel at the left portion at the lower stage of FIG. 7 and the pixel at the right portion at the lower state of FIG. 7 are configured such that the on-chip lens 121c-11 and the color filter 121d-11 or an on-chip lens 121c-12 and a color filter 121d-12 are added to the pixel at the right portion at the upper stage of FIG. 6, the pixel at the left portion at the lower stage of FIG. 6 and the pixel at the right portion at the lower stage of FIG. 6, respectively.

In the pixel at the left portion at the middle stage of FIG. 7, the detection signal level (light reception sensitivity) of the photodiode 121e-11 changes in response to the incident angle θ of incident light as indicated by a solid line waveform at the upper state of FIG. 7. In particular, as the incident angle θ that is an angle of incident light to the chain line in the figure increases (as the incident angle θ increases in the positive direction (as the incident angle θ is increased toward the rightward direction in the figure)), the detection signal level of the photodiode 121e-11 increases because light is condensed to a range in which the light shielding film 121b-11 is not provided. In contrast, as the incident angle θ of incident light decreases (as the incident angle θ increases in the negative direction (as the incident angle θ is increased toward the leftward direction in the figure)), the detection signal level of the photodiode 121e-11 decreases because light is condensed to a range in which the light shielding film 121b-11 is provided.

Further, at the pixel at the right portion at the middle stage of FIG. 7, the detection signal level (light reception sensitivity) of the photodiode 121e-12 changes in response to the incident angle θ of incident light as indicated by a broken line waveform at the upper stage of FIG. 7. In particular, as the incident angle θ of incident light increases (as the incident angle θ increases in the positive direction), the detection signal level of the photodiode 121e-12 decreases because light is condensed to a range in which the light shielding film 121b-12 is provided. In contrast, as the incident angle θ of incident light decreases (as the incident angle θ increases in the negative direction), the detection signal level of the photodiode 121e-12 increases because light enters a range in which the light shielding film 121b-12 is not provided.

It is possible to change the solid and broken line waveforms depicted at the upper stage of FIG. 7 in response to the range of the light shielding film 121b. Accordingly, it is possible to provide incident angle directivities different from each other to pixels in a unit of a pixel through the range of the light shielding film 121b.

Although the incident angle directivity is a characteristic of the light reception sensitivity of each pixel according to the incident angle θ as described hereinabove, it can be considered that, in regard to the pixels at the middle stage of FIG. 7, this is a characteristic of the light shielding value according to the incident angle θ. In particular, although the light shielding film 121b shields incident light in a specific direction at a high level, it cannot sufficiently shield incident light from any other direction. The change of the level at which incident light can be shielded gives rise to a different detection signal level according to the incident angle θ as depicted at the upper stage of FIG. 7. Accordingly, if a direction in which incident light to each pixel in a direction in which it can be shielded at the highest level is defined as a light shielding direction of the pixel, then that pixels have incident angle directivities different from each other in a unit of a pixel is, in other words, that different pixels have light shielding directions different from each other in a unit of a pixel.

Further, at the pixel at the left portion at the lower stage of FIG. 7, similarly to the pixel at the left portion at the lower stage of FIG. 6, by using a signal only of the photodiode 121f-11 at the left portion of in the figure, it is possible to obtain an incident angle directivity similar to that of the pixel at the left portion at the middle stage of FIG. 7. In particular, as the incident angle θ of incident light increases (as the incident angle θ increases in the positive direction), the detection signal level increases because light is condensed to a range of the photodiode 121f-11 from which a signal is read out. In contrast, as the incident angle θ of incident light decreases (as the incident angle θ increases in the negative direction), the detection signal level decreases because light is condensed to a range of the photodiode 121f-12 from which a signal is not read out.

Further, similarly, in the case of the pixel at the right portion at the lower stage of FIG. 7, similarly to the pixel at the right portion at the lower stage of FIG. 6, by using a signal only of the photodiode 121f-14 at the right portion in in the figure, an incident angle directivity similar to that of the pixel at the right portion at the middle stage of FIG. 7 can be obtained. In particular, as the incident angle θ of incident light increases (as the incident angle θ increases in the positive direction), the detection signal level in a unit of a pixel decreases because light is condensed to a range of the photodiode 121f-13 that does not contribute to an output (detection signal). In contrast, as the incident angle θ of incident light decreases (as the incident angle θ increases in the negative direction), the detection signal level in a unit of a pixel increases because light is condensed to a range of the photodiode 121f-14 that contributes to an output (detection signal).

It is to be noted that, in order to generate an incident angle directivity in a unit of a pixel by causing, in a pixel in which a plurality of photodiodes is provided like the pixel at the lower stage of FIG. 7 such that a photodiode that is to contribute to an output can be changed, each of the photodiodes to have a directivity to an incident angle of incident light, the on-chip lens 121c is an essential component for each pixel.

It is to be noted that the incident angle directivity preferably has a high degree of randomness in a unit of a pixel. For example, if adjacent pixels have a same incident angle directivity, then there is the possibility that the expressions (1) to (3) given hereinabove or expressions (4) to (6) hereinafter described may become a same expression, and as a result, there is the possibility that the number of expressions may become insufficient for a number of unknowns that become solutions to the simultaneous equations and it may become impossible to calculate pixel values that configure a restoration image.

It is to be noted that, in the following description, an example in a case using a pixel 121a in which a light shielding film 121b is used to implement an incident angle directivity like the pixel 121a of FIG. 4 is described mainly. However, except a case in which the light shielding film 121b is essentially required, it is basically possible to use a pixel 121a in which a photodiode is divided to implement an incident angle directivity.

<Configuration of Light Shielding Film>

The foregoing description is directed to an example in which, as depicted in FIG. 3, the light shielding film 121b of each pixel 121a of the imaging device 121 is configured such that it shields the entire light reception face in the vertical direction but changes the light shielding width or position in the horizontal direction. However, naturally the entire light reception face is shielded in the horizontal direction such that the width (weight) or position in the vertical direction is changed to provide an incident angle directivity to each pixel 121a.

It is to be noted that, in the following description, a light shielding film 121b that shields the entire light reception face of a pixel 121a in the vertical direction and shields the light reception face with a predetermined width in the horizontal direction as in the example of FIG. 3 is referred to as light shielding film 121b of the horizontal belt type. Meanwhile, a light shielding film 121b that shields the entire light reception face of a pixel 121a in the horizontal direction and shields the light reception face at a predetermined height in the vertical direction is referred to as light shielding film 121b of the vertical belt type.

Figure 8:
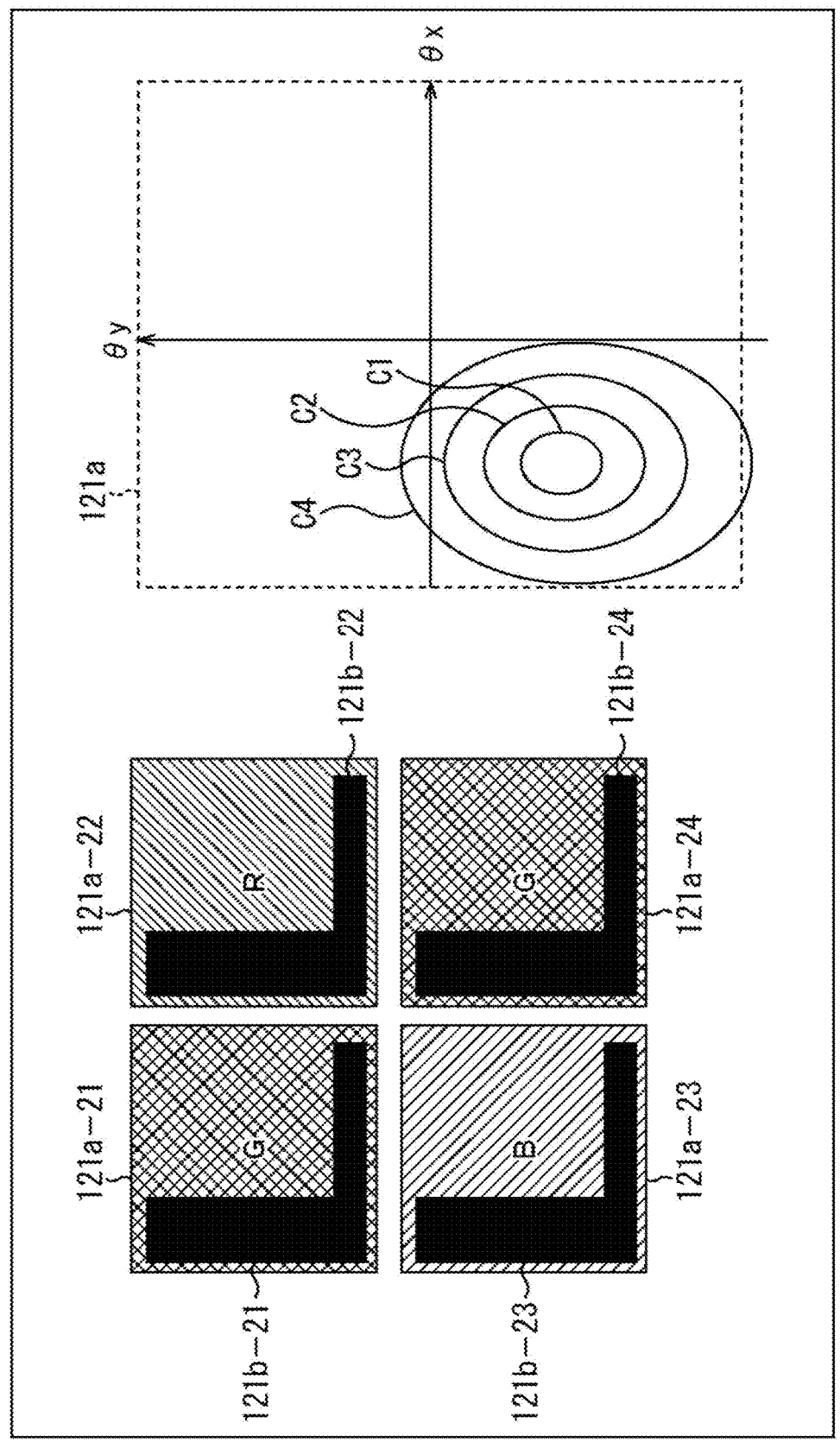
FIG. 8 is a view depicting an example of a type of a light shielding film.

Further, as depicted at a left portion of FIG. 8, light shielding films 121b of the vertical belt type and the horizontal belt type may be combined such that an L-shaped light shielding film 121b is provided for each of pixels, for example, of the Bayer array.

It is to be noted that, in FIG. 8, a black range represents a light shielding film 121b, and unless otherwise specified, similar representation is applied also to the succeeding figures. Further, in the example of FIG. 8, L-shaped light shielding films 121b-21 to 121b-24 are provided for pixels 121a-21 and 121a-24 of G (green) pixels, a pixel 121a-22 of an R (red) pixel, and a pixel 121a-23 of a B (blue) pixel of the Bayer array, respectively.

In this case, each pixel 121a has such an incident angle directivity as indicated at a right portion of FIG. 8. In particular, at the right portion of FIG. 8, a distribution of light reception sensitivities of the pixels 121a is depicted, and the axis of abscissa represents the incident angle θx in the horizontal direction (x direction) of incident light and the axis of ordinate represents the incident angle θy in the vertical direction (y direction) of incident light. Thus, the light reception sensitivity in a range C4 is higher than that outside the range C4; the light reception sensitivity in a range C3 is higher than that outside the range C3; the light reception sensitivity in a range C2 is higher than that outside the range C2; and the light reception sensitivity in a range C1 is higher than that outside the range C1.

Accordingly, each pixel 121a indicates the highest detection signal level in regard to incident light that has the incident angle θx in the horizontal direction (x direction) and the incident angle θy in the vertical direction (y direction) that are included in the range C1. Further, the detection signal level decreases in the order of incident light whose incident angle θx and incident angle θy are included in the range C2, in the range C3, in the range C4, and in the range outside the range C4. It is to be noted that the intensity distribution of the light reception sensitivity depicted at the right portion of FIG. 8 is determined by the range shielded by the light shielding film 121b in each pixel 121a independently of the Bayer array.

It is to be noted that, in the following description, a light shielding film 121b of such a shape that light shielding films of the vertical belt type and light shielding films of the horizontal belt type are connected to each other at individual end portions, like the L-shaped light shielding films 121b-21 to 121b-24 of FIG. 8, is totally referred to as L-shaped light shielding film 121b.

<Setting Method of Incident Angle Directivity>

Now, an example of a setting method of an incident angle directivity is described with reference to FIG. 9.

Figure 9:
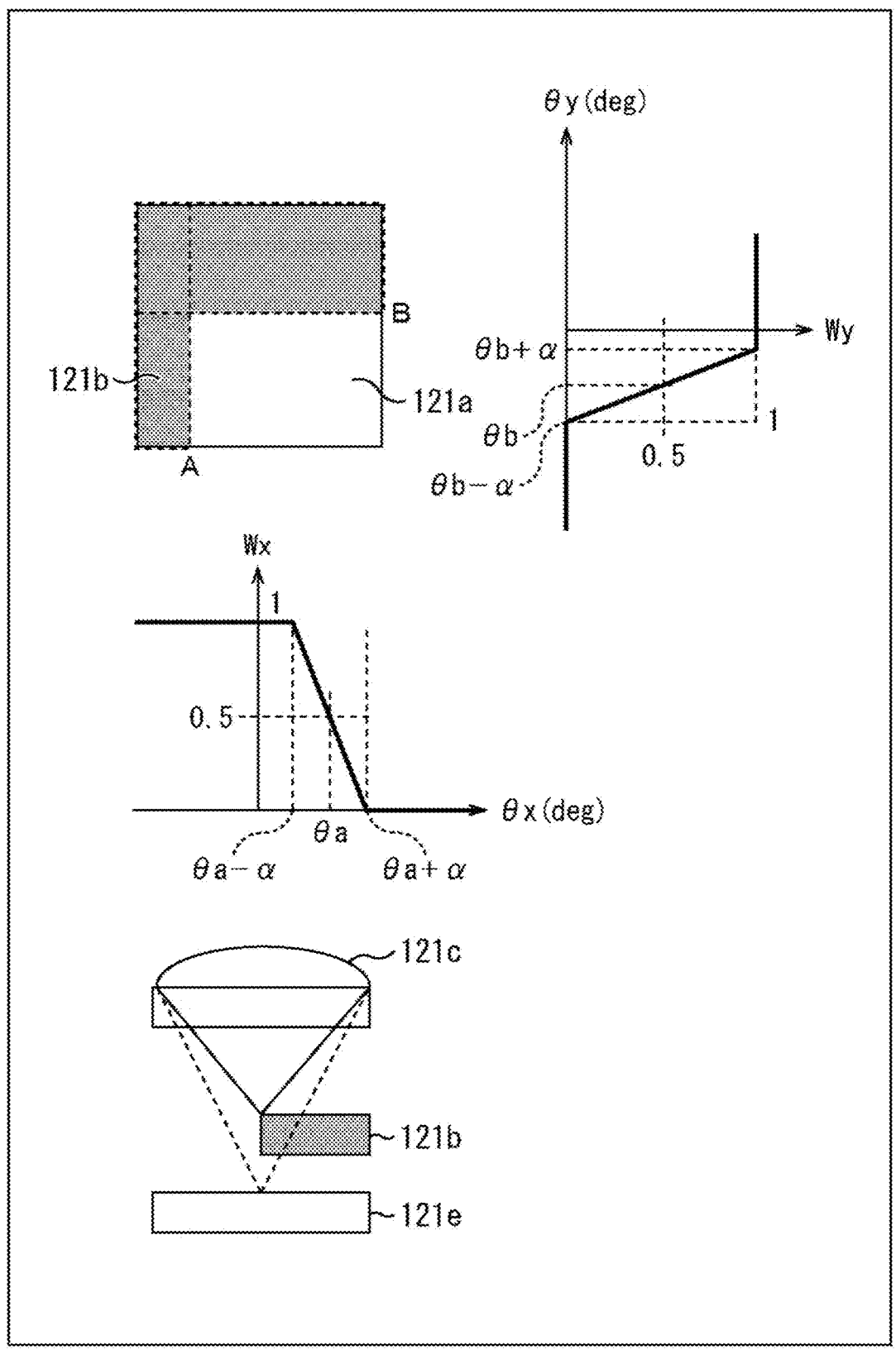
FIG. 9 is a view illustrating design of incident angle directivity.

For example, a case is considered in which, as depicted at an upper stage of FIG. 9, the light shielding range of a light shielding film 121b in the horizontal direction is a range from a left end portion of the pixel 121a to a position A and the light shielding range in the vertical direction is a range from an upper end portion of the pixel 121a to a position B.

In this case, a weight Wx is set which is a weight according to the incident angle θx (deg) from a central position of each pixel in the horizontal direction and ranges from 0 to 1 and serves as an index to the incident angle directivity in the horizontal direction. More particularly, in the case where it is assumed that the weight Wx is 0.5 at the incident angle θx=θa corresponding to the position A, the weight Wx is set such that it is 1 at the incident angle θx<θa−α; it is (−(θx−θa)/2α+0.5) where θa−α≤incident angle θx≤θa+α; and it is 0 at the incident angle θx>θa+α.

Similarly, a weight Wy is set which is a weight according to the incident angle θy (deg) from a central position of each pixel in the vertical direction and ranges from 0 to 1 and serves as an index to the incident angle directivity in the vertical direction. More particularly, in the case where it is assumed that the weight Wy is 0.5 at the incident angle θy=θb corresponding to the position B, the weight Wy is set such that it is 0 at the incident angle θy<θb−α; it is ((θy−θb)/2α+0.5) where θb−α≤incident angle θy≤θb+α; and it is 1 at the incident angle θy>θb+α.

It is to be noted that the weights Wx and Wy change like those in the graph of FIG. 9 in the case where an ideal condition is satisfied.

Then, by using the weights Wx and Wy calculated in this manner, a coefficient of the incident angle directivity, namely, the light reception sensitivity characteristic, of each pixel 121a can be calculated. For example, a value obtained by multiplication of a weight Wx corresponding to the incident angle θx of incident light and a weight Wy corresponding to the incident angle θy of incident light from a certain point light source on the imaging target face 31 is set to the coefficient for the point light source.

Further, at this time, the inclination (½α) indicative of a change of the weight within a range within which the weight Wx in the horizontal direction and the weight Wy in the vertical direction are around 0.5 can be set by using on-chip lenses 121c having different focal distances.

For example, in the case where the focal distance of an on-chip lens 121c corresponds to the surface of a light shielding film 121b as indicated by a solid line at a lower stage of FIG. 9, the inclinations (½α) of the weight Wx in the horizontal direction and the weight Wy in the vertical direction are steep. In particular, the weight Wx and the weight Wy change rapidly to 0 or 1 in the proximity of the boundaries of the incident angle θx=θa in the horizontal direction and the incident angle θy=θb in the vertical direction at which the values are around 0.5.

On the other hand, in the case where the focal distance of an on-chip lens 121c corresponds the surface of a photodiode 121e as indicated by a broken line at the lower stage of FIG. 9, the inclinations (½α) of the weight Wx in the horizontal direction and the weight Wy in the vertical direction are gentle. In particular, the weight Wx and the weight Wy change moderately to 0 or 1 in the proximity of the boundaries of the incident angle θx=θa in the horizontal direction and the incident angle θy=θb in the vertical direction at which the values are around 0.5.

For example, the focal distance of the on-chip lens 121c changes depending upon the curvature of the on-chip lens 121c. Accordingly, by making the focal distances of the on-chip lenses 121c different from each other using the on-chip lenses 121c having curvatures different from each other, different incident angle directivities, namely, different light reception sensitivity characteristics, can be obtained.

Accordingly, the incident angle directivity of a pixel 121a can be adjusted by a combination of the range within which the photodiode 121e is shielded by the light shielding film 121b and the curvature of the on-chip lens 121c. It is to be noted that the curvature of the on-chip lens may be equal among all of the pixels 121a of the imaging device 121 or may be different in some of the pixels 121a.

For example, on the basis of the position of each pixel 121a, the shape, position, and range of the light shielding film 121b of each pixel 121a, the curvature of the on-chip lens 121c, and so forth as indices representative of the incident angle directivity of each pixel 121a of the imaging device 121, such characteristics of the weight Wx and the weight Wy as depicted in the graph of FIG. 9 are set for each pixel 121a. Further, on the basis of the positional relation between a certain point light source on the imaging target face 31 at a predetermined imaging target distance and a certain pixel 121a of the imaging device 121, the incident angle of a ray of light from the point light source to the pixel 121a is calculated. Then, on the basis of the calculated incident angle and the characteristics of the weight Wx and the weight Wy of the pixel 121a, a coefficient of the pixel 121a with respect to the point light source is calculated.

Similarly, by calculating a coefficient in such a manner as described for a combination of each point light source on the imaging target face 31 and each pixel 121a of the imaging device 121, a coefficient set group of the imaging device 121 with respect to the imaging target face 31 like a coefficient set α1, β1, and γ1, another coefficient set α2, β2, and γ2 and a further coefficient set α3, β3, and γ3, of the expressions (1) to (3) described hereinabove can be calculated.

It is to be noted that, as hereinafter described with reference to FIG. 13, if the imaging target distance from the imaging target face 31 to the light reception face of the imaging device 121 differs, then since the incident angle of a ray of light from each point light source of the imaging target face 31 to the imaging device 121 differs, a coefficient set group that is different for each different imaging target distance is required.

Further, even with the imaging target face 31 of a same imaging target distance, if the number or arrangement of point light sources to be set differs, the incident angle of a ray of light from each point light source to the imaging device 121 differs. Accordingly, a plurality of coefficient set groups is sometimes required for the imaging target face 31 of a same imaging target distance. Further, it is necessary to set the incident angle directivity of each pixel 121a such that the independence of the simultaneous equations described above can be assured.

<Difference Between On-Chip Lens and Imaging Lens>

In the imaging apparatus 101 of the present disclosure, although the imaging device 121 is configured such that it does not require an optical block including an imaging lens or a pinhole, the on-chip lens 121c is provided as described above. Here, the on-chip lens 121c and the imaging lens are different in physical action from each other.

Figure 10:
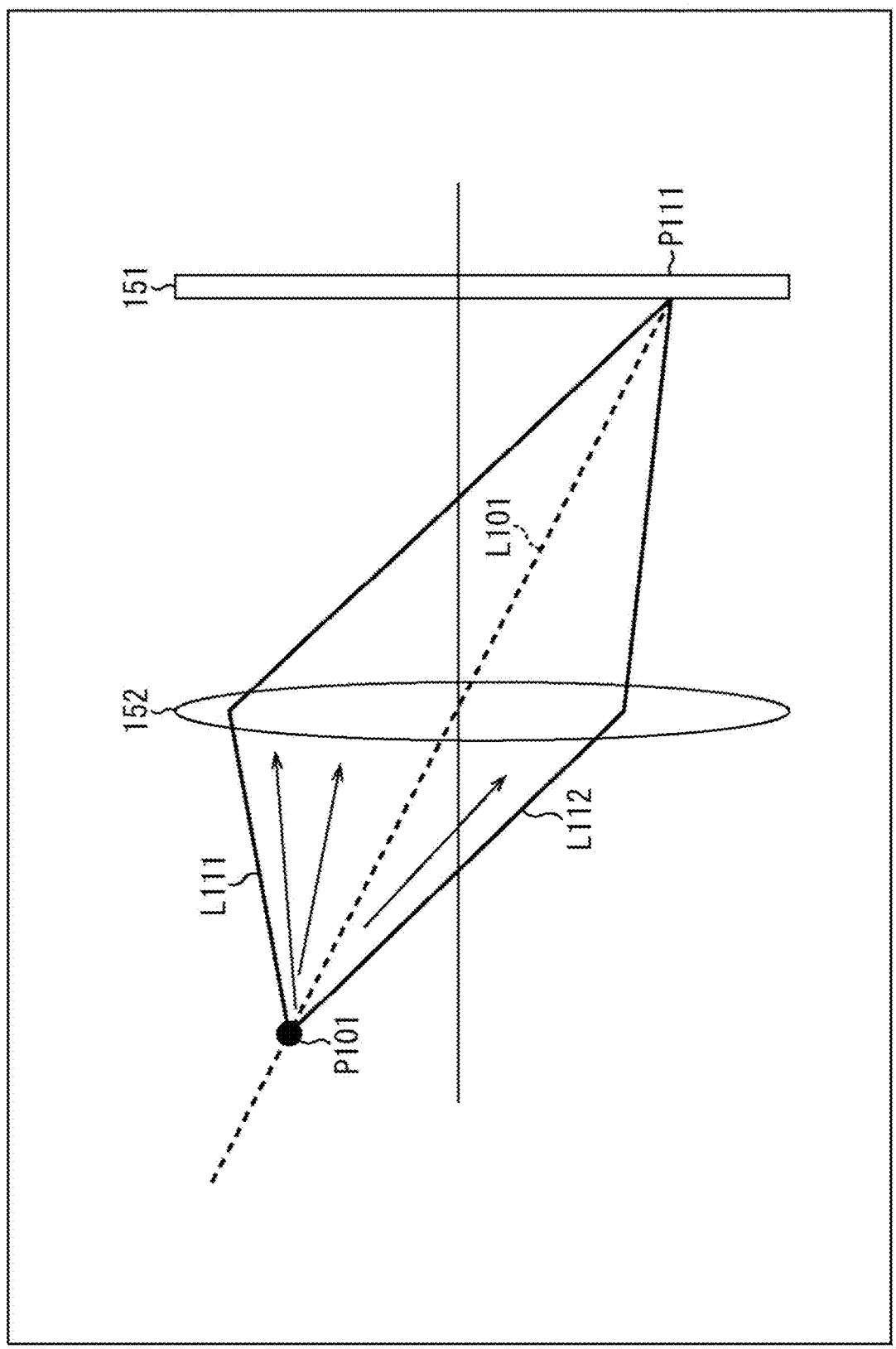
FIG. 10 is a view illustrating a difference between an on-chip lens and an imaging lens.

For example, as depicted in FIG. 10, light entering an imaging lens 152 from within diffuse light emitted from a point light source P101 is condensed at a pixel position P111 on an imaging device 151. In particular, the imaging lens 152 is designed such that diffuse light entering at a different angle from the point light source P101 is condensed at the pixel position P111 to form an image of the point light source P101. The pixel position P111 is specified by a principal ray L101 that passes the point light source P101 and the center of the imaging lens 152.

Figure 11:
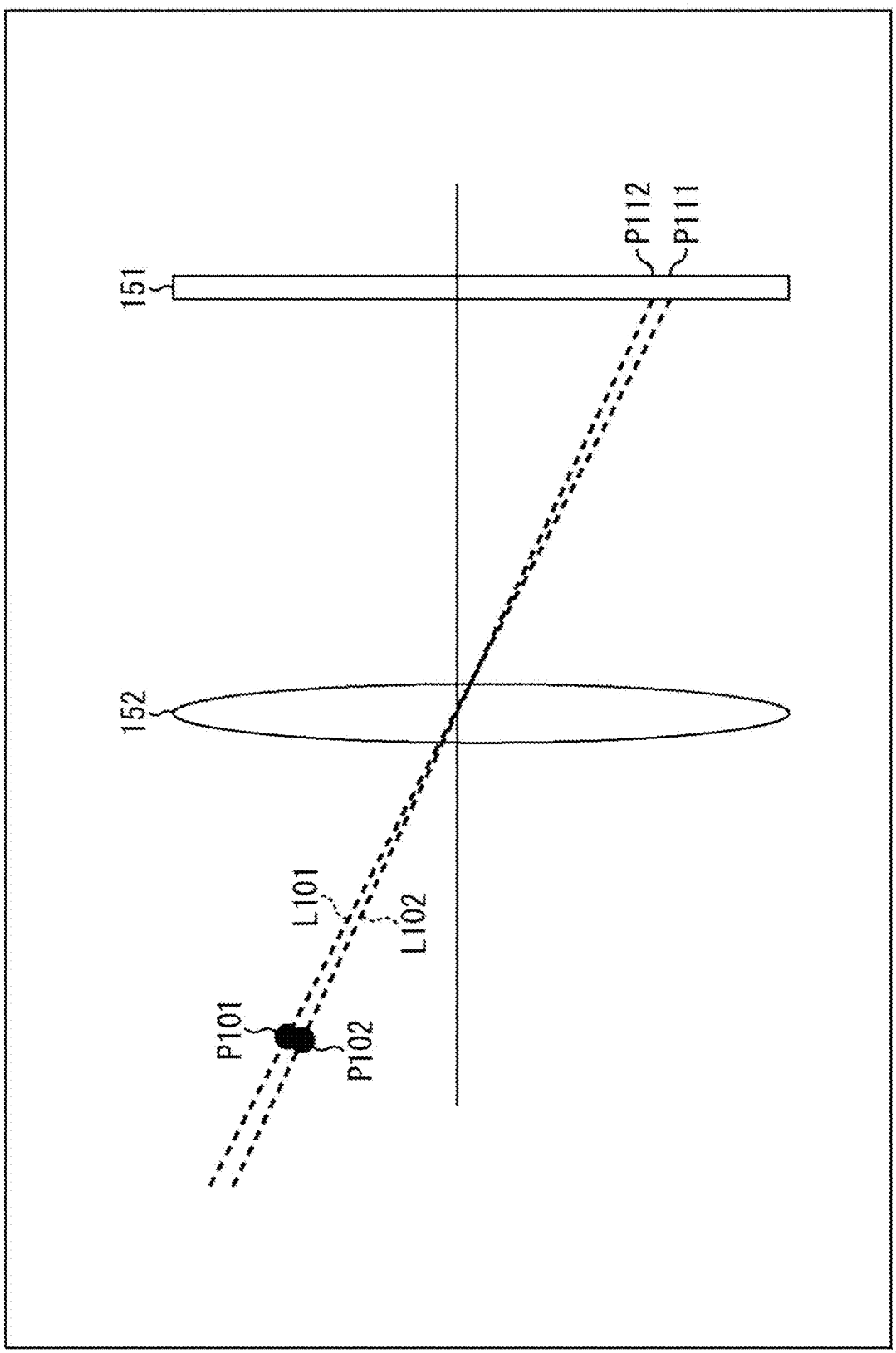
FIG. 11 is a view illustrating another difference between an on-chip lens and an imaging lens.

Further, for example, as depicted in FIG. 11, light entering the imaging lens 152 from within diffuse light emitted from a point light source P102 different from the point light source P101 is condensed at a pixel position P112 different from the pixel position P111 on the imaging device 151. In particular, the imaging lens 152 is designed such that diffuse light entering at a different angle from the point light source P102 is condensed at the pixel position P112 to form an image of the point light source P102. This pixel position P112 is specified by a principal ray L102 that passes the point light source P102 and the center of the imaging lens 152.

In this manner, the imaging lens 152 forms images of the point light sources P101 and P102 whose principal rays are different from each other at the pixel positions P111 and P112 different from each other on the imaging device 151, respectively.

Figure 12:
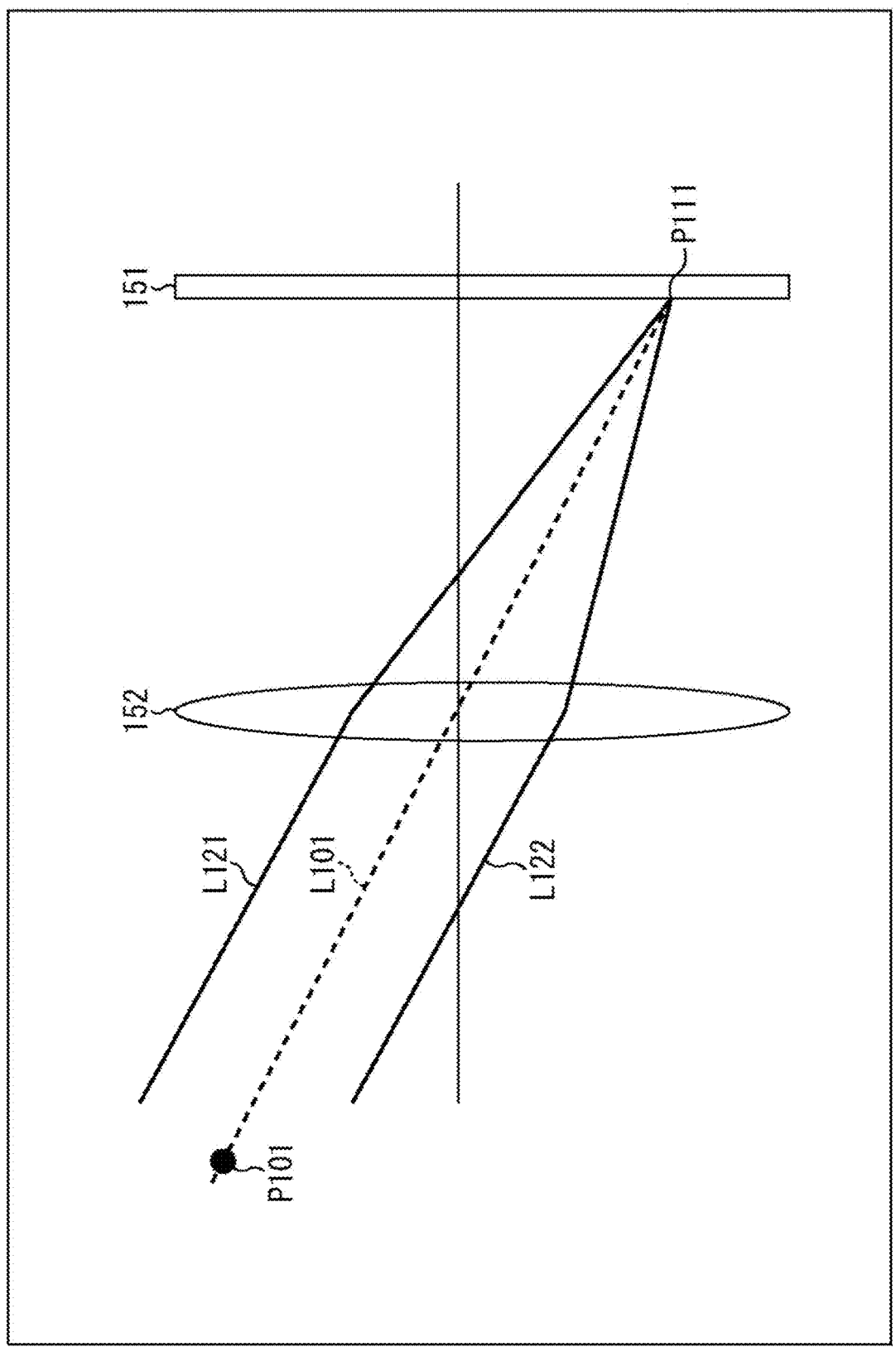
FIG. 12 is a view illustrating a further difference between an on-chip lens and an imaging lens.

Furthermore, as depicted in FIG. 12, in the case where the point light source P101 exists in the infinity, part of diffuse light emitted from the point light source P101 enters as parallel light parallel to the principal ray L101 into the imaging lens 152. For example, parallel light including rays of light between a ray L121 and another ray L122 parallel to the principal ray L101 enters the imaging lens 152. Then, the parallel light entering the imaging lens 152 is condensed at the pixel position P111 on the imaging device 151. In other words, the imaging lens 152 is designed such that parallel light from the point light source P101 existing in the infinity is condensed at the pixel position P111 to form an image of the point light source P101.

Accordingly, the imaging lens 152 has a light condensing function for introducing diffuse light from a point light source having, for example, a principal ray incident angle θ1 into a pixel (pixel output unit) P1 and introducing diffuse light from a point light source having a principal ray incident angle θ2 different from the principal ray incident angle θ1 into a pixel (pixel output unit) P2 different from the pixel P1. In other words, the imaging lens 152 has a light condensing function for introducing diffuse light from light sources having different incident angles of principal rays of light to a plurality of pixels (pixel output units) adjacent each other. However, light, for example, from point light sources adjacent each other or from point light sources existing in the infinity and substantially adjacent each other sometimes enters the same pixel (pixel output unit).

In contrast, for example, as described hereinabove with reference to FIGS. 4 and 5, light passing the on-chip lens 121c enters only the light reception face of the photodiode 121e or the photodiode 121f configuring the corresponding pixel (pixel output unit). In other words, the on-chip lens 121c is provided for each pixel (pixel output unit) and condenses incident light entering the on-chip lens 121c itself only at the corresponding pixel (pixel output unit). In other words, the on-chip lens 121c does not have a condensing function for causing light from different point light sources to enter different pixels (pixel output units).

It is to be noted that, in the case where a pinhole is used, the relation between the position of each pixel (pixel output unit) and the incident angle of light is determined uniquely.

Accordingly, in the case of the configuration that uses a pinhole and a conventional imaging device, the incident angle directivity cannot be set independently and freely for each pixel.

<Relation Between Imaging Target Face and Distance to Imaging Device>

Now, a relation between an imaging target face and the distance to the imaging device 121 is described with reference to FIG. 13.

It is to be noted that, in the case where the imaging target distance from the imaging device 121 (similar to the imaging device 51 of FIG. 1) to the imaging target face 31 is a distance d1 as depicted in the upper left of FIG. 13, it is assumed that the detection signal levels DA, DB, and DC at the pixels Pc, Pb, and Pa on the imaging device 121 are represented by expressions same as the expressions (1) to (3) given hereinabove.

$$DA = \alpha1 \times a + \beta1 \times b + \gamma1 \times c \quad (1)$$

$$DB = \alpha2 \times a + \beta2 \times b + \gamma2 \times c \quad (2)$$

$$DC = \alpha3 \times a + \beta3 \times b + \gamma3 \times c \quad (3)$$

Figure 13:
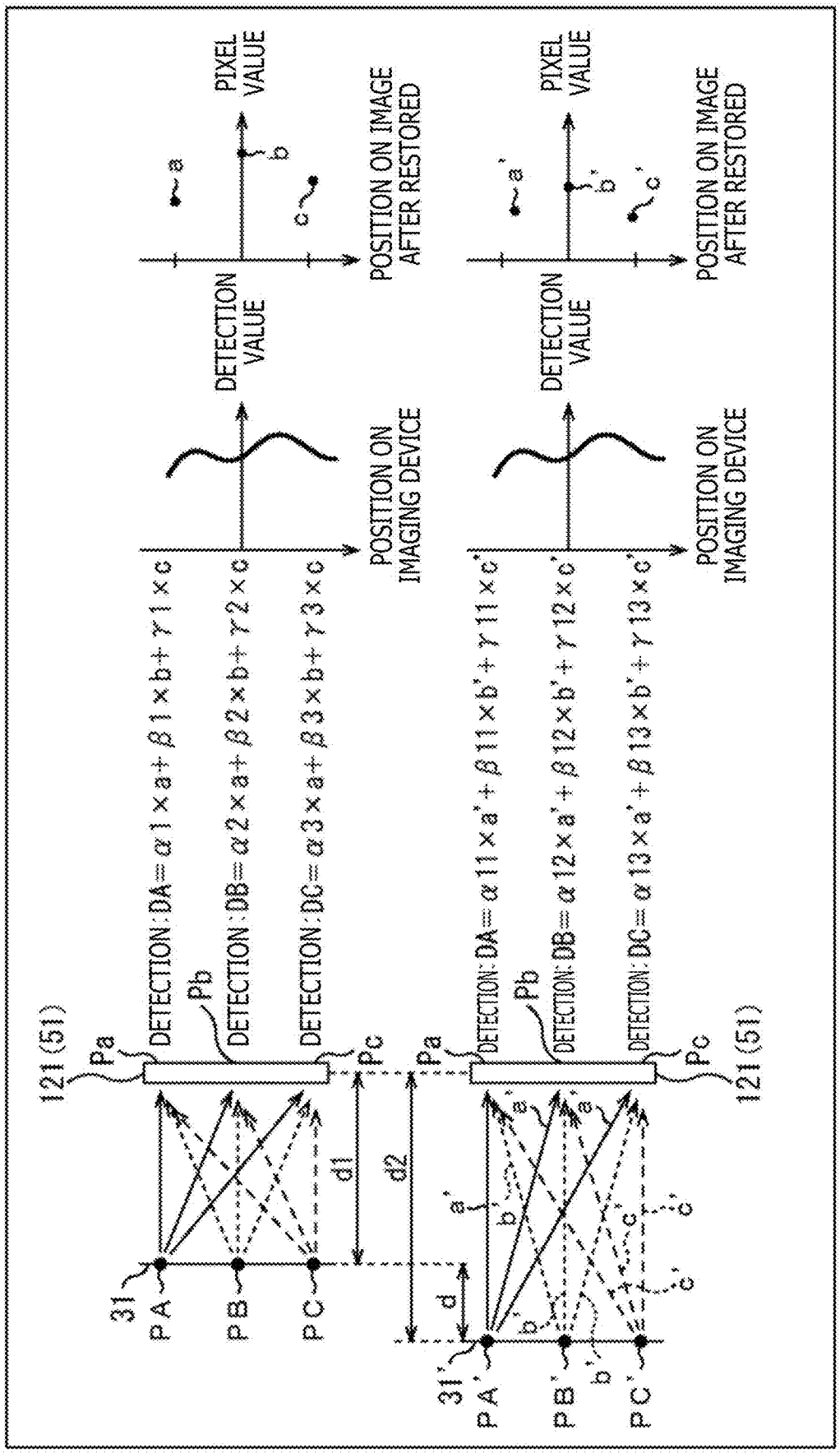
FIG. 13 is a view illustrating a relation between an imaging target distance and a coefficient indicative of incident angle directivity.

Also in the case where an imaging target face 31' whose distance to the imaging device 121 is a distance d2 that is greater by d than the distance d1 as depicted in the lower left of FIG. 13, namely, the imaging target face 31' deeper than the imaging target face 31 as viewed from the imaging device 121, is considered, the detection signal levels at the pixels Pc, Pb, and Pa on the imaging device 121 are the detection signal levels DA, DB, and DC as depicted at a middle portion at the lower stage of FIG. 13 and similar to those described above.

However, in this case, rays of light of light intensities a', b', and c' from the point light sources PA', PB', and PC' on the imaging target face 31' are received by the pixels of the imaging device 121. Further, since the incident angles of the rays of light of the light intensities a', b', and c' to the imaging device 121 are different (change), coefficient set groups different from each other are required. Accordingly, the detection signal levels DA, DB, and DC at the pixels Pa, Pb, and Pc are represented, for example, by the following expressions (4) to (6).

$$DA = \alpha11 \times a' + \beta11 \times b' + \gamma11 \times c' \quad (4)$$

$$DB = \alpha12 \times a' + \beta12 \times b' + \gamma12 \times c' \quad (5)$$

$$DC = \alpha13 \times a' + \beta13 \times b' + \gamma13 \times c' \quad (6)$$

Here, the coefficient set group including the coefficient set $\alpha11$, $\beta11$, and $\gamma11$, the coefficient set $\alpha12$, $\beta12$, and $\gamma12$, and the coefficient set $\alpha13$, $\beta13$, and $\gamma13$ is a coefficient set group for the imaging target face 31' corresponding to the coefficient set $\alpha1$, $\beta1$, and $\gamma1$, the coefficient set $\alpha2$, $\beta2$, and $\gamma2$, and the coefficient set $\alpha3$, $\beta3$, and $\gamma3$ for the imaging target face 31.

Accordingly, by solving the simultaneous equations including the expressions (4) to (6) using the coefficient set group $\alpha11$, $\beta11$, $\gamma11$, $\alpha12$, $\beta12$, $\gamma2$, $\alpha13$, $\beta13$, and $\gamma3$, the light intensities a', b', and c' of rays of light from the point light sources PA', PB', and PC' of the imaging target face 31' can be found as indicated in the lower right of FIG. 13 by a method similar to that in the case where the light intensities a, b, and c of rays of light from the point light sources PA, PB, and PC of the imaging target face 31 are found. As a result, a restoration image of the imaging target face 31' can be restored.

Accordingly, in the imaging apparatus 101 of FIG. 2, by preparing a coefficient set group for each distance (imaging target distance) from the imaging device 121 to the imaging target face in advance and switching a coefficient set group for each imaging target distance to create simultaneous equations and then solving the created simultaneous equations, it is possible to obtain restoration images of imaging target faces at various imaging target distances on the basis of a single detection image. For example, by capturing and recording a detection image once and then using the recorded detection image to switch the coefficient set group in response to the distance to the imaging target face to restore a restoration image, a restoration image of an imaging target face at an arbitrary imaging target distance can be generated.

Further, in such a case that an imaging target distance or an angle of view can be specified, detection signals not of all pixels but of pixels having incident angle directivities suitable for imaging of the imaging target face corresponding to the specified imaging target distance or angle of view may be used to generate a restoration image. This makes it possible to generate a restoration image using detection signals of pixels suitable for imaging of an imaging target face corresponding to the specified imaging target distance or angle of view.

Figure 14:
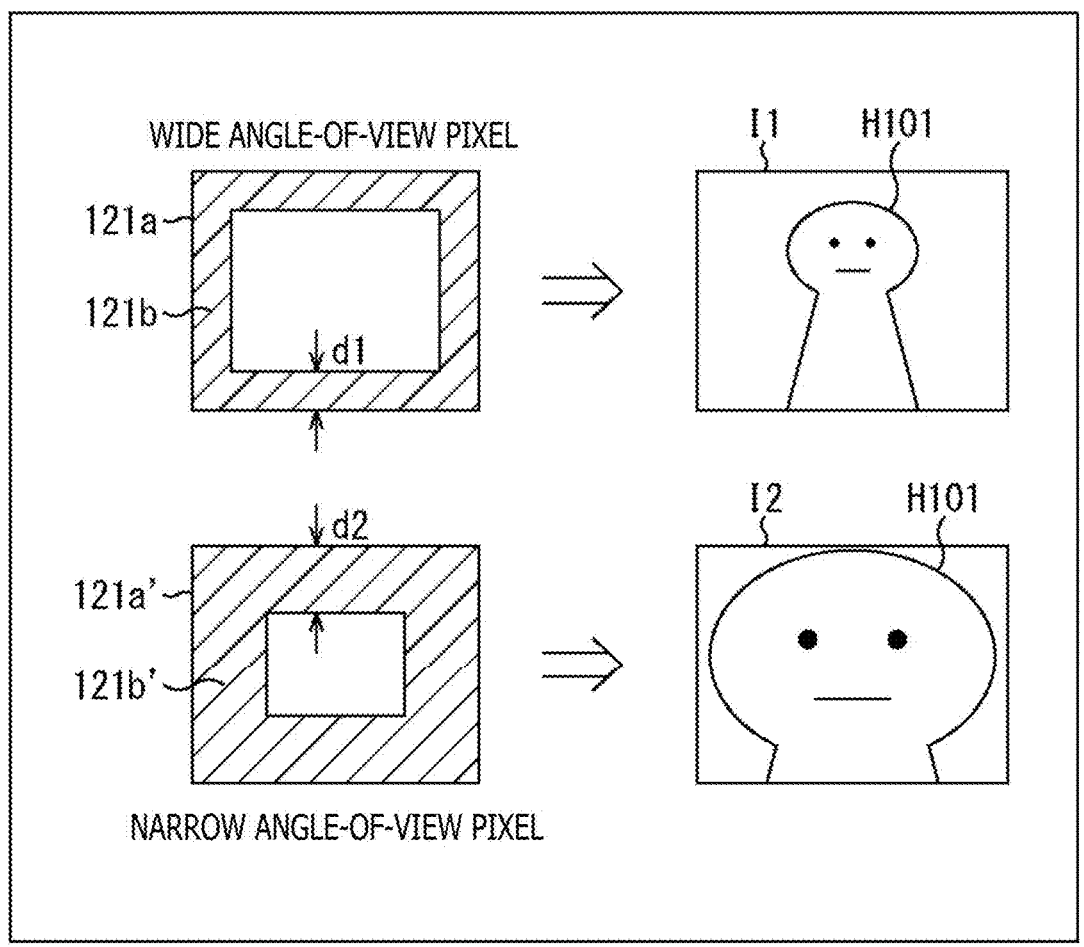
FIG. 14 is a view illustrating a relation between a narrow angle-of-view pixel and a wide angle-of-view pixel.

For example, a pixel 121a shielded at portions thereof at the distance d1 from individual end portions of the four sides by the light shielding film 121b as depicted at an upper stage of FIG. 14 and a pixel 121a' shielded at portions thereof at the distance d2 (>d1) from individual end portions of the four sides by the light shielding film 121b as depicted at a lower stage of FIG. 14 are considered.

Figure 15:
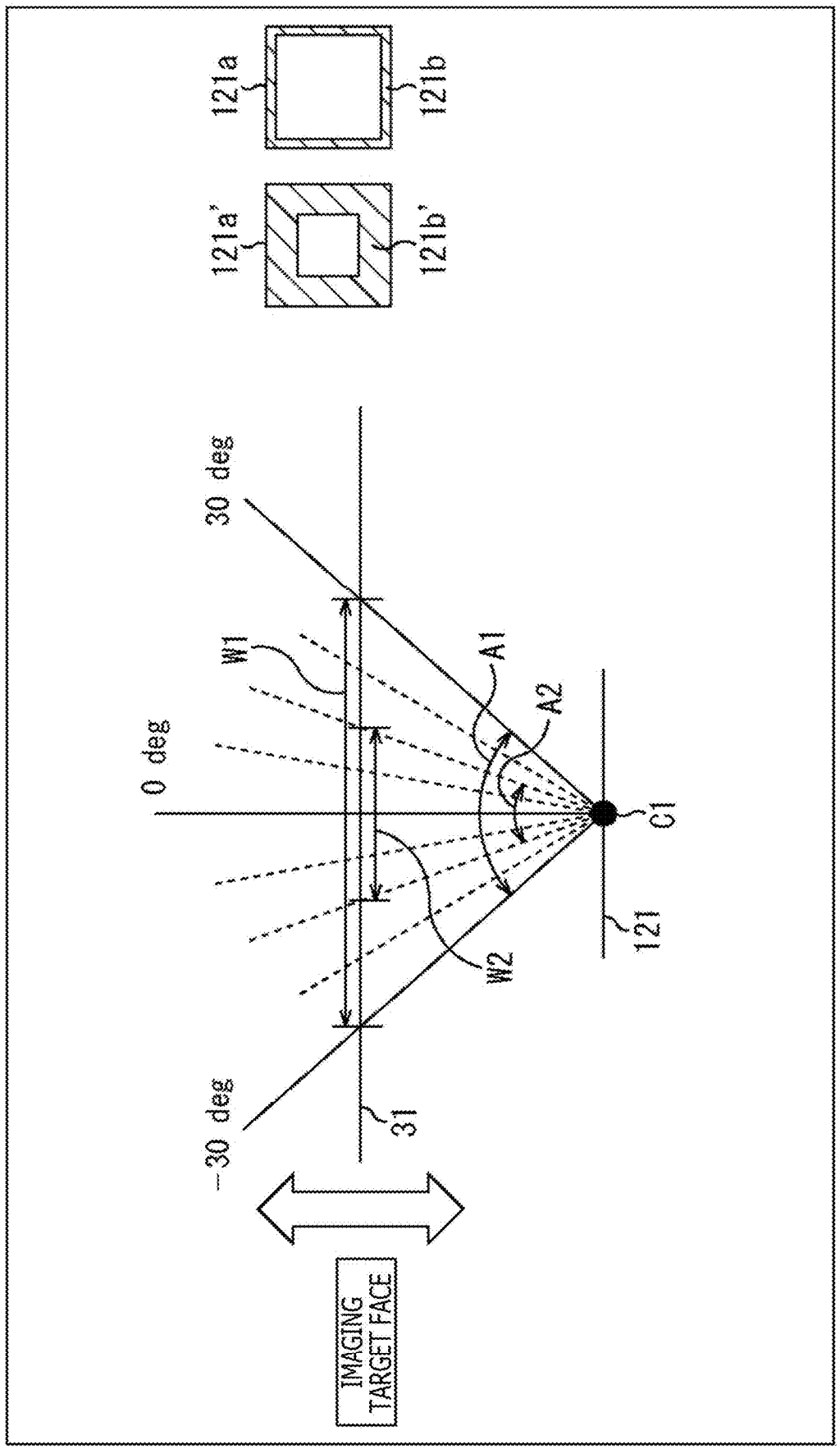
FIG. 15 is a view illustrating another relation between a narrow angle-of-view pixel and a wide angle-of-view pixel.

FIG. 15 depicts an example of an incident angle of incident light from the imaging target face 31 to the central position C1 of the imaging device 121. It is to be noted that, although FIG. 15 depicts an example of the incident angle of incident light in the horizontal direction, this also applies similarly in regard to the vertical direction. Further, at a right portion of FIG. 15, the pixels 121a and 121a' in FIG. 14 are depicted.

For example, in the case where the pixel 121a of FIG. 14 is arranged at the central position C1 of the imaging device 121, the range of the incident angle of incident light from the imaging target face 31 to the pixel 121a is an angle A1 as indicated at a left portion of FIG. 15. Accordingly, the pixel 121a can receive incident light for a width W1 in the horizontal direction of the imaging target face 31.

In contrast, in the case where the pixel 121a' of FIG. 14 is arranged at the central position C1 of the imaging device 121, since the pixel 121a' has a greater shielded range than the pixel 121a, the range of the incident angle of incident light from the imaging target face 31 to the pixel 121a' is an angle A2 (<A1) as indicated at a left portion of FIG. 15. Accordingly, the pixel 121a' can receive incident light for a width W2 (<W1) in the horizontal direction of the imaging target face 31.

In short, while the pixel 121a having a narrow light shielding range is a wide angle-of-view pixel suitable to image a wide range on the imaging target face 31, the pixel 121a' having a wide light shielding range is a narrow angle-of-view pixel suitable to image a narrow range on the imaging target face 31. It is to be noted that the wide angle-of-view pixel and the narrow angle-of-view pixel here are representations for comparison between the pixels 121a and 121a' of FIG. 14 and are not restrictive in comparison between pixels of other angles of view.

Accordingly, for example, the pixel 121a is used to restore an image I1 of FIG. 14. The image I1 is an image of an angle SQ1 of view corresponding to the imaging target width W1 including an entire person H101 that is an imaging target at an upper stage of FIG. 16. In contrast, for example, the pixel 121a' is used to restore an image I2 of FIG. 14. The image I2 is an image of an angle SQ2 of view corresponding to the imaging target width W2 in which an area around the face of the person H101 at the upper stage of FIG. 16 is zoomed up.

Figure 16:
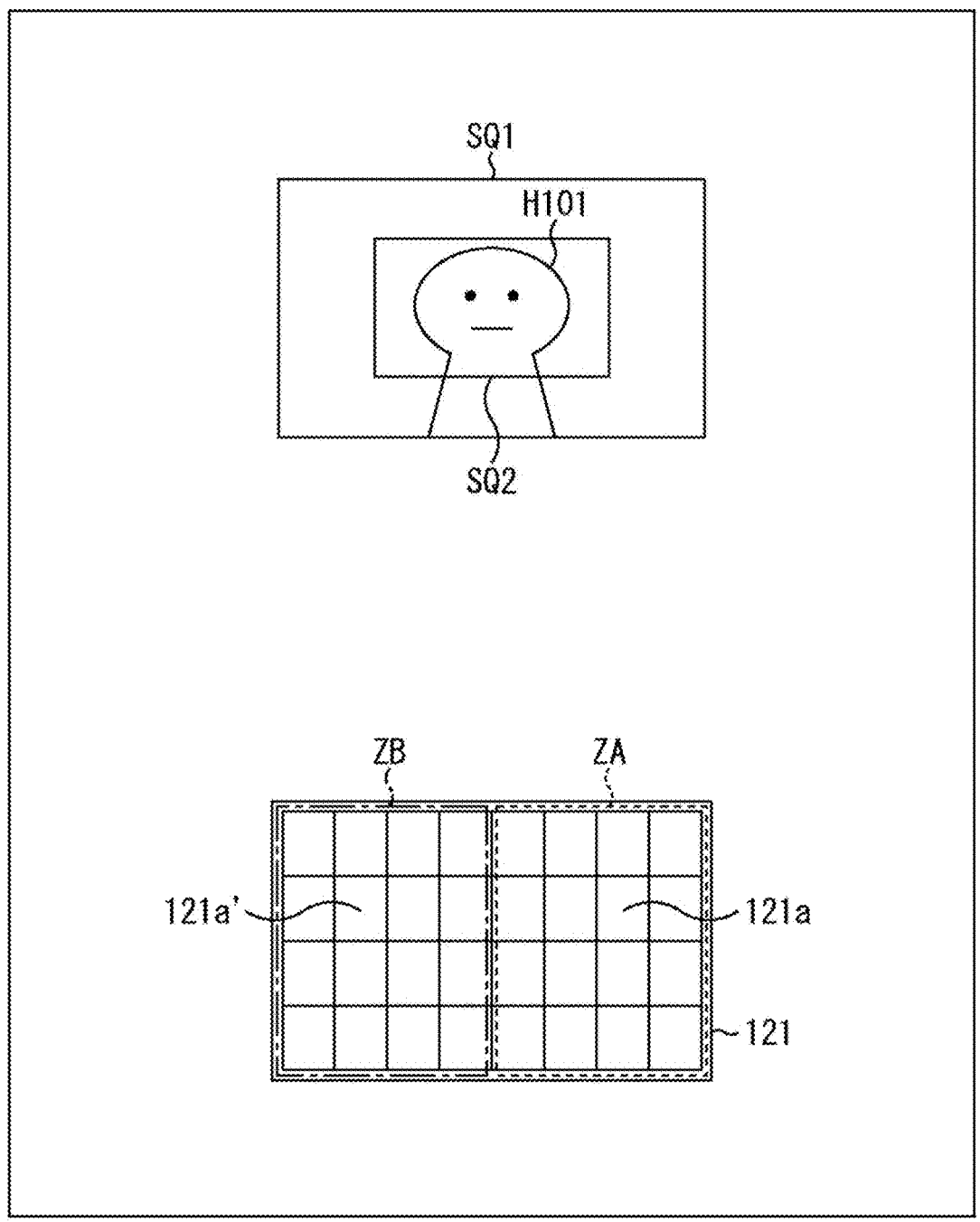
FIG. 16 is a view illustrating a further relation between a narrow angle-of-view pixel and a wide angle-of-view pixel.

Further, it is conceivable, for example, to collect and place each predetermined number of pixels 121a of FIG. 14 in a range ZA surrounded by a broken line and collect and place each predetermined number of pixels 121a' in a range ZB surrounded by a chain line of the imaging device 121 as depicted at a lower stage of FIG. 16. Then, for example, when an image of an angle SQ1 of view corresponding to the imaging target width W1 is to be restored, by using detection signals of the pixels 121a in the range ZA, an image of the angle SQ1 of view can be restored appropriately. On the other hand, in the case where an image of an angle SQ2 of view corresponding to the imaging target width W2 is to be restored, by using detection signals of the pixels 121a' in the range ZB, an image of the angle SQ2 of view can be restored appropriately.

It is to be noted that, since the angle SQ2 of view is narrower than the angle SQ1 of view, in the case where images of the angle SQ2 of view and the angle SQ1 of view are to be restored with an equal pixel number, a restoration image of higher image quality can be restored by restoration of an image of the angle SQ2 of view than by restoration of an image of the angle SQ1 of view.

In short, in the case where it is considered to obtain a restoration image using a same pixel number, a restoration image of higher image quality can be obtained where an image of a narrower angle of view is restored.

Figure 17:
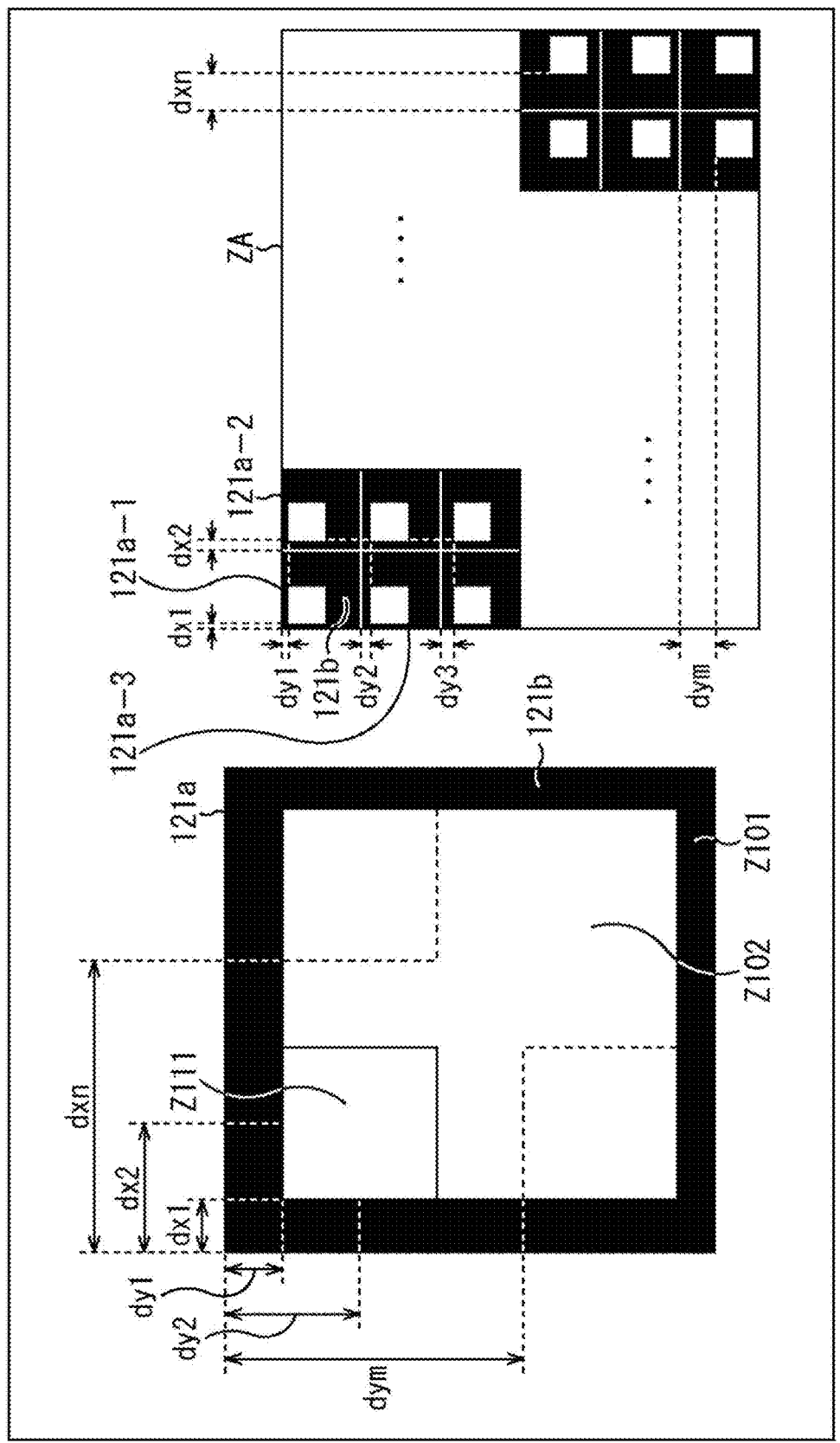
FIG. 17 is a view illustrating a difference in image quality between a narrow angle-of-view pixel and a wide angle-of-view pixel.

For example, a right portion of FIG. 17 depicts an image of a configuration in the range ZA of the imaging device 121 of FIG. 16. A left portion of FIG. 17 depicts an example of a configuration of the pixel 121a in the range ZA.

Referring to FIG. 17, a range indicated by black represents the light shielding film 121b, and the light shielding range of each pixel 121a is determined, for example, in accordance with a rule indicated at the left portion of FIG. 17.

A main light shielding portion 2101 of the left portion of FIG. 17 (black portion at the left portion of FIG. 17) indicates a range shielded in common in the pixels 121a. In particular, the main light shielding portion 2101 has a range of a width dx1 from the left side and the right side of the pixel 121a toward the inner side of the pixel 121a and a range of a height dy1 from the upper side and the lower side of the pixel 121a toward the inner side of the pixel 121a. Further, in each pixel 121a, a rectangular opening 2111 that is not shielded by the light shielding film 121b is provided within a range 2102 on the inner side of the main light shielding portion 2101. Accordingly, in each pixel 121a, the range other than the opening 2111 is shielded by the light shielding film 121b.

Here, the openings 2111 of the pixels 121a are arranged regularly. In particular, the positions of the openings 2111 in the pixels 121a in the horizontal direction are same in the pixels 121a in a same vertical column. Further, the positions of the openings 2111 in the pixels 121a in the vertical direction are same in the pixels 121a in a same horizontal row.

On the other hand, the positions of the openings 2111 in the pixels 121a in the horizontal direction are displaced by a predetermined distance according to the positions of the pixels 121a in the horizontal direction. In particular, as the position of the pixel 121a is displaced toward the rightward direction, the left side of the opening 2111 moves to a position displaced by the width dx1, dx2, . . . , dxn in the rightward direction from the left side of the pixel 121a. The distance between the width dx1 and the width dx2, the distance between the width dx2 and the width dx3, . . . , and the distance between the dxn−1 and the width dxn are values given by dividing the length when the width of the opening 2111 is subtracted respectively from the width of the range 2102 in the horizontal direction by the pixel number n−1 in the horizontal direction.

Further, the position of the opening 2111 in the pixel 121a in the vertical direction is displaced by a predetermined distance in response to the position of the pixel 121a in the vertical direction. In particular, as the position of the pixel 121a is displaced in the downward direction, the upper side of the opening 2111 moves to a position displaced by the height dy1, dy2, . . . , dyn from the upper side of the pixel 121a. The distance between the height dy1 and the height dy2, the distance between the height dy2 and the height dy3, . . . , the distance between the height dyn−1 and the height dyn are values obtained by dividing the length when the height of the opening 2111 is subtracted from the height of the range 2102 in the vertical direction by the pixel number m−1 in the vertical direction.

Figure 18:
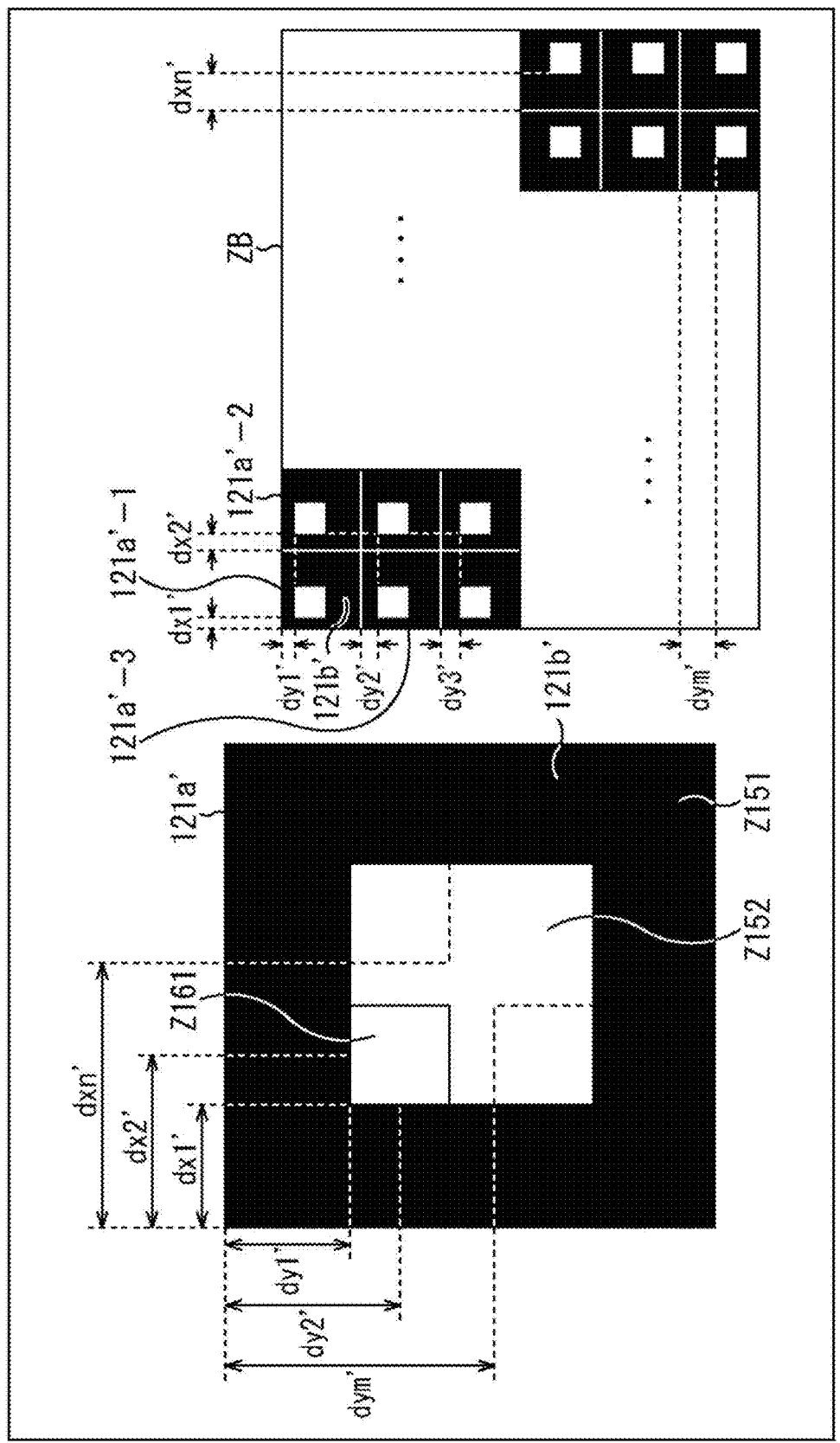
FIG. 18 is a view illustrating another difference in image quality between a narrow angle-of-view pixel and a wide angle-of-view pixel.

A right portion of FIG. 18 depicts an example of a configuration in the range ZB of the imaging device 121 of FIG. 16. A left portion of FIG. 18 depicts an example of a configuration of the pixels 121a' in the range ZB.

Referring to FIG. 18, a range indicated by black represents a light shielding film 121b', and the light shielding ranges of the pixels 121a' are determined, for example, in accordance with a rule indicated at a left portion of FIG. 18.

A main light shielding portion 2151 at a left portion of FIG. 18 (black portion at the left portion of FIG. 18) is a range shielded in common in the pixels 121a'. In particular, the main light shielding portion 2151 is a range of a width dx1' from the left side and the right side of the pixel 121a' toward the inner side of the pixel 121a' and a range of a height dy1' from the upper side and the lower side of the pixel 121a' toward the inner side of the pixel 121a'. Further, in each pixel 121a', a rectangular opening 2161 that is not shielded by the light shielding film 121b' is provided in a range 2152 on the inner side of the main light shielding portion 2151. Accordingly, in each pixel 121a', the range other than the opening 2161 is shielded by the light shielding film 121b'.

Here, the openings 2161 of the pixels 121a' are arranged regularly similarly to the openings 2111 of the pixels 121a of FIG. 17. In particular, the positions of the openings 2161 in the pixels 121a' in the horizontal direction are same in the pixels 121a' in a same vertical column. Meanwhile, the positions of the openings 2161 in the pixels 121a' in the vertical direction are same in the pixels 121a' in a same horizontal row.

On the other hand, the positions of the openings 2161 in the horizontal direction in the pixels 121a' are displaced by a predetermined distance in response to the position of the pixel 121a' in the horizontal direction. In particular, as the position of the pixel 121a' is displaced toward the rightward direction, the left side of the opening 2161 moves to a position individually displaced in the rightward direction by the width dx1', dx2', . . . , dzn' from the left side of the pixel 121a'. The distance between the width dx1' and the width dx2', the distance between the width dx2' and the width dx3', ..., the distance between the width dxn−1' and the width dxn' are values obtained by dividing the length when the width of the opening 2161 is subtracted from the width of the range 2152 in the horizontal direction by the pixel number n−1 in the horizontal direction.

On the other hand, the positions of the openings 2161 in the pixels 121a' in the vertical direction are displaced by a predetermined distance according to the positions of the pixels 121a' in the vertical direction. In particular, as the position of the pixel 121a' is displaced toward the downward direction, the upper side of the opening 2161 moves to a position displaced by the width dy1', dy2', ..., dyn' in the downward direction from the upper side of the pixel 121a'. The distance between the width dy1' and the width dy2', the distance between the width dy2' and the width dy3', ..., and the distance between the dyn−1' and the width dyn' are values given by dividing the length when the height of the opening 2161 is subtracted respectively from the height of the range 2152 in the vertical direction by the pixel number m−1 in the vertical direction.

Here, the length when the width of the opening 2111 is subtracted from the width of the range 2102 of the pixel 121a of FIG. 17 in the horizontal direction is greater than the width when the width of the opening 2161 is subtracted from the width of the range 2152 of the pixel 121a' of FIG. 18 in the horizontal direction. Accordingly, the distance of the change of the widths dx1, dx2, ..., dxn of FIG. 17 is greater than the distance of the change of the widths dx1', dx2', ..., dxn' of FIG. 18.

Further, the length when the height of the opening 2111 is subtracted from the height of the range 2102 of the pixel 121a of FIG. 17 in the vertical direction is greater than the length when the height of the opening 2161 is subtracted from the height of the range 2152 of the pixel 121a' of FIG. 18 in the vertical direction. Accordingly, the distance of the change of the heights dy1, dy2, ..., dyn of FIG. 17 is greater than the distance of the change of the heights dy1', dy2', ..., dyn' of FIG. 18.

In this manner, the distances of the change of the positions in the horizontal direction and the vertical direction of the opening 2111 of the light shielding film 121b of the pixel 121a of FIG. 17 and the distances of the change of the positions in the horizontal direction and the vertical direction of the opening 2161 of the light shielding film 121b' of the pixel 121a' of FIG. 18 are different from each other. Then, the difference in distance becomes a distance of the imaging target resolution (angular resolute) in a restoration image. In particular, the distances of the change of the positions in the horizontal direction and the vertical direction of the opening Z161 of the light shielding film 121b' of the pixel 121a' of FIG. 18 is smaller than the distances of the change of the positions in the horizontal direction and the vertical direction of the opening 2111 of the light shielding film 121b of the pixel 121a of FIG. 17. Accordingly, a restoration image restored using detection signals of the pixels 121a' of FIG. 18 is higher in imaging target resolution and higher in image quality than a restoration image restored using detection signals of the pixels 121a of FIG. 17.

By changing the combination of a light shielding range of a main light shielding portion and an opening range of an opening in this manner, an imaging device 121 including pixels of various angles of view (having various incident angle directivities) can be implemented.

It is to be noted that, while the foregoing description is directed to an example in which the pixels 121a and the pixels 121a' are arranged separately in the range ZA and the range ZB, respectively, such description is intended for simplified description, and it is desirable for the pixels 121a, which correspond to different angles of view, to be arranged in a mixed manner in the same region.

Figure 19:
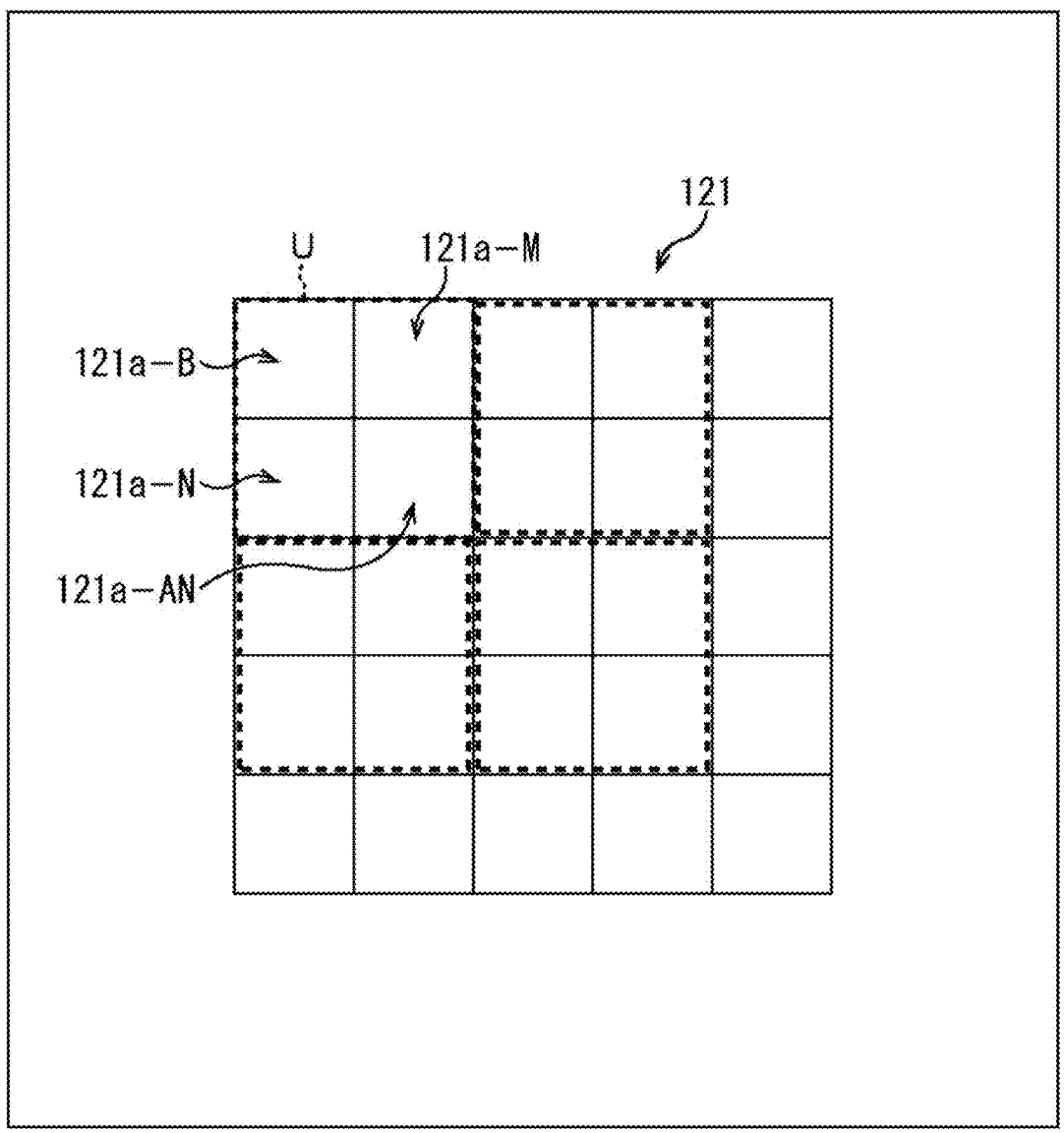
FIG. 19 is a view illustrating an example in which a plurality of pixels of different angles of view is combined.

For example, as depicted in FIG. 19, forming one unit U from four pixels of two pixels×two pixels indicated by broken lines, each unit U includes four pixels of a pixel 121a-W of a wide angle of view, a pixel 121a-M of a medium angle of view, a pixel 121a-N of a narrow angle of view and a pixel 121a-AN of a very narrow angle of view.

In this case, for example, in the case where the pixel number of all pixels 121a is X, it is possible to restore a restoration image using detection images each having X/4 pixels for each of the four angles of view. At this time, four coefficient set groups different from one another are used for each angle of view, and restoration images of angles of view different from one another are restored by four different kinds of simultaneous equations.

Accordingly, by restoring a restoration image using a detection image obtained from pixels suitable for imaging of an angle of view of the restoration image to be restored, appropriate restoration images according to four different angles of view can be obtained.

Further, images of intermediate angles of view among four angles of view and/or images of angles of view around the intermediate angles of view may be generated by interpolation from the images of the four angles of view, and by generating images of various angles of view seamlessly, pseudo optical zooming may be implemented.

It is to be noted that, for example, in the case of obtaining an image of a wide angle of view as a restoration image, all wide angle-of-view pixels may be used or some of wide angle-of-view pixels may be used. Further, for example, in the case of obtaining an image of a narrow angle of view as a restoration image, all narrow angle-of-view pixels may be used or some of the narrow angle-of-view pixels may be used.

<Imaging Process by Imaging Apparatus 101>

Now, an imaging process by the imaging apparatus 101 of FIG. 2 is described with reference to a flow chart of FIG. 20.

At step S1, the imaging device 121 performs imaging of an imaging target. Consequently, a detection signal indicative of a detection signal level according to a light amount of incident light from the imaging target is outputted from each of the pixels 121a of the imaging device 121 that have different incident angle directivities. The imaging device 121 supplies a detection image including the detection signals of the pixels 121a to the restoration section 122.

At step S2, the restoration section 122 calculates a coefficient to be used for restoration of an image. In particular, the restoration section 122 sets a distance to the imaging target face 31 that is a restoration target, namely, an imaging target distance. It is to be noted that an arbitrary method can be adopted as the setting method of an imaging target distance. For example, the restoration section 122 sets an imaging target distance inputted through the inputting section 124 by the user or an imaging target distance detected by the detection section 125 as the distance to the imaging target face 31 of the restoration target.

Then, the restoration section 122 reads out a coefficient set group associated with the set imaging target distance from the storage section 128.

At step S3, the restoration section 122 performs restoration of an image using the detection image and the coefficient. In particular, the restoration section 122 uses the detection signal levels of the pixels of the detection image and the coefficient set group acquired by the process at step S2 to create simultaneous equations described hereinabove with reference to the expressions (1) to (3) or the expressions (4) to (6) described hereinabove. Then, the restoration section 122 solves the created simultaneous equations to calculate a light intensity of each point light source on the imaging target face 31 corresponding to the set imaging target distance. Then, the restoration section 122 arranges the pixels having pixel values according to the calculated light intensities in accordance with the arrangement of the point light sources of the imaging target face 31 to generate a restoration image in which an image of the imaging target is formed.

At step S4, the imaging apparatus 101 performs various processes for the restoration image. For example, the restoration section 122 performs a demosaic process, γ correction, white balance adjustment, a conversion process into a predetermined compression format and so forth for the restoration image as occasion demands. Further, for example, the restoration section 122 supplies the restoration image to the display section 127 so as to be displayed or to the recording and reproduction section 129 so as to be recorded in the recording medium 130, or supplies the restoration image to a different apparatus through the communication section 131 as occasion demands.

Thereafter, the imaging process ends.

It is to be noted that, although the foregoing description is directed to an example in which a restoration image is restored from a detection image using a coefficient set group associated with the imaging device 121 and the imaging target distance, for example, coefficient set groups corresponding to angles of view of the restoration image in addition to the imaging target distance may be prepared further in such a manner as described above such that a restoration image is restored using a coefficient set group according to an imaging target distance and an angle of view. It is to be noted that the resolution for an imaging target distance and an angle of view depends upon the number of coefficient set groups to be prepared.

Figure 20:
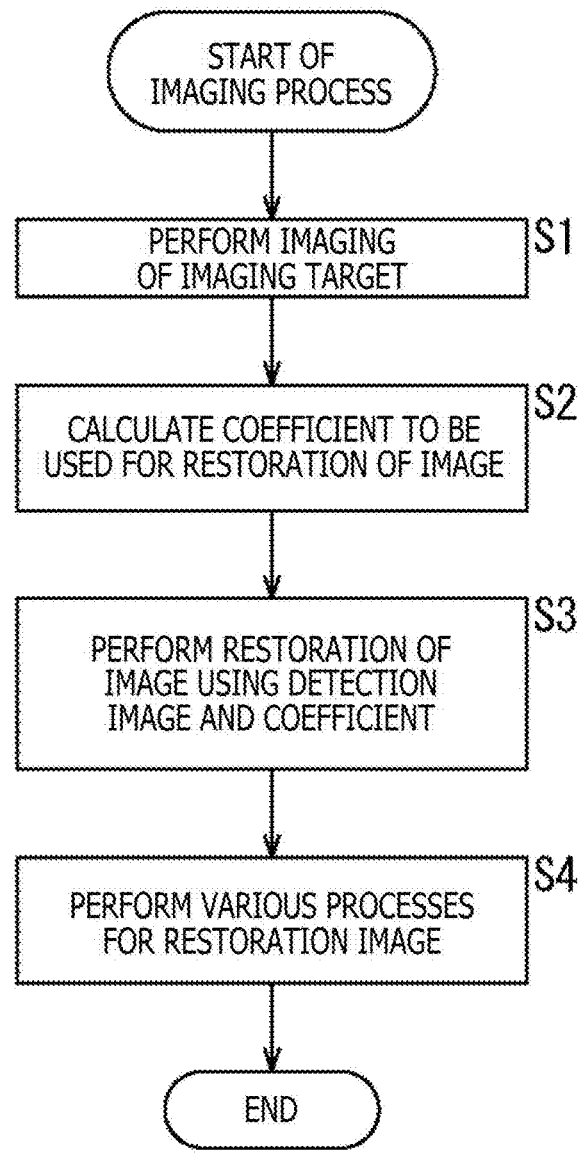
FIG. 20 is a flow chart illustrating an imaging process by the imaging apparatus of FIG. 2.

Further, while the description of the processing using the flow chart of FIG. 20 is directed to an example in which detection signals of all pixels included in a detection image are used, a detection image including detection signals of pixels having an incident angle directivity corresponding to a specified imaging target distance and angle of view from among the pixels configuring the imaging device 121 may be generated such that a restoration image is restored using this detection image. Such a process as just described makes it possible to restore a restoration image from a detection image suitable for an imaging target distance and an angle of view of a restoration image to be determined, and the restoration accuracy and the image quality of the restoration image are improved. In particular, in the case where an image corresponding to a specified imaging target distance and angle of view is an example corresponding, for example, to the angle SQ1 of view in FIG. 16, by selecting the pixels 121a having an incident angle directivity corresponding to the angle SQ1 of view and restoring a restoration image from a detection image obtained from the selected pixels 121a, an image of the angle SQ1 of view can be restored with high accuracy.

By the processes described above, the imaging apparatus 101 that includes, as an essential component, the imaging device 121 in which an incident angle directivity is provided to each pixel can be implemented.

As a result, since an imaging lens, a pinhole and an optical filter described in the patent documents and so forth become unnecessary, it is possible to raise the degree of freedom in apparatus design. Further, since an optical device that is configured as a separate body from the imaging device 121 and is incorporated together with the imaging device 121 at a stage at which an imaging apparatus is configured, it is possible to implement downsizing of the apparatus in the incident direction of incident light and to reduce the manufacturing cost. Further a lens corresponding to an imaging lens for forming an optical image like a focusing lens becomes unnecessary. However, a zoom lens for changing the magnification may be provided.

It is to be noted that, although the foregoing description is given of a process for restoring a restoration image corresponding to a predetermined imaging target distance immediately after capturing of a detection image is performed, a restoration image may be restored, for example, using a detection image at a desired timing after the detection image is recorded into the recording medium 130 or is outputted to a different apparatus through the communication section 131 without performing the restoration process immediately. In this case, the restoration of the restoration image may be performed by the imaging apparatus 101 or may be performed by a different apparatus. In this case, by finding the restoration image, for example, by solving simultaneous equations created using a coefficient set group according to an arbitrary imaging target distance or angle of view, a restoration image for an imaging target face of the arbitrary imaging target distance or angle of view can be obtained, and refocus and so forth can be implemented.

For example, in the case where an imaging apparatus including an imaging lens and a conventional imaging device is used, in order to obtain images of various focal distances and angles of view, it is necessary to perform imaging while the focal distance and the angle of view are changed variously. On the other hand, in the imaging apparatus 101, since a restoration image of an arbitrary imaging target distance or angle of view can be restored by switching the coefficient set group in this manner, such a process as to repetitively perform imaging while the focal distance (namely, the imaging target distance) or the angle of view is changed variously becomes unnecessary.

In this case, for example, also it is possible for the user to obtain a restoration image of a desired imaging target distance or angle of view by displaying restoration images restored by successively switching the coefficient set group corresponding to a different imaging target distance or angle of view on the display section 127.

It is to be noted that, in the case where a detection image is recorded, metadata to be used for restoration may be associated with the detection image when an imaging target distance or angle of view upon restoration is determined. A detection image and metadata can be associated with each other, for example, by applying the metadata to image data including the detection image, applying a same ID to the detection image and the metadata or recording the detection image and the metadata into a same recording medium 130.

It is to be noted that, in the case where a same ID is applied to the detection image and the metadata, it is possible to record the detection image and the metadata into different recording media or to individually output them from the imaging apparatus 101.

Further, the metadata may include or may not include a coefficient set group to be used for restoration. In the latter case, for example, an imaging target distance and an angle of view upon restoration are included in the metadata, and at the time of restoration, a coefficient set group corresponding to the imaging target distance and the angle of view is acquired from the storage section 128 or the like.

Furthermore, in the case where restoration of a restoration image is performed immediately upon imaging, for example, it is possible to select, for example, an image to be recorded or to be outputted to the outside from between the detection image and the restoration image. For example, both images may be recorded or outputted to the outside or only one of the images may be recorded or outputted to the outside.

Also in the case where a moving image is captured, it is possible to select whether or not restoration of a restoration image is to be performed at the time of imaging or select an image to be recorded or outputted to the outside. For example, it is possible to restore, while capturing of a moving image is performed, a restoration image of each frame immediately and record or output to the outside both or one of the restoration image and a detection image before the restoration. In this case, also it is possible to display, at the time of imaging, a restoration image of each frame as a through image. Alternatively, at the time of imaging, for example, it is possible to record or output to the outside a detection image of each frame without performing a restoration process.

Furthermore, at the time of capturing of a moving image, for example, selection of whether or not restoration of a restoration image is to be performed or of an image to be recorded or to be outputted to the outside can be performed for each frame. For example, whether or not restoration of a restoration image is to be performed can be switched for each frame. Further, it is possible to individually switch whether or not recording of a detection image is to be performed and whether or not recording of a restoration image is to be performed for each frame. Further, for example, detection images of all frames may be recorded while metadata is applied to a detection image of a useful frame that may possibly be used later.

Also it is possible to implement an autofocus function like that in an imaging apparatus that uses an imaging lens. For example, by determining an optimum imaging target distance by a mountain climbing method similar to a contrast AF (Auto Focus) method on the basis of a restoration image, the autofocus function can be implemented.

Further, since a restoration image can be generated using a detection image captured by the imaging device 121 having an incident angle directivity in a unit of a pixel in comparison with an imaging apparatus including the optical filter described in the patent documents and so forth and a conventional imaging device, it is possible to implement increase of the number of pixels or to obtain a restoration image of a high resolution and a high angular resolution. On the other hand, in an imaging apparatus that includes an optical filter and a conventional imaging device, even if pixels are refined, since refinement of optical filters is difficult, it is difficult to achieve implementation of a high resolution and so forth of a restoration image.

Further, since the imaging apparatus 101 of the present disclosure includes the imaging device 121 as an essential component and does not require, for example, the optical filter and so forth described in the patent documents and so forth mentioned hereinabove, such a situation that the use environment becomes hot and the optical filter is distorted by heat does not occur, and it is possible to implement an imaging apparatus of high environmental resistance.

Furthermore, in the imaging apparatus 101 of the present disclosure, since an imaging lens, a pinhole and the optical filter described in the patent documents and so forth mentioned hereinabove are not required, it is possible to improve the degree of freedom in design of a configuration including an imaging function.

<Reduction Method of Processing Load>

Incidentally, in the case where the light shielding range (namely, the incident angle directivity) of the light shielding film 121*b* of each pixel 121*a* of the imaging device 121 has randomness, as the disorder of difference of the light shielding range increases, the load of processing by the restoration section 122 increases. Therefore, the processing load may be reduced by making part of a change of the light shielding range of the light shielding film 121*b* of each pixel 121*a* regular to reduce the disorder.

For example, L-shaped light shielding films 121*b* in which the vertical belt type and the horizontal belt type are combined are configured such that, in a predetermined column direction, light shielding films 121*b* of the horizontal belt type having an equal width are combined while, in a predetermined row direction, light shielding films 121*b* of the vertical belt type having an equal height are combined. By this, the light shielding ranges of the light shielding films 121*b* of the pixels 121*a* come to change at random in a pixel unit while they keep regularity in the column direction and the row direction. As a result, it is possible to reduce differences in light shielding range of the light shielding films 121*b* of the pixels 121*a*, namely, the disorder of differences of incident angle directivities, thereby to reduce the processing load of the restoration section 122.

Figure 21:
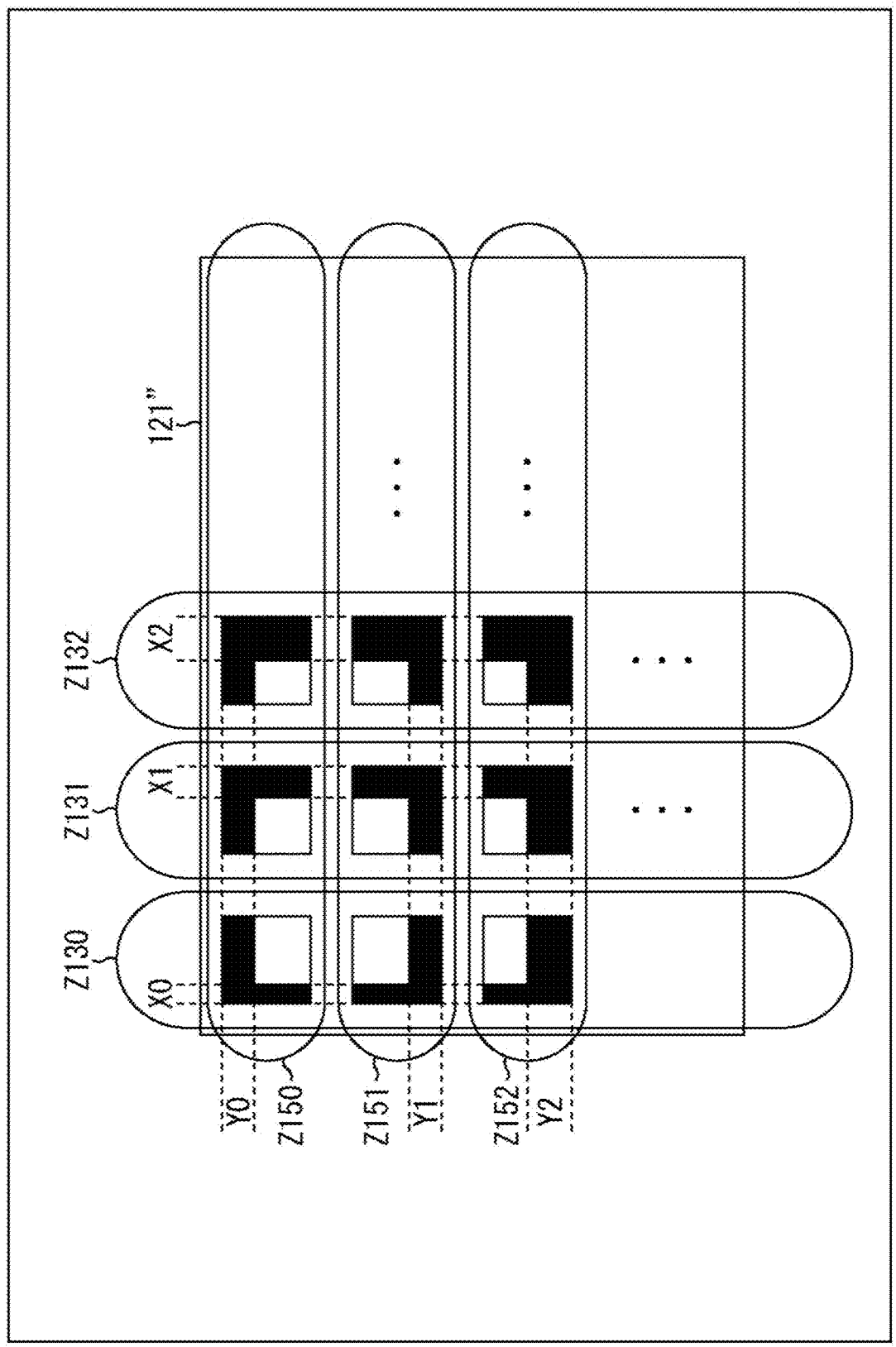
FIG. 21 is a view illustrating a reduction method of a processing load.

In particular, for example, as depicted by an imaging device 121" of FIG. 21, for pixels in a same column indicated by a range 2130, light shielding films 121*b* of the horizontal belt type having an equal width X0 are used, and for pixels in a same row indicated by a range 2150, light shielding films 121*b* of the vertical belt type of an equal height Y0 are used. As a result, for pixels 121*a* specified by each row and column, light shielding films 121*b* of the L-shaped type in which they are combined are used.

Similarly, for pixels in a same column indicated by a range 2131 next to the range 2130, light shielding films 121*b* of the horizontal belt type having an equal width X1 are used, and for pixels in a same row indicated by a range 2151 next to the range 2150, light shielding films 121*b* of the vertical belt type of an equal height Y1 are used. As a result, for pixels 121*a* specified by each row and column, light shielding films 121*b* of the L-shaped type in which they are combined are used.

Further, for pixels in a same column indicated by a range Z132 next to the range 2131, light shielding films 121*b* of the horizontal belt type having an equal width X2 are used, and for pixels in a same row indicated by a range 2152 next to the range Z151, light shielding films 121*b* of the vertical belt type of an equal height Y2 are used. As a result, for pixels 121*a* specified by each row and column, light shielding films 121*b* of the L-shaped type in which they are combined are used.

By doing this, while the width and the position in the horizontal direction and the height and position in the vertical direction of the light shielding films 121*b* have regularity, the range of the light shielding film can be set to a different value in a unit of a pixel, and therefore, the disorder of the change of the incident angle directivity can be suppressed. As a result, it is possible to reduce patterns of the coefficient set and reduce the processing load of calculation process in the restoration section 122.

More particularly, in the case where a restoration image of N×N pixels is to be found from a detection image Pic of N pixels×N pixels as depicted at an upper right portion of FIG.

Figure 22:
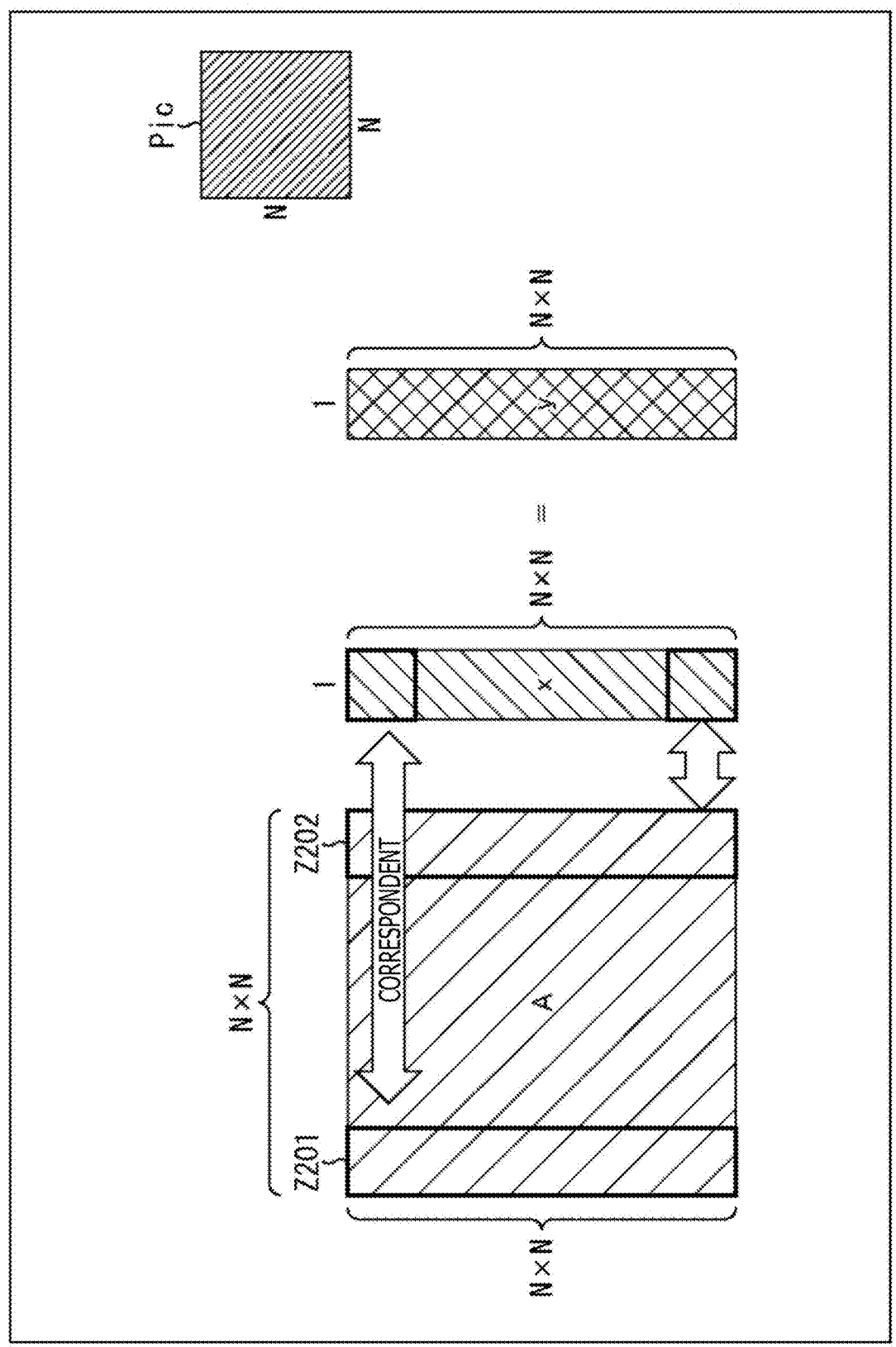
FIG. 22 is a view illustrating another reduction method of a processing load.

22, such a relation as depicted at a left portion of FIG. 22 is satisfied from a vector X including pixel values of pixels of a restoration image of (N×N) rows×1 column as elements, a vector Y including pixel values of pixels of a detection image of (N×N) rows×1 column as elements, and a matrix A of (N×N) rows×(N×N) columns including a coefficient set group.

In particular, in FIG. 22, it is indicated that a result of multiplication of the elements of the matrix A of the (N×N) rows×(N×N) columns including a coefficient set group and the vector X of the (N×N) rows×1 column representative of a restoration image becomes the vector Y of (N×N) rows×1 column representative of a detection image. Then, from this relation, simultaneous equations corresponding to the expressions (1) to (3) or the expressions (4) to (6) are configured.

It is to be noted that, in FIG. 22, the elements in the first column indicated by a range 2201 of the matrix A corresponds to elements of the first low of the vector X, and the elements of the (N×N)th column indicated by a range 2202 of the matrix A corresponds to the elements of (N×N)th row of the vector X.

It is to be noted that, in the case where a pinhole is used and in the case where a condensing function for introducing incident light entering from a same direction of an imaging lens or the like to both of pixel output units adjacent each other is used, since the relation between the position of each pixel and the incident angle of light is determined uniquely, the matrix A becomes a diagonal matrix in which all downward diagonal components are 1. In contrast, in the case where none of a pinhole and an imaging lens is used as in the imaging apparatus 101 of FIG. 2, since the relation between the position of each pixel and the incident angle of light is not determined uniquely, the matrix A does not become a diagonal matrix.

In other words, a restoration image is found by solving the simultaneous equations based on the determinant depicted in FIG. 22 to find elements of the vector X.

Figure 23:
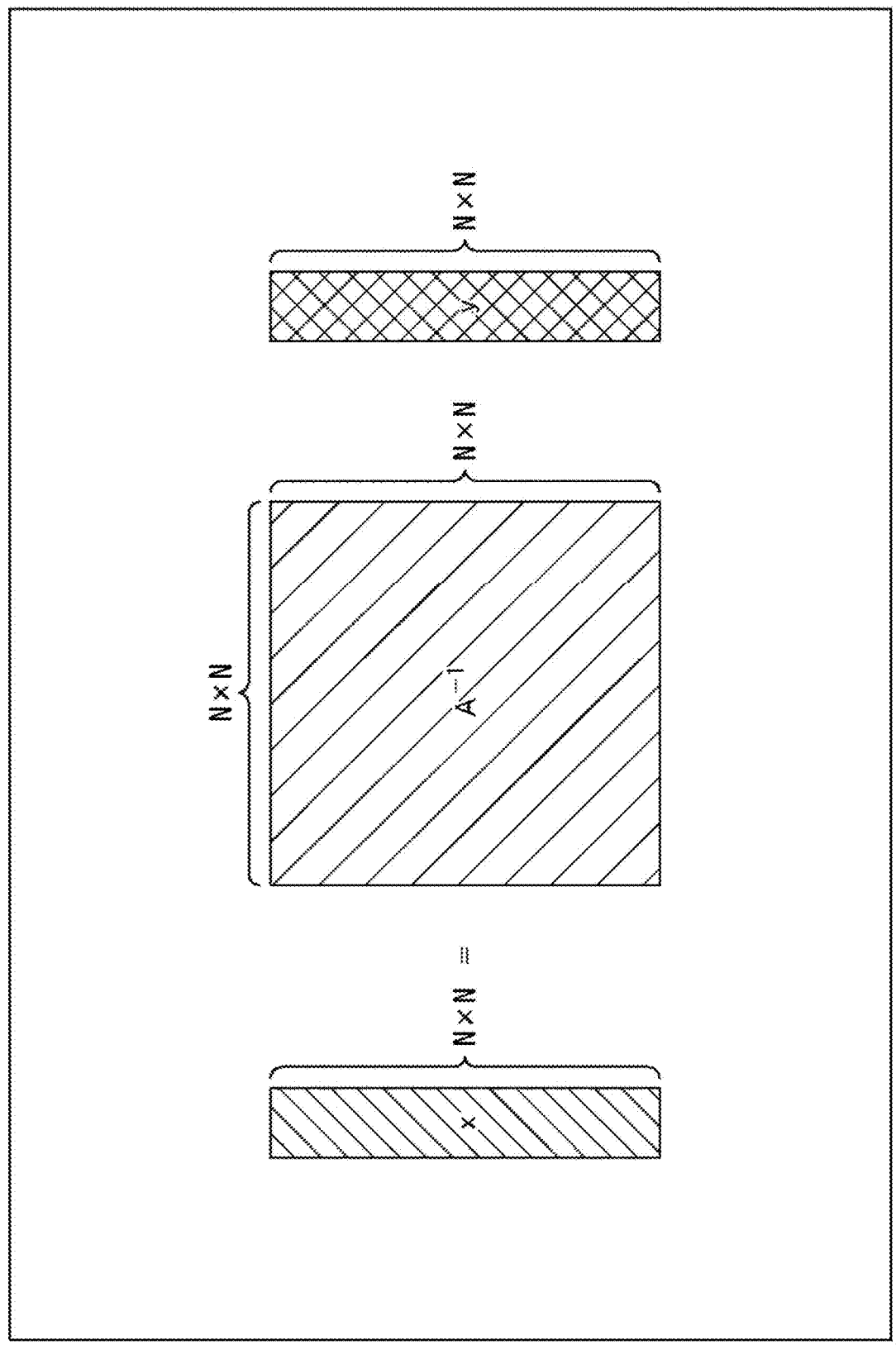
FIG. 23 is a view illustrating a further reduction method of a processing load.

Incidentally, generally the determinant of FIG. 22 is transformed as depicted in FIG. 23 by multiplying both sides by an inverse matrix $A^{-1}$ of the matrix A from the left, and by multiplying the vector Y of the detection image by the inverse matrix $A^{-1}$ from the left, elements of the vector X that is the detection image are found.

However, in reality, sometimes the matrix A cannot be calculated accurately, sometimes the matrix A cannot be measured accurately, sometimes the matrix A cannot be solved in a case in which the basis vector thereof is near to linear dependency, and sometimes noise is included in the elements of a detection image. Then, from any one of the reasons described, or from a combination of them, sometimes the simultaneous equations cannot be solved.

Therefore, for example, considering a configuration that is robust against various errors, the following expression (7) that uses a concept of a regularized least squares method is used.

[Math. 1]

$$\hat{x} = \min \|A\hat{x} - y\|^2 + \|\gamma\hat{x}\|^2 \quad (7)$$

Here, x having "^" added thereto in the expression (7) represents the vector X, A represents the matrix A, Y represents the vector Y, γ represents a parameter, and ‖A‖ represents an L2 norm (root-sum-square). Here, the first term on the right side is a norm when both sides of FIG. 22 are minimized, and the second term on the right side is a regularization term.

If this expression (7) is solved for x, then the following expression (8) is obtained.

[Math. 2]

$$\hat{x} = (A^t A + \gamma I)^{-1} A^t y \quad (8)$$

Here, $A^t$ is a transverse matrix of the matrix A, and I is a unit matrix.

However, since the matrix A has a huge size, the calculation amount and the required memory amount are great.

Figure 24:
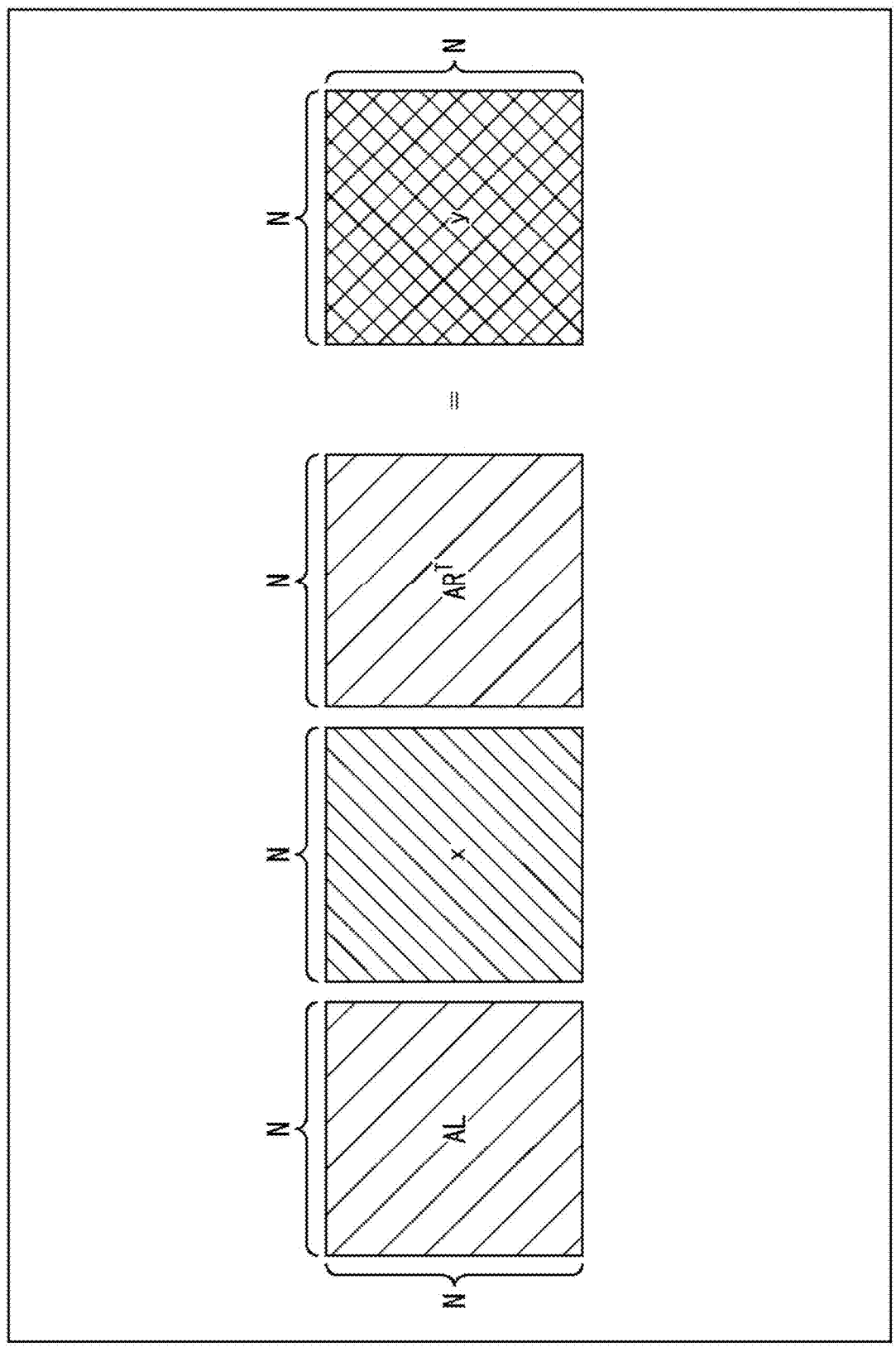
FIG. 24 is a view illustrating a still further reduction method of a processing load.

Therefore, for example, as depicted in FIG. 24, the matrix A is decomposed into a matrix AL of N rows×N columns and a matrix $AR^T$ of N rows×N columns such that a result of multiplication of them by the matrix X of N rows×N columns representative of a restoration image from the front stage and the rear stage becomes the matrix Y of N rows×N columns representative of a detection image. By this, the matrix A of the element number (N×N)×(N×N) becomes matrices AL and ART whose pixel number is (N×N) and the element number of each matrix becomes 1/(N×N). As a result, the calculation amount and the required memory amount can be reduced.

The determinant depicted in FIG. 24 is implemented, for example, by setting the matrix in the parentheses of the expression (8) to the matrix AL and setting the inverse matrix of the transverse matrix of the matrix A to the matrix ART.

Figure 25:
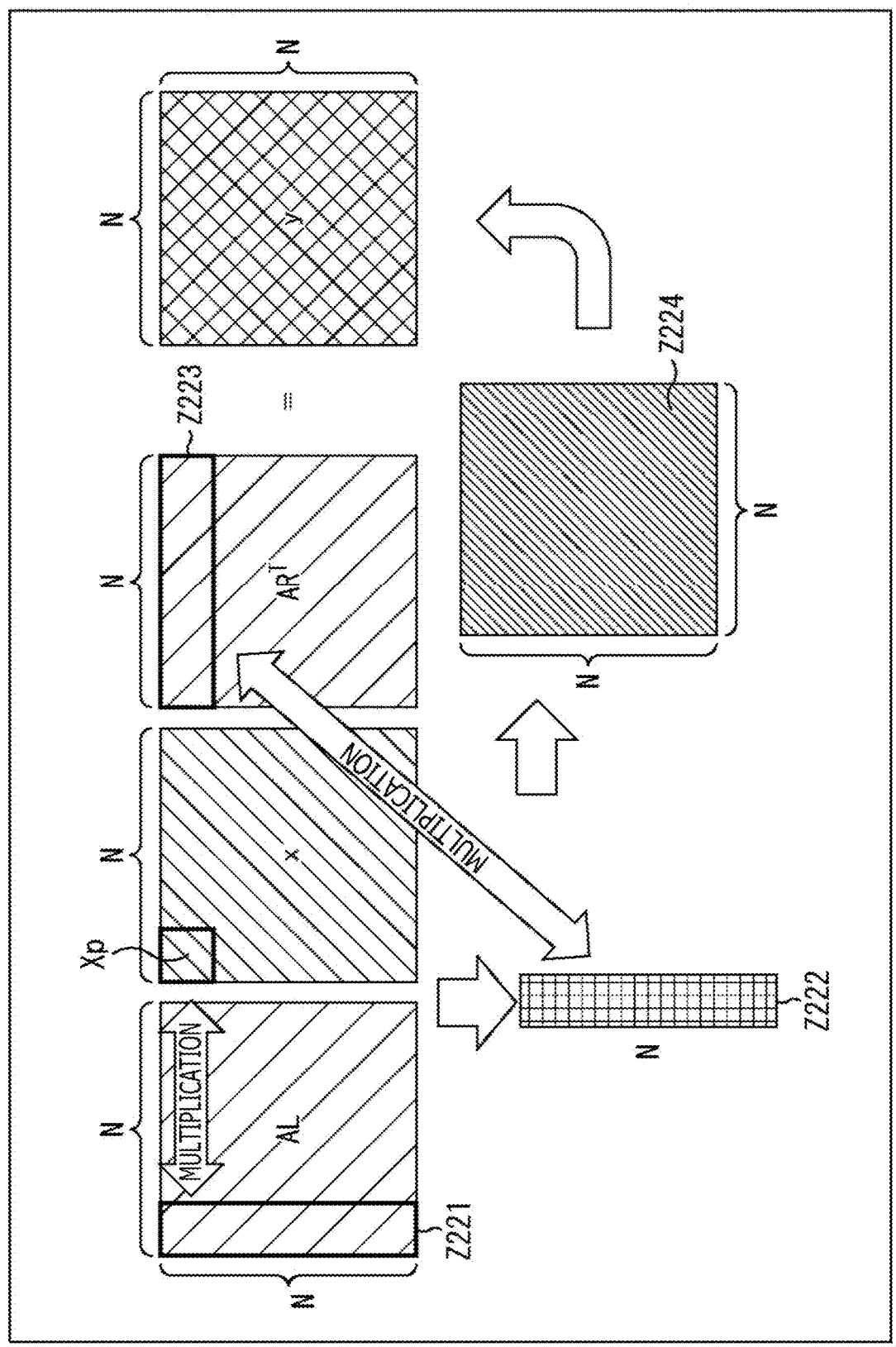
FIG. 25 is a view illustrating a yet further reduction method of a processing load.

In such calculation as depicted in FIG. 24, an element group 2222 is calculated by multiplying a noticed element Xp in the matrix X by each element group 2221 of a corresponding column of the matrix AL as depicted in FIG. 25. Further, by multiplying the element group 2222 by an element of a row corresponding to the noticed element Xp in the matrix ART, a two-dimensional response 2224 corresponding to the noticed element Xp is calculated. Then, to all elements of the matrix X, the corresponding two-dimensional responses 2224 are integrated to calculate a matrix Y.

Therefore, for example, for the element group 2221 of each column of the matrix AL, a coefficient corresponding to the incident angle directivity of the pixels 121a of the horizontal belt type set to an equal width for each column of the imaging device 121 depicted in FIG. 21 is used.

Similarly, for example, for an element group 2223 of each row of the matrix ART, a coefficient corresponding to the incident angle directivity of the pixels 121a of the vertical belt type set to an equal height for each row of the imaging device 121 depicted in FIG. 21 is used.

As a result, it becomes possible to reduce a matrix to be utilized when a restoration image is to be restored on the basis of a detection image, and therefore, the calculation amount decreases. Consequently, it is possible to improve the processing speed and reduce the power consumption required for the calculation. Further, since the matrix can be reduced in size, it becomes possible to reduce the capacity of the memory to be used for the calculation and becomes possible to reduce the apparatus cost.

It is to be noted that, although FIG. 21 depicts an example in which the light shielding range (light reception range) is changed in a unit of a pixel while predetermined regularity is provided in the horizontal direction and the vertical direction, in the present disclosure, even where the light shielding range (light reception range) is set in a unit of a pixel not fully at random but at random to some degree, it is deemed that the light shielding range (light reception range) is set at random. In other words, in the present disclosure, not only in the case where the light shielding range (light reception range) is set fully at random in a unit of a pixel, but also in the case where the light shielding range (light reception range) is set at random to some degree (for example, although, from among all pixels, some pixels belong to a region in which the light shielding range (light reception range) has regularity, the other pixels belong to the other region in which the light shielding range (light reception range) is set at random) or the light shielding range (light reception range) seems having no regularity to some degree (in the case of arrangement in which it cannot be confirmed that the light shielding range (light reception range) is arranged in accordance with such a rule as described hereinabove with reference to FIG. 21), it is deemed that the light shielding range (light reception range) is set at random.

3. First Embodiment

Now, a first embodiment of the present disclosure is described with reference to FIGS. 26 to 31.

As describe hereinabove, the imaging apparatus 101 calculates the pixel value of each pixel of a restoration image by solving such simultaneous equations as indicated by the expressions (1) to (3) or the expressions (4) to (6) given hereinabove. Accordingly, for example, if the light intensity of incident light from an imaging target is high and even one of the pixels 121a of the imaging device 121 is saturated, then the influence of this is had on all pixels of the restoration image and the restoration accuracy of the restoration image degrades. As a result, the image quality of the restoration image degrades.

In contrast, in the present first embodiment, exposure control of the imaging apparatus 101 is performed such that occurrence of saturation of the pixels 121a of the imaging device 121 is suppressed.

It is to be noted that, in the first embodiment, the imaging apparatus 101 of FIG. 2 is used. However, in the first embodiment, the configuration and so forth of the pixel array section are changed as hereinafter described.

<Example of Configuration of Imaging Device 121>

Figure 26:
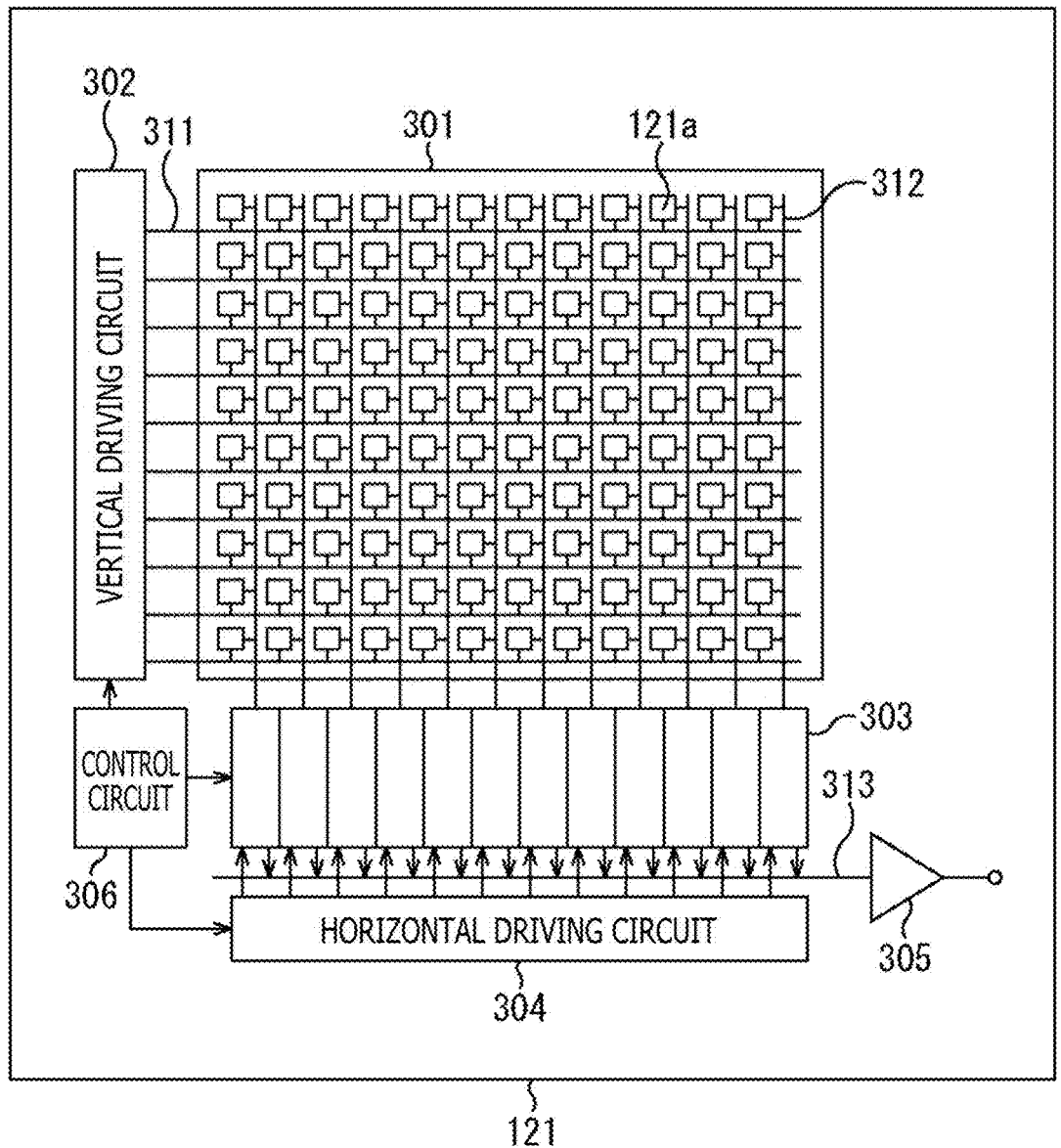
FIG. 26 is a block diagram depicting an example of a circuit configuration of the imaging device of FIG. 2.

FIG. 26 is a block diagram depicting an example of a circuit configuration of the imaging device 121 of FIG. 2.

The imaging device 121 includes a pixel array section 301, a vertical driving circuit 302, a column signal processing circuit 303, a horizontal driving circuit 304, an outputting circuit 305, and a control circuit 306.

In the pixel array section 301, pixels 121a having an incident angle directivity are arranged in a matrix as described hereinabove with reference to FIG. 3. However, as hereinafter descried with reference to FIG. 27, a pixel 121a having no incident angle directivity is arranged at part of the pixel array section 301.

The pixels 121a of the pixel array section 301 are connected to the vertical driving circuit 302 through a horizontal signal line 311 for each row and are connected to the column signal processing circuit 303 through a vertical signal line 312 for each column. Each of the pixel 121a outputs a detection signal as described hereinabove.

The vertical driving circuit 302 supplies a driving signal, for example, to the pixels 121a through the horizontal signal lines 311 to drive the pixels 121a of the pixel array section 301 for the individual rows (for transfer, selection, reset or the like) to perform control of exposure time, reading out scanning and so forth of the pixels 121a. For example, the vertical driving circuit 302 can perform collective exposure of starting exposure of the pixels 121a in a plurality of rows of the pixel array section 301 all at once and stopping the exposure all at once. Further, the vertical driving circuit 302 can control the exposure time of the pixels 121a individually and control reading out timings of detection signals of the pixels 121a individually.

It is to be noted that the exposure method of the imaging device 121 may be any of the rolling shutter method and the global shutter method. In the following description, principally a case in which the global shutter method is applied to the exposure method of the imaging device 121 is described. Further, individual control of the exposure time of each pixel 121a is described, for example, in Japanese Patent Laid-Open No. 2015-121751. Further, individual control of the reading out timing of a signal of each pixel 121a is described, for example, in Japanese Patent Laid-Open No. 2013-223054.

The column signal processing circuit 303 performs CDS (Correlated Double Sampling) for a detection signal outputted through the vertical signal line 312 from each pixel 121a of the pixel array section 301 to perform AD conversion of the detection signal and remove reset noise from the detection signal. For example, the column signal processing circuit 303 includes a plurality of column processing sections (not depicted) according to the number of columns of the pixels 121a and can perform CDS in parallel for the individual columns of the pixel array section 301.

The horizontal driving circuit 304 supplies, for example, a driving signal to the column signal processing circuit 303 to cause the column signal processing circuit 303 to sequentially output a detection signal to the output signal line 313 for each column.

The outputting circuit 305 amplifies a detection signal supplied from the column signal processing circuit 303 through the output signal line 313 at a timing based on a driving signal from the horizontal driving circuit 304 and outputs the amplified detection signal to the succeeding stage (for example, to the restoration section 122 or the bus B1 of FIG. 2.)

The control circuit 306 performs control of the components in the imaging device 121.

Figure 27:
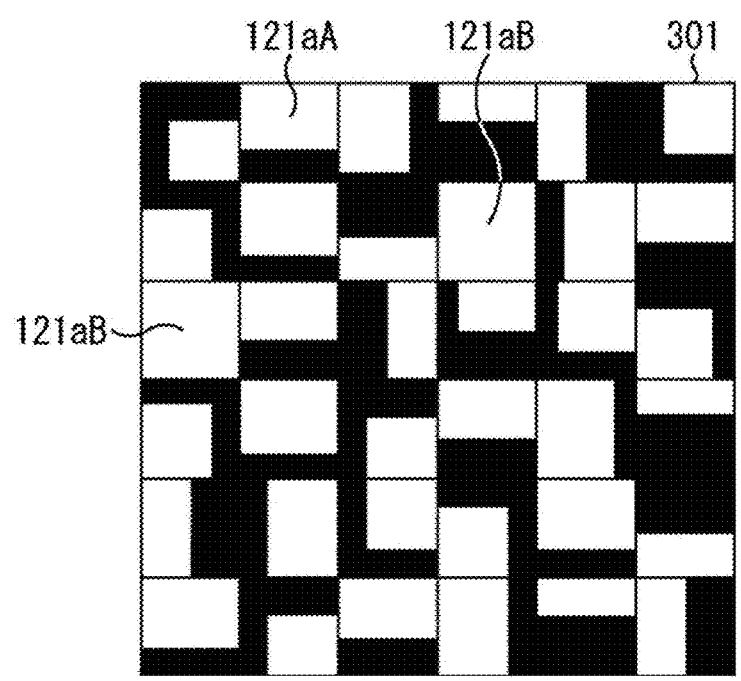
FIG. 27 is a view depicting an example of a configuration of a pixel array section of FIG. 26.

FIG. 27 depicts a front elevational view of part of the pixel array section 301 of FIG. 26 similarly to FIG. 3. It is to be noted that, although FIG. 27 depicts an example in which the pixels 121a of vertical six pixels×horizontal six pixels are arrayed in the pixel array section 301, the array of pixels is not restricted to this.

In the pixel array section 301, pixels 121aA for restoration and pixels 121aB for exposure are arranged in a mixed manner.

The pixels 121aA for restoration include a directive pixel. The directive pixel is a pixel that includes a configuration for providing an incident angle directivity like the pixel 121a of FIG. 4 or 5 described hereinabove. Further, the pixels 121aA for restoration individually include color filters for red, green, blue and so forth as occasion demands.

The pixels 121aB for exposure include a non-directive pixel. The non-directive pixel is a pixel that does not include a configuration for providing an incident angle directivity. For example, a pixel obtained by deleting a portion for light shielding the light reception face S of the light shielding film 121b from the pixel 121a of FIG. 4 is used as the non-directive pixel. As an alternative, for example, a pixel that includes a plurality of photodiodes therein and outputs one detection signal to which all of the plurality of photodiodes contribute, like the pixel 121a of FIG. 5 is used as the non-directive pixel. Meanwhile, in the pixels 121aB for exposure, a white or transparent color filter is provided or no color filter is provided. Accordingly, the pixels 121aB for exposure have a light reception sensitivity higher than that of the pixels 121aA for restoration. It is to be noted that, if the pixels 121aB for exposure have a light reception sensitivity higher than that of the pixels 121aA for restoration, then a color filter other than a white or transparent filter may be provided in the pixels 121aB for exposure.

It is to be noted that, in the following description, a detection signal of the pixels 121aA for restoration is referred to as restoring signal and a detection signal of the pixels 121aB for exposure is referred to as exposing signal.

<Processing of Imaging Apparatus 101>

Now, processing of the imaging apparatus 101 is described with reference to FIGS. 28 and 31.

First, an imaging process executed by the imaging device 121 of the imaging apparatus 101 is described with reference to a flow chart of FIG. 28 and a timing chart of FIG. 29. It is to be noted that this process is started when the power supply to the imaging apparatus 101 is turned on and is ended when the power supply is turned off.

At step S101, the imaging device 121 starts exposure. For example, at time t1 of FIG. 29, the vertical driving circuit 302 starts exposure of the pixels 121a of the pixel array section 301, namely, exposure of the pixels 121aA for restoration and the pixels 121aB for exposure, under the control of the control circuit 306. Consequently, accumulation of charge is started all at once into the pixels 121a of the pixel array section 301.

At step S102, the imaging device 121 stops the exposure of the pixels 121aB for exposure. For example, at time t2 of FIG. 29, the vertical driving circuit 302 stops exposure of the pixels 121aB for exposure of the pixel array section 301 all at once under the control of the control circuit 306.

At step S103, the imaging device 121 outputs detection signals of the pixels 121aB for exposure. For example, during a period from time t2 to time t3 of FIG. 29, the imaging device 121 performs the following process.

The vertical driving circuit 302 causes the pixels 121aB for exposure of the pixel array section 301 to output a detection signal (namely, an exposing signal) in a unit of a row to the column signal processing circuit 303 under the control of the control circuit 306.

The column signal processing circuit 303 performs CDS for the exposing signal of each pixel 121aB for exposure to perform AD conversion of the exposing signal and removal of reset noise under the control of the control circuit 306.

The horizontal driving circuit 304 causes the column signal processing circuit 303 to sequentially output exposing signals to the outputting circuit 305 through the output signal line 313 under the control of the control circuit 306.

The outputting circuit 305 amplifies and supplies the exposing signals of the pixels 121aB for exposure to the control section 123.

Figure 30:
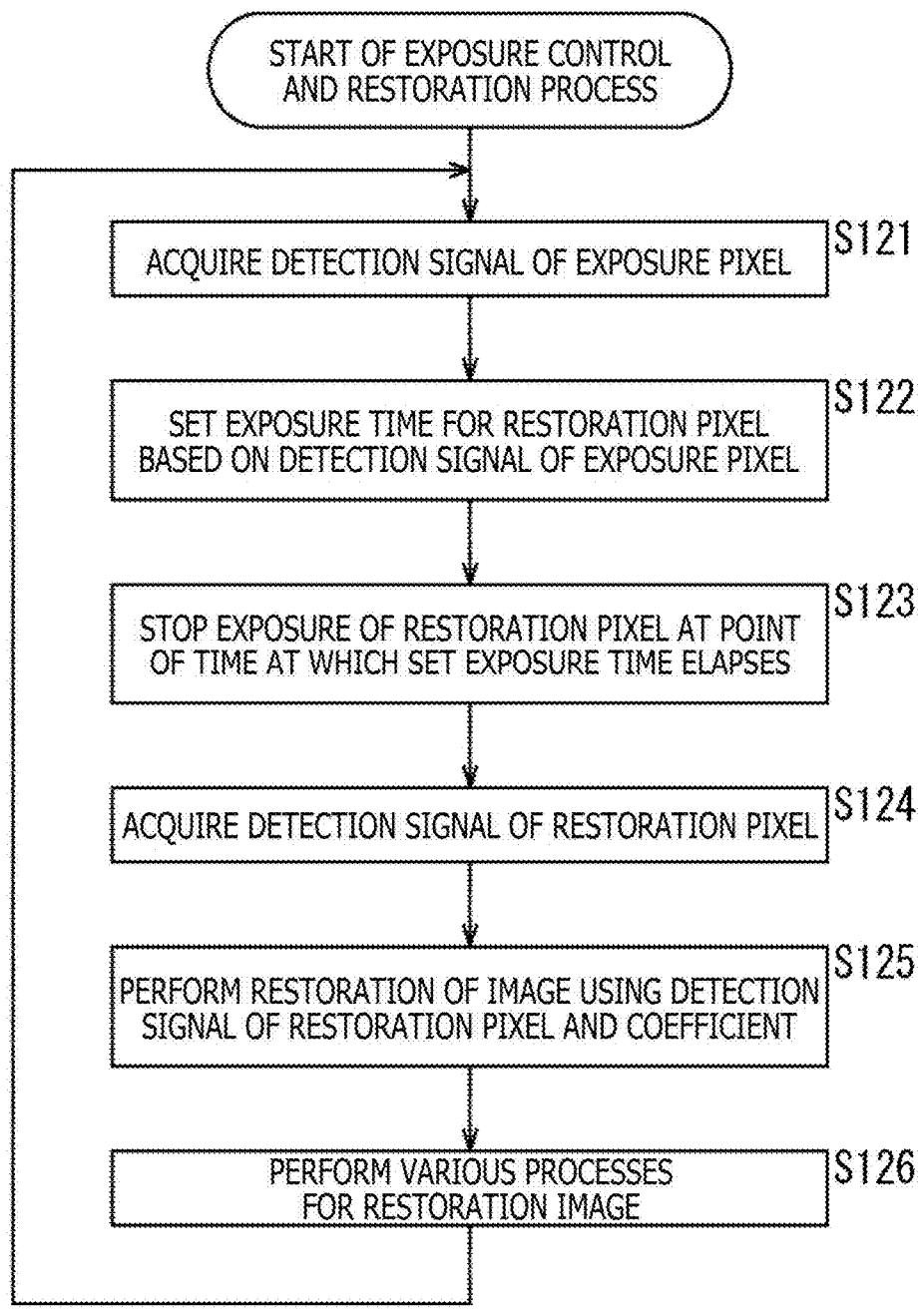
FIG. 30 is a flow chart illustrating exposure control and a restoration process executed by a signal processing controlling section of FIG. 2.

The control section 123 acquires the exposing signals of the pixels 121aB for exposure at step S121 of FIG. 30 hereinafter described, and sets an exposure time period for a pixel for restoration on the basis of the acquired exposing signal at step S122. Further, at step S123, the control section 123 supplies, at a point of time at which the set exposure time period elapses, a signal for the instruction to stop exposure of the pixels 121aA for restoration to the control circuit 306 of the imaging device 121.

At step S104, the imaging device 121 stops the exposure of the pixels 121aA for restoration in accordance with the instruction. For example, at time t5 at which the exposure time period set by the control section 123 elapses after time t1 of FIG. 29, the control circuit 306 acquires a signal for the instruction to stop exposure of the pixels 121aA for restoration from the control section 123. The vertical driving circuit 302 stops exposure of the pixels 121aA for restoration of the pixel array section 301 all at once under the control of the control circuit 306.

At step S105, the imaging device 121 performs a process similar to that at step S103 to output detection signals (restoring signals) of the pixels 121aA for restoration. However, different from the process at step S103, the restoring signal of each pixels 121aA for restoration is supplied to the restoration section 122.

Thereafter, the processing returns to step S101, and the processes at the steps beginning with step S101 are executed repeatedly. Consequently, for example, at time t7 to time t14 of FIG. 29, processes similar to those at time t1 to time t5 are executed by the imaging device 121.

It is to be noted that, in the case where the rolling shutter method is applied to the exposure method of the imaging device 121, exposure of the pixels 121aA for restoration and the pixels 121aB for exposure is sequentially started in a unit of a row. Further, exposure of the pixels 121aB for exposure is sequentially stopped in a unit of a row. Furthermore, exposure of the pixels 121aA for restoration is sequentially stopped in a unit of a row.

Figure 28:
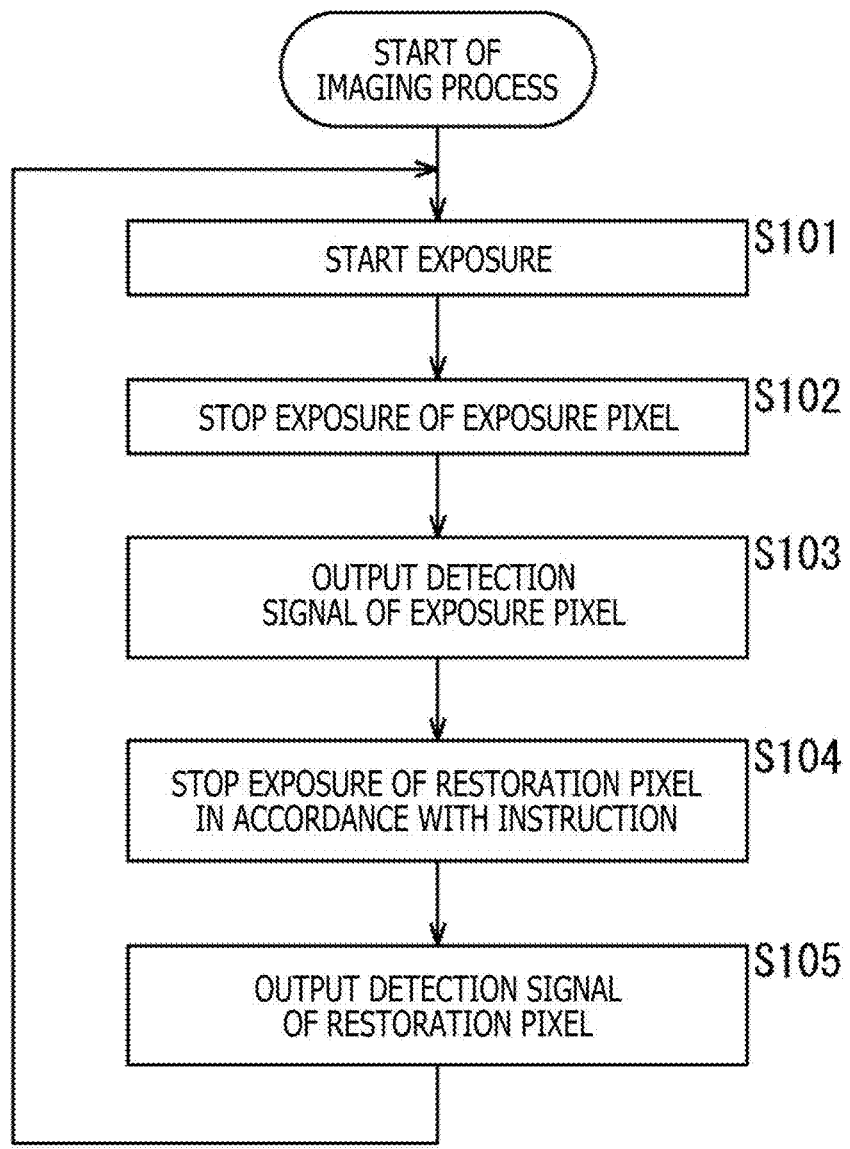
FIG. 28 is a flow chart illustrating an imaging process executed by the imaging device of FIG. 26.

Now, exposure control and restoration processes executed by the signal processing controlling section 111 of the imaging apparatus 101 corresponding to the imaging process of FIG. 28 are described with reference to a flow chart of FIG. 30 and a timing chart of FIG. 29.

At step S121, the control section 123 acquires detection signals of the pixels 121aB for exposure. In particular, the control section 123 acquires exposing signals of the pixels 121aB for exposure outputted from the imaging device 121 at step S103 of FIG. 28 described hereinabove.

At step S122, the control section 123 sets an exposure time period for the pixels 121aA for restoration on the basis of the detection signals of the pixels 121aB for exposure. For example, during a period from time t3 to time t4 of FIG. 29, the control section 123 performs the following processes.

For example, the control section 123 calculates an average value of detection signal levels of the exposing signals of the pixels 121aB for exposure.

Then, the control section 123 calculates an increasing rate of the detection signal level of the exposing signal on the basis of the average value of the detection signal levels of the exposing signals.

Figure 31:
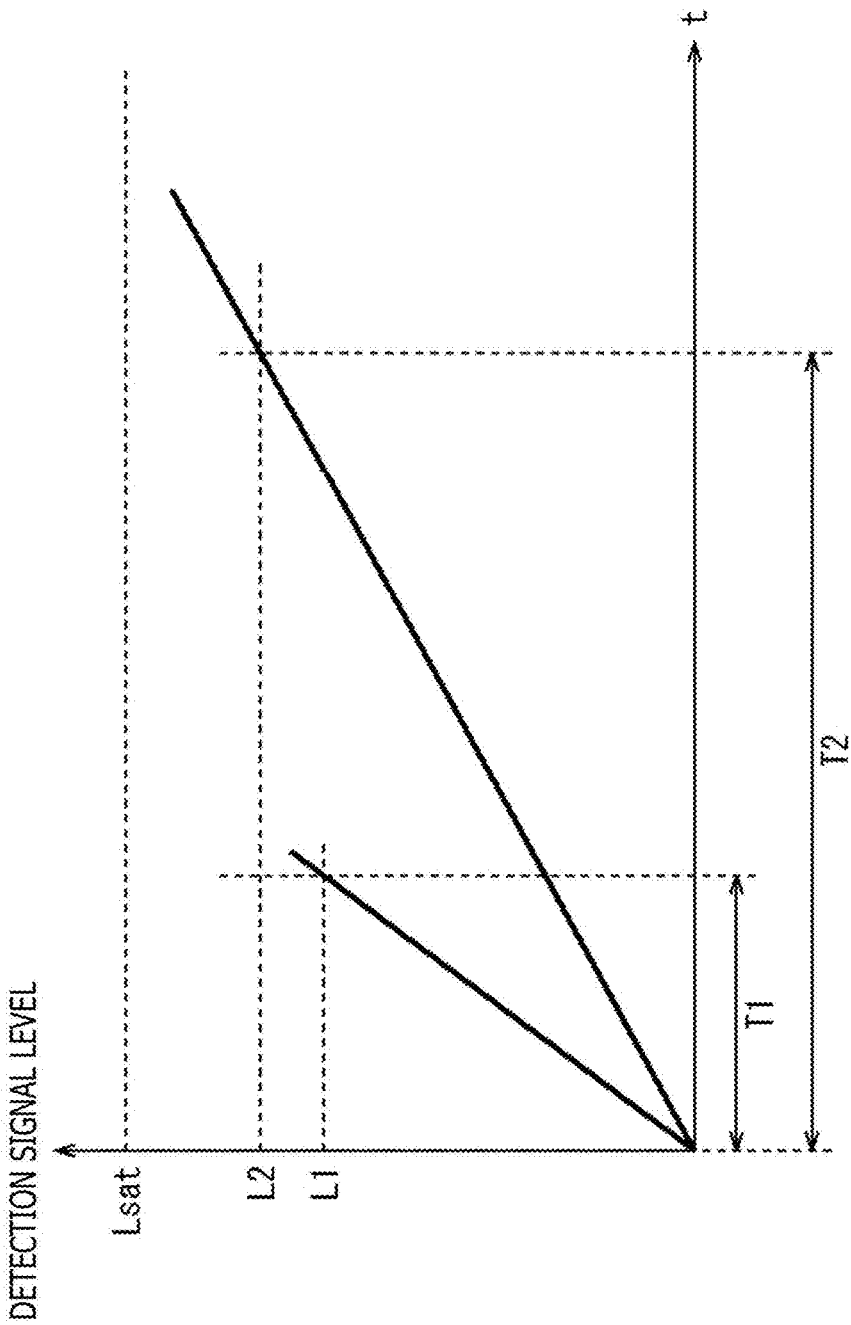
FIG. 31 is a view illustrating a setting method of an exposure time period for a pixel for restoration.

FIG. 31 depicts an example of a transition of the detection signal level of the pixels 121aA for restoration and the pixels 121aB for exposure. The axis of abscissa of FIG. 31 indicates the exposing time period and the axis of ordinate indicates the detection signal level.

For example, in the case where the average value of the detection signal levels of the exposing signals reaches a level L1 in an exposure period T1 (for example, from time t1 to time t2 of FIG. 29) of the pixels 121aB for exposure of FIG. 31, the increasing rate of the detection signal level of the exposing signal is L1/T1.

Then, the control section 123 infers an increasing rate of the detection signal level of the restoring signal on the basis of the increasing rate of the detection signal level of the exposing signal. For example, the ratio between the increasing rate of the detection signal level of the exposing signal and the increasing rate of the detection signal level of the restoring signal (hereinafter referred to as increasing rate ratio) is set in advance by an experiment, calculation or the like. The control section 123 estimates an increasing rate of the detection signal level of the restoring signal on the basis of the calculated increasing rate of the detection signal level of the exposing signal and the increasing rate ratio set in advance.

It is to be noted that the increasing rate ratio is set, for example, with reference to the pixel 121aA for restoration having the highest sensitivity among the pixels 121aA for restoration. Here, the pixel 121aA for restoration having the highest sensitivity is, for example, a pixel 121aA for restoration in which the light shielding area of the light shielding film 121b is smallest.

Then, the control section 123 predicts an exposure time period T2 in which the detection signal level of the pixel 121aA for restoration reaches a predetermined level L2 on the basis of the estimated increasing rate of the detection signal level of the restoring signal. The level L2 is set, for example, to a value lower than a detection signal level Lsat in the case where the pixel 121a is saturated. It is to be noted that the level L2 is preferably set to a value as high as possible within a range within which the pixel 121aA for restoration is not saturated.

Then, the control section 123 sets the calculated exposure time period T2 to an exposure time period for the pixels 121aA for restoration.

At step S123, the control section 123 causes the exposure of the pixels 121aA for restoration to stop at a point of time at which the set exposure time period elapses. For example, the control section 123 supplies a signal for the instruction to stop the exposure of the pixels 121aA for restoration to the control circuit 306 of the imaging device 121 at time t5 at which the exposure time period T2 of FIG. 31 elapses after time t1 of FIG. 29. Then, at step S104 of FIG. 28 described hereinabove, the control circuit 306 of the imaging device 121 stops the exposure of the pixels 121aA for restoration.

At step S124, the restoration section 122 acquires the detection signals of the pixels 121aA for restoration. In particular, at step S105 of FIG. 28 described hereinabove, the restoration section 122 acquires a detection image including restoring signals of the pixels 121aA for restoration outputted from the imaging device 121.

At step S125, the restoration section 122 performs restoration of an image using the detection signals (detection image) and the coefficient of the pixels 121aA for restoration similarly as in the process at step S103 of FIG. 20 described hereinabove.

At step S126, various processes are performed for the restoration image similarly to the processes at step S104 of FIG. 20 described hereinabove.

Figure 29:
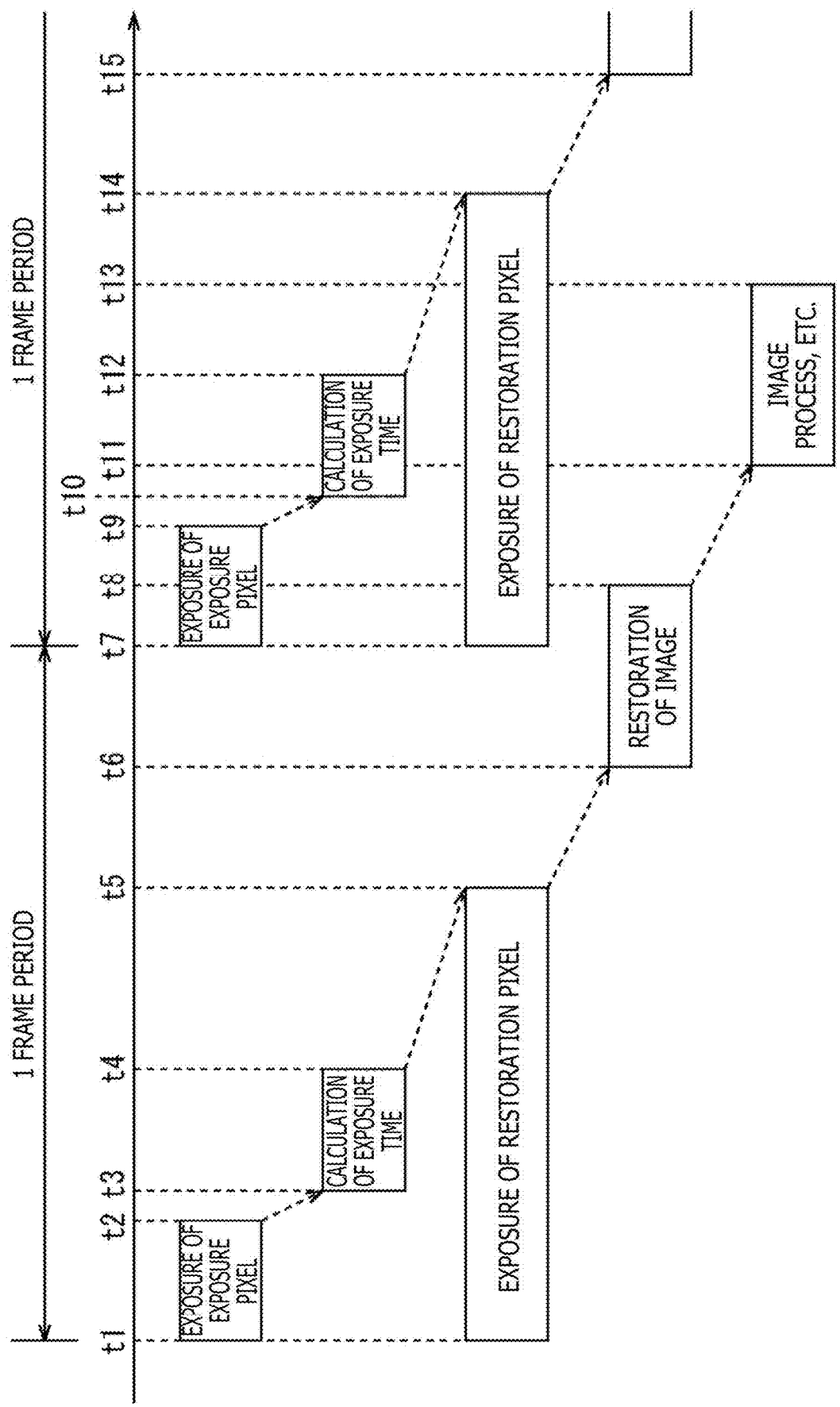
FIG. 29 is a timing chart illustrating processing of the imaging apparatus of FIG. 2.

It is to be noted that FIG. 29 depicts an example in which a restoration process of a restoration image is performed within a period from time t6 to time t8 and various processes are performed for the restoration image within a period from time t11 to time t13. However, since processing of the imaging device 121 and processing of the restoration section 122 can be executed independently of and in parallel to each other, the timings at which the restoration process of a restoration image and the various processes for the restoration image are performed are not restricted to those in the present example.

Further, the restoration process of a restoration image need not necessarily be performed at the time of imaging, and, for example, a detection image may be recorded into the storage section 128 such that, at a desired timing after imaging, a restoration process is performed.

Thereafter, the processing returns to step S121 and the processes at the steps beginning with step S121 are executed.

Since occurrence of saturation of the pixels 121aA for restoration is suppressed in such a manner as described above, the restoration accuracy of the restoration image is improved. Further, by appropriately adjusting the level L2 of FIG. 31, the light reception amount of the pixels 121aA for restoration can be increased as far as possible within a range within which the pixels 121aA for restoration are not saturated, and the SN ratio of the restoration image (detection image) is improved. As a result, the image quality of the restoration image is improved.

Further, since an imaging lens is not provided in the imaging apparatus 101 as described above, the light intensity of incident light to the pixels 121a of the imaging device 121 is almost uniform irrespective of the distribution of the luminance of the imaging target or the position of the pixel 121a. In other words, due to the distribution of the luminance of the imaging target, little dispersion of the light intensity of incident light to the pixels 121a occurs. Accordingly, by controlling the exposure time period for the pixels 121aA for restoration on the basis of the detection signal level of the pixel 121aB for exposure having a sensitivity higher than that of the pixels 121aA for restoration, occurrence of saturation of the pixels 121aA for restoration can be suppressed with certainty irrespective of the distribution of the luminance of the imaging target.

<Installation Number and Arrangement of Pixel 121aB for Exposure>

It is sufficient if at least only one pixel 121aB for exposure is provided in the pixel array section 301. However, in order to avoid influence of noise and so forth, it is preferable to provide a plurality of pixels 121aB for exposure. On the other hand, since the light intensity of incident light to the pixels 121a of the imaging device 121 is substantially uniform irrespective of the distribution of the luminance of the imaging target as described hereinabove, there is little necessity to take the dispersion of the light reception amount of the pixel 121aB for exposure into consideration. Accordingly, the number of pixels 121aB for exposure can be suppressed small.

Further, although the light intensity of incident light entering the pixels 121a of the pixel array section 301 is almost uniform in principle, the light intensity of incident light is sometimes higher toward the middle of the pixel array section 301. Accordingly, it is preferable to dispose the pixel 121aB for exposure at a position near to the middle of the pixel array section 301. Further, in the case where a plurality of pixels 121aB for exposure is provided, it is preferable to arrange the pixels 121aB for exposure in a somewhat spaced relation to each other without arranging them at positions very near to each other.

Furthermore, the present disclosure can be applied to both the case where a monochromatic image is to be captured and the case where a color image is to be captured. Further, in the case where a color filter is provided for each pixel 121a, it is preferable to arrange the pixel 121aB for exposure at a position of a pixel 121a of a color having a low influence when a restoration image is restored.

Figure 32:
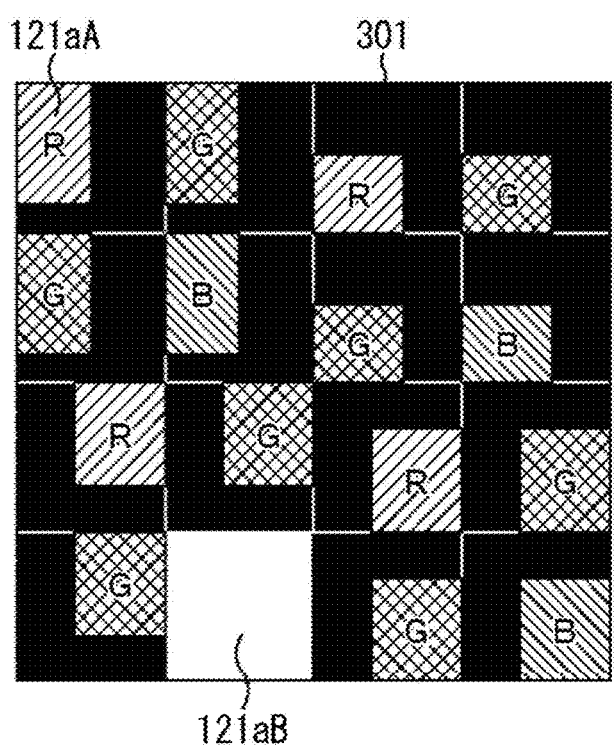
FIG. 32 is a view depicting a modification of a configuration of the pixel array section of FIG. 26.

For example, FIG. 32 depicts an example of arrangement of the pixel 121aB for exposure in the case where the pixels 121aA for restoration are arranged in accordance with the Bayer array. It is to be noted that a pixel 121aA for restoration denoted by R in the figure is a pixel 121aA for restoration on which a red color filter is provided and is hereinafter referred to merely as red pixel 121aA for restoration. A pixel 121aA for restoration denoted by G is a pixel 121aA for restoration on which a green color filter is provided and is hereinafter referred to merely as green pixel 121aA for restoration. A pixel 121aA for restoration denoted by B is a pixel 121aA for restoration on which a blue color filter is provided and is hereinafter referred to merely as blue pixel 121aA for restoration. Further, a black portion in FIG. 32 denotes the light shielding film 121b.

In this example, a pixel 121aB for exposure is arranged in place of a blue pixel 121aA for restoration at some of positions at which the blue pixels 121aA for restoration are arranged in the Bayer array. This is because the blue pixel 121aA for restoration is low in contribution to the luminance and, even if the restoration accuracy of a blue pixel in the restoration pixels decreases a little, this is less likely to stand out.

Further, for example, the pixels 121aA for restoration may be arranged in a rectangular region in the pixel array section 301 while the pixel 121aB for exposure is arranged around the region.

Modification of First Embodiment

Although the foregoing description is given of an example in which exposure of the pixels 121aA for restoration and exposure of the pixel 121aB for exposure is started at the same time, they need not necessarily be started at the same time. For example, after exposure of the pixel 121aB for exposure is performed first and then the exposure of the pixel 121aB for exposure is stopped, exposure of the pixel 121aA for restoration may be performed.

Further, although the foregoing description is directed to an example in which the exposure periods of the pixels 121aA for restoration are adjusted to each other, the present disclosure can be applied also in the case where the exposure period of the pixels 121aA for restoration is shifted for one row or for a plurality of rows.

Furthermore, although the foregoing description is directed to an example in which the exposure time period of the pixels 121aA for restoration is controlled on the basis of an exposing signal outputted from the pixel 121aB for exposure within a same frame period, the exposure time period of the pixels 121aA for restoration may be controlled on the basis of an exposing signal outputted from the pixel 121aB for exposure within a frame period preceding by one or more frame periods.

Further, the exposure time period of the pixels 121aA for restoration may be controlled, for example, for each pixel or for each row. In this case, restoration of the image is performed after the detection signal level of the pixels 121aA for restoration is multiplied by the (maximum exposure time period/actual exposure time period) to convert (normalize) the detection signal level of the pixels 121aA for restoration into a level in the case where the pixels 121aA for restoration are exposed for a maximum exposure time period.

Furthermore, the exposing signal of the pixel 121aB for exposure may be used for restoration of an image. In this case, restoration of the image is performed after the detection signal level of the pixel 121aB for exposure is converted into a level in the case where the pixel 121aB for exposure is exposed for a period of time equal to the exposure period of time of the pixels 121aA for restoration, for example, by multiplying the detection signal level of the pixel 121aB for exposure by the (exposure time period of the pixels 121aA for restoration/exposure time period of the pixel 121aB for exposure).

4. Second Embodiment

Now, a second embodiment of the present disclosure is described with reference to FIG. 33.

While the first embodiment described above is directed to an example in which the exposure time period for the pixels 121aA for restoration is controlled to suppress occurrence of saturation of the pixels 121aA for restoration, in the second embodiment, occurrence of saturation of the pixels 121aA for restoration is suppressed by performing exposure control using an ND (Neutral Density) filter.

<Example of Configuration of Imaging Apparatus 401>

Figure 33:
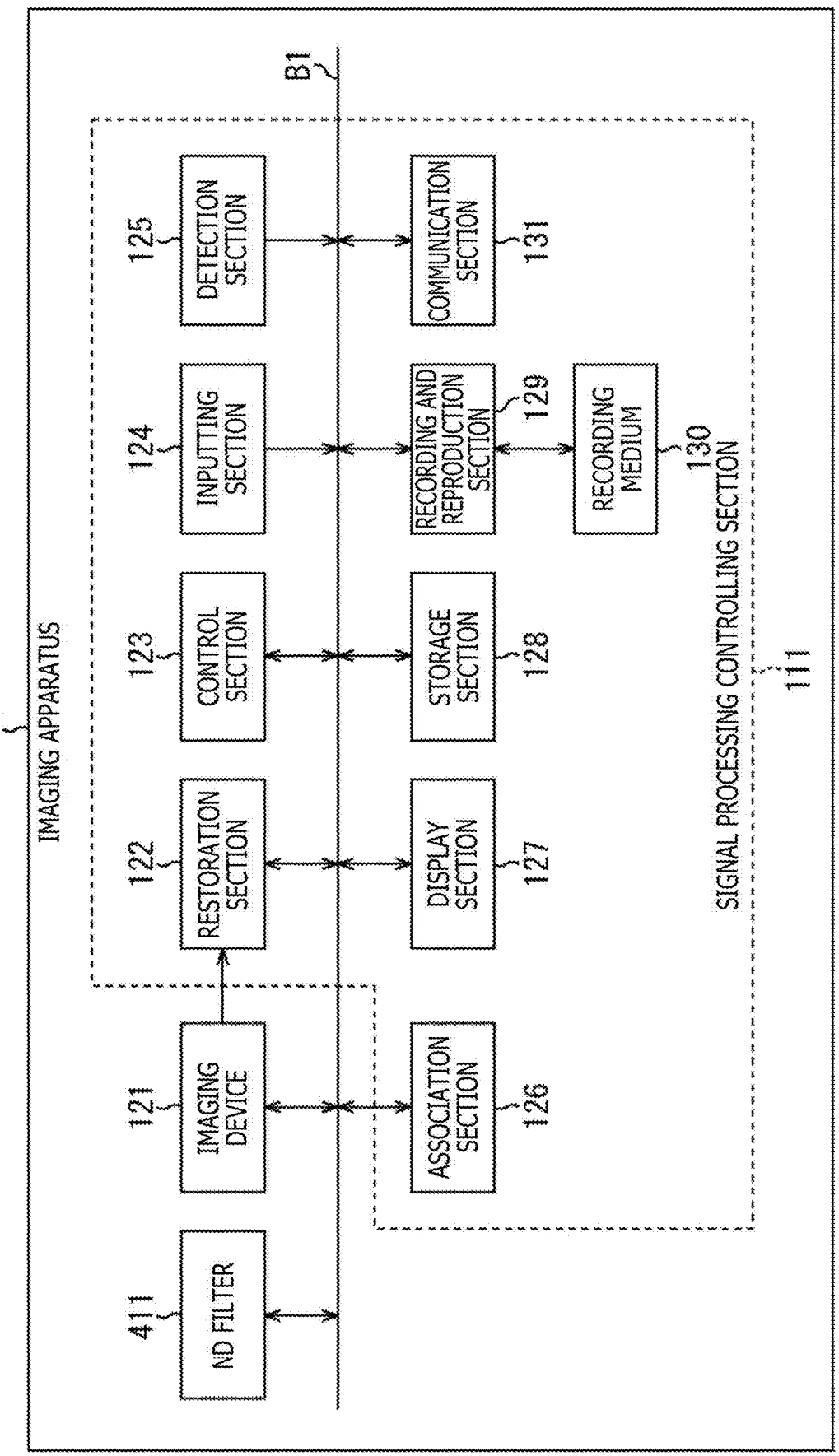
FIG. 33 is a block diagram depicting an example of a configuration of a second embodiment of an imaging apparatus.

FIG. 33 is a block diagram depicting an example of a configuration of an imaging apparatus 401 according to the second embodiment of the preset disclosure. It is to be noted that, in the figure, elements corresponding to those of the imaging apparatus 101 of FIG. 2 are denoted by the same reference signs and description of them is omitted suitably.

The imaging apparatus 401 is different in comparison with the imaging apparatus 101 in that it includes an ND (Neutral Density) filter 411.

The ND filter 411 is arranged between an imaging target and the light reception face of the imaging device 121 and decreases the light intensity of incident light in almost all wavelength bands entering the imaging device 121 substantially equally.

It is to be noted that the ND filter 411 may have a dimming rate of any of the fixed type and the variable type. In the case where the dimming rate is variable, the ND filter 411 is configured, for example, from an electronic variable ND filter whose dimming rate can be changed by electronic control.

For example, in the case where the dimming rate of the ND filter 411 is fixed, an insertion/extraction mechanism (not depicted) is provided which is operable to insert the ND filter 411 between the imaging target and the light reception face of the imaging device 121 and retract the ND filter 411 from between the imaging target and the light reception face of the imaging device 121. Thus, the control section 123 controls the insertion/extraction mechanism on the basis of a detection signal level of an exposing signal of the pixel 121aB for exposure to control insertion/extraction of the ND filter 411.

For example, in the case where the average value of the detection signal level of exposing signals of the pixels 121aB for exposure is lower than a predetermined threshold value, the control section 123 controls the insertion/extraction mechanism to remove the ND filter 411 from between the imaging target and the light reception face of the imaging device 121. By this, it is prevented that the light reception amount of the pixels 121aA for restoration is attenuated by the ND filter 411, and as a result, the SN ratio of the detection image (restoration image) is improved.

On the other hand, in the case where the average value of the detection signal level of exposing signals of the pixels 121aB for exposure is equal to or higher than the predetermined threshold value, the control section 123 controls the insertion/extraction mechanism to insert the ND filter 411 between the imaging target and the light reception face of the imaging device 121. By this, the light intensity of incident light to the imaging device 121 decreases, and occurrence of saturation of the pixels 121aA for restoration of the imaging device 121 is suppressed.

In contrast, in the case where the ND filter 411 includes an electronic variable ND filter, for example, the control section 123 controls the dimming rate of the ND filter 411 on the basis of the detection signal level of the exposing signal of the pixel 121aB for exposure.

For example, in the case where the average value of the detection signal level of exposing signals of the pixels 121aB for exposure is equal to or higher than a predetermined threshold value, the control section 123 sets the dimming rate for the ND filter 411 to 0 such that incident light to the ND filter 411 enters as it is into the imaging device 121 without dimming the same. Consequently, the light reception amount of the pixels 121aA for restoration is attenuated by the ND filter 411, and as a result, the SN ratio of the detection image (restoration image) is suppressed from being lowered.

On the other hand, in the case where the average value of the detection signal level of the exposing signals of the pixels 121aB for exposure is lower than a predetermined threshold value, the control section 123 adjusts the dimming rate of the ND filter 411 on the basis of the average value. Consequently, the light intensity of incident light to the imaging device 121 decreases and occurrence of saturation of the pixels 121aA for restoration of the imaging device 121 is suppressed. Further, by adjusting the dimming rate of the ND filter 411 appropriately, the light reception amount of the pixels 121aA for restoration can be increased as much as possible, and the SN ratio of the detection image (restoration image) is improved.

It is to be noted that the ND filter 411 may be provided solely or may be provided together with an exchangeable lens such as a zoom lens. In the latter case, for example, the ND filter 411 is provided in the exchangeable lens or is mounted between the exchangeable lens and the imaging apparatus 401. It is to be noted that, in the case where the ND filter 411 includes an electronic variable ND filter, the ND filter 411 need not necessarily be insertable/extractable into/from the imaging apparatus 401 but may be provided fixedly to the imaging apparatus 401.

5. Modifications

In the following, modifications of the embodiments of the present disclosure described above are described.

<Modification Relating to Exposure Control>

For example, the control section 123 or the control circuit 306 of the imaging device 121 may adjust the value of an analog gain to be applied, before a restoring signal outputted from each pixel 121aA for restoration is inputted to the AD conversion section (not depicted) of the column signal processing circuit 303, to the restoring signal on the basis of an average value of the detection signal level of the exposing signals of the pixels 121aB for exposure. This suppresses such a situation that the light intensity of incident light from an imaging target is so high that the detection signal level of the restoring signal after amplified with the analog gain exceeds the dynamic range of the AD conversion section to cause saturation of the restoring signal.

Further, the exposure control described above may be performed using a value other than the average value of the detection signal level of the exposing signals, for example, a maximum value or an intermediate value of the detection signal level of the exposing signals.

Furthermore, although the foregoing description is given of an example in which the exposure control of the imaging device 121 (pixels 121aA for restoration) is performed mainly by the control section 123, the exposure control may otherwise be performed mainly, for example, by the control circuit 306 of the imaging device 121 (pixels 121aA for restoration).

<Modification Relating to Imaging Device 121>

For example, it is possible to adopt, as the shape of the light shielding film 121b of each pixel 121a, a shape of a type other than the horizontal belt type, vertical belt type, L-shaped type and type having a rectangular opening.

Further, although, for example, the imaging device 121 described hereinabove with reference to FIG. 5 is directed to an example in which four photodiodes 121f in two rows×two columns are provided in one pixel 121a, the number and arrangement of the photodiodes 121f are not restricted to those of the example.

Figure 34:
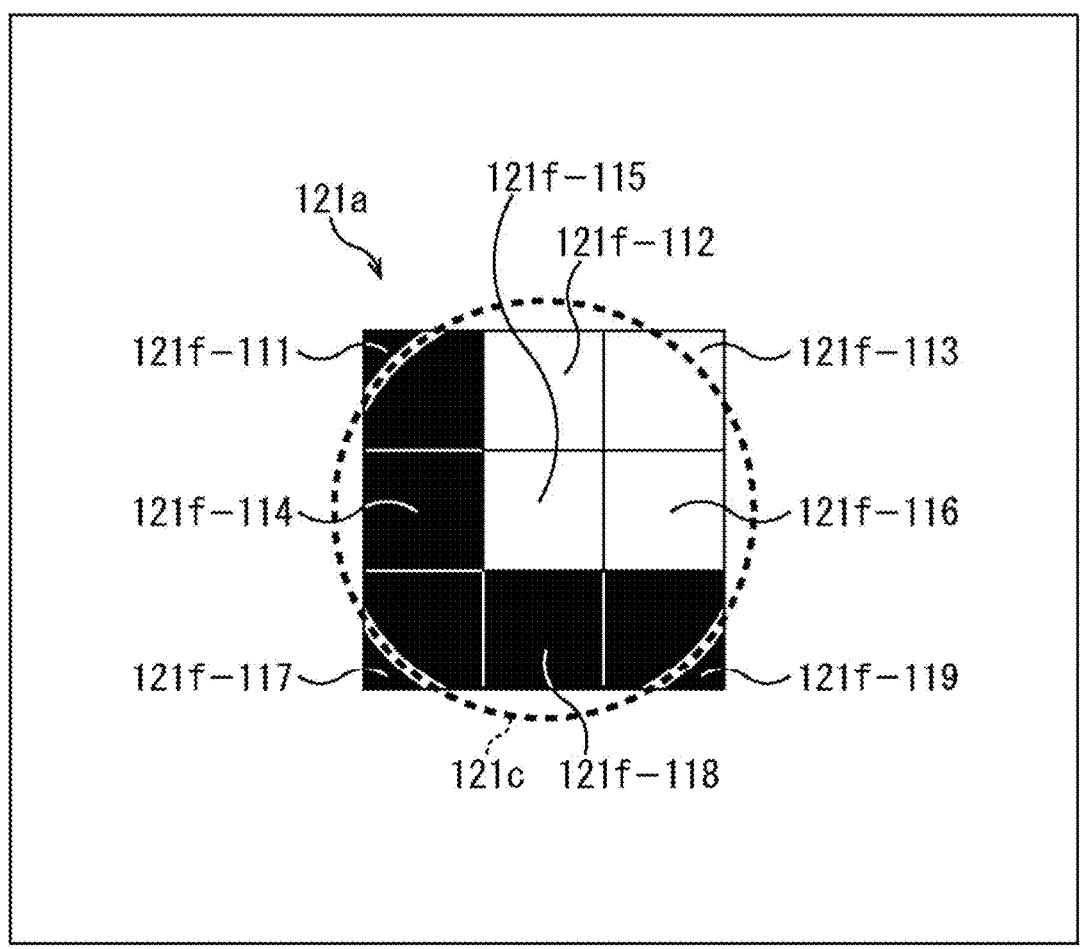
FIG. 34 is a view depicting a modification of the imaging device of FIG. 5.

For example, as depicted in FIG. 34, one pixel 121a may include nine photodiodes 121f-111 to 121f-119 lined up in three rows×three columns may be provided for one on-chip lens 121c. In other words, one pixel output unit may include nine photodiodes 121f.

Then, for example, by not reading out signals of five pixels of the photodiodes 121f-111, 121f-114, and 121f-117 to 121f-119, an incident angle characteristic substantially similar to that of a pixel 121a that includes an L-shaped light shielding film 121b that is set to the range of the photodiodes 121f-111, 121f-114, and 121f-117 to 121f-119 can be obtained.

In this manner, an incident angle characteristic similar to that in the case where the light shielding film 121b is provided can be obtained without providing the light shielding film 121b. Further, by switching the pattern of the photodiodes 121f from which a signal is not read out, the incident angle directivity can be changed similarly to that in the case where the position and the range shielded by the light shielding film 121b are changed.

Further, while the foregoing description is directed to an example in which one pixel output unit includes one pixel 121a, also it is possible to configure one pixel output unit from a plurality of pixels 121a.

Figure 35:
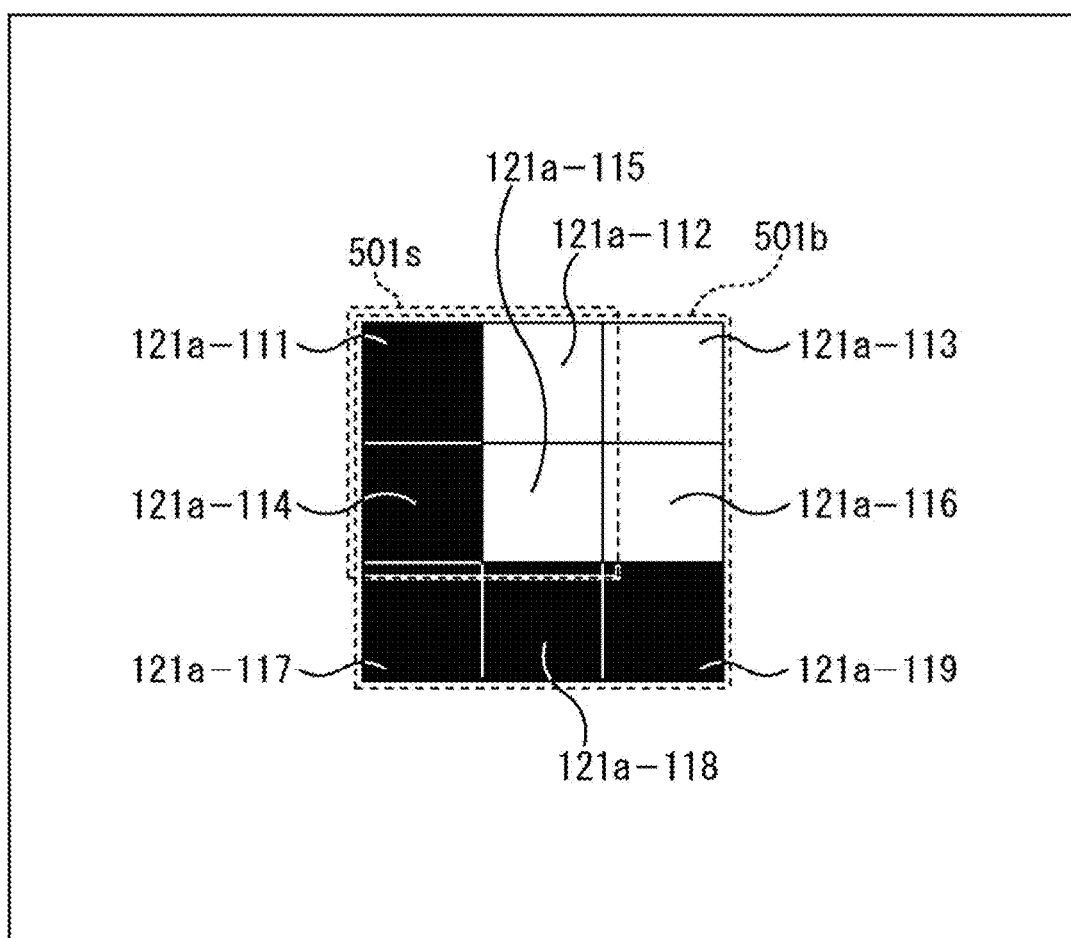
FIG. 35 is a view illustrating a modification of a pixel output unit.

For example, it is possible to configure one pixel output unit 501b from pixels 121a-111 to 121a-119 lined up in three rows×three columns as depicted in FIG. 35. It is to be noted that each of the pixels 121a-111 to 121a-119 includes, for example, one photodiode but does not include an on-chip lens.

For example, it is possible to implement an incident angle directivity of the pixel output unit 501b by adding pixel signals from the pixels 121a to generate a detection signal for one pixel of a detection image and stopping outputting or avoiding addition of pixel signals from some of the pixels 121a. For example, by adding pixel signals of the pixels 121a-112, 121a-113, 121a-115, and 121a-116 to generate a detection signal, an incident angle directivity can be obtained which is similar to that in the case where the L-shaped light shielding film 121b is provided in the range of the pixels 121a-111, 121a-114, and 121a-117 to 121a-119.

Further, by switching the pattern of the pixels 121a in which a pixel signal is added to a detection signal, the incident angle directivity can be set to a different value similarly as in the case where the position and the range shielded by the light shielding film 121b are changed.

Furthermore, in this case, it is possible to change the range of a pixel output unit, for example, by changing the combination of the pixels 121a. For example, a pixel output unit 501s can have pixels 121a of two rows×two columns including the pixels 121a-111, 121a-112, 121a-114, and 121a-115.

Further, it is possible to set a range of a pixel output unit later, for example, by recording pixel signals of all pixels 121a in advance and setting a combination of the pixels 121a later. Furthermore, by selecting, from among the pixels 121a in the set pixel output unit, a pixel 121a whose pixel signal is to be added to the detection signal, an incident angle directivity of a pixel output unit can be set later.

Other Modifications

Further, it is possible to apply the present disclosure also to an imaging apparatus or an imaging device that performs imaging of light of a wavelength other than visible rays such as infrared rays. In this case, the restoration image does not become an image in which an imaging target can be recognized by visual observation of the user but becomes an image in which the user cannot view the imaging target. It is to be noted that, since an ordinary imaging lens is difficult to transmit far infrared light, the present technology is effective, for example, in the case where imaging of far infrared light is to be performed. Accordingly, the restoration image may be an image of far infrared light and may be an image not of far infrared light but of other visible light or non-visible light.

Furthermore, for example, by applying mechanical learning such as deep learning, also it is possible to perform image recognition and so forth without using a restoration image after restoration but using a detection image before restoration. Also in this case, by using the present technology, the accuracy in image recognition using a detection image before restoration is improved. In other words, the image quality of a detection image before restoration is improved.

6. Others

The series of processes described above not only can be executed by hardware but also can be executed by software. In the case where the series of processes is executed by software, a program that constructs the software is installed into a computer. Here, the computer includes a computer incorporated in hardware for exclusive use (for example, the control section 123 and so forth).

The program to be executed by a computer is recorded on and provided as, for example, a recording medium (such as the recording medium 130 or the like) as a package medium or the like. Further, the program may be provided through a wired or wireless transmission medium such as a local area network, the Internet or a digital broadcast.

It is to be noted that the program to be executed by the computer may be a program by which processing is performed in a time series in accordance with the sequence described in the present specification or may be a program by which processing is performed in parallel or at a necessary timing such as when the program is called.

Further, the embodiment of the present technology is not limited to the embodiments described hereinabove, and various alterations can be made without departing from the subject matter of the present technology.

For example, the present technology can assume a configuration for cloud computing in which one function is shared and processed cooperatively by a plurality of devices through a network.

Further, the steps described hereinabove in connection with the flow charts can be executed by a single apparatus or can be executed by sharing by a plurality of apparatus.

Furthermore, where one step includes a plurality of processes, the plurality of processes included in the one step can be executed by a single device and also can be executed by sharing by a plurality of devices.

It is to be noted that the present disclosure can take such configurations as described below.

(1)
An imaging apparatus including:
an imaging device including a plurality of directive pixel output units that receives incident light from an imaging target entering without intervention of any of an imaging lens and a pinhole and has a configuration capable of independently setting an incident angle directivity indicative of a directivity to an incident angle of the incident light and a non-directive pixel output unit that receives the incident light entering without the intervention of any of an imaging lens and a pinhole and does not have a configuration for providing the incident angle directivity; and
an exposure controlling section configured to perform exposure control of the plurality of directive pixel output units on the basis of a non-directive detection signal that is a detection signal outputted from the non-directive pixel output unit.

(2)
The imaging apparatus according to (1) above, in which
the non-directive pixel output unit has a light reception sensitivity higher than that of the directive pixel output units.

(3)
The imaging apparatus according to (1) or (2) above, in which
the exposure controlling section controls insertion/extraction of an ND (Neutral Density) filter between/from between the imaging target and a light reception face of the imaging device on the basis of the non-directive detection signal.

(4)
The imaging apparatus according to (1) or (2) above, in which
the exposure controlling section adjusts a dimming degree of a variable ND (Neutral Density) filter that dims incident light to the imaging device on the basis of the non-directive detection signal.

(5)
The imaging apparatus according to any one of (1) to (4) above, in which
the exposure controlling section controls exposure time of the plurality of directive pixel output units on the basis of the non-directive detection signal.

(6)
The imaging apparatus according to any one of (1) to (5) above, in which
the exposure controlling section controls a gain for a detection signal outputted from the plurality of directive pixel output units on the basis of the non-directive detection signal.

(7)
The imaging apparatus according to any one of (1) to (6) above, in which
the directive pixel output units each include
one photodiode, and
a light shielding film configured to intercept incidence of part of the incident light to the photodiode, and
the non-directive pixel output unit includes one photodiode.

(8)
The imaging apparatus according to any one of (1) to (6) above, in which
the directive pixel output units each include a plurality of photodiodes and output one detection signal to which some of the plurality of photodiodes contribute, and
the non-directive pixel output unit includes a plurality of photodiodes and outputs one detection signal to which all of the plurality of photodiodes contribute.

(9)

An exposure controlling method including:

an exposure controlling step of performing exposure control of a plurality of directive pixel output units, which receives incident light from an imaging target entering without intervention of any of an imaging lens and a pinhole and has a configuration capable of independently setting an incident angle directivity indicative of a directivity to an incident angle of the incident light, on the basis of a non-directive detection signal that is a detection signal outputted from a non-directive pixel output unit that receives the incident light entering without the intervention of any of an imaging lens and a pinhole and does not have a configuration for providing the incident angle directivity.

(10)

A program for causing a computer of an imaging apparatus, which includes an imaging device including a plurality of directive pixel output units that receives incident light from an imaging target entering without intervention of any of an imaging lens and a pinhole and has a configuration capable of independently setting an incident angle directivity indicative of a directivity to an incident angle of the incident light and a non-directive pixel output unit that receives the incident light entering without the intervention of any of an imaging lens and a pinhole and does not have a configuration for providing the incident angle directivity, to execute a process including: an exposure controlling step of performing exposure control of the plurality of directive pixel output units on the basis of a non-directive detection signal that is a detection signal outputted from the non-directive pixel output unit.

(11)

An imaging device including:

a plurality of directive pixel output units that receives incident light from an imaging target entering without intervention of any of an imaging lens and a pinhole and has a configuration capable of independently setting an incident angle directivity indicative of a directivity to an incident angle of the incident light; and a non-directive pixel output unit that receives the incident light entering without the intervention of any of an imaging lens and a pinhole and does not have a configuration for providing the incident angle directivity, has a light reception sensitivity higher than that of the directive pixel output units, and is used for exposure control of the plurality of directive pixel output units.

(12)

The imaging device according to (11) above, in which a detection image in which an image of the imaging target is not formed is generated from a detection signal outputted from the plurality of directive pixel output units.

(13)

The imaging device according to (11) or (12) above, in which the directive pixel output units each include one photodiode, and a light shielding film configured to intercept incidence of part of the incident light to the photodiode, and the non-directive pixel output unit includes one photodiode.

(14)

The imaging device according to (11) or (12) above, in which the directive pixel output units each include a plurality of photodiodes and output one detection signal to which some of the plurality of photodiodes contribute, and the non-directive pixel output unit includes a plurality of photodiodes and outputs one detection signal to which all of the plurality of photodiodes contribute.

(15)

The imaging device according to any one of (11) to (14) above, in which the plurality of directive pixel output units has respective color filters provided therein, and the non-directive pixel output unit either has a white or transparent optical filter provided therein or does not have a color filter provided therein.

(16)

The imaging device according to (15) above, in which each of the plurality of directive pixel output units has any one of red, green, or blue color filters provided therein, and the plurality of directive pixel output units is arranged at positions in accordance with a predetermined array, and the non-directive pixel output unit is arranged at some of the positions at which the directive pixel output unit in which the blue color filter is provided is arranged in the predetermined array, in place of the directive pixel output unit.

(17)

The imaging device according to any one of (11) to (16) above, further including:

an exposure controlling section configured to perform exposure control of the plurality of directive pixel output units on the basis of a non-directive detection signal that is a detection signal outputted from the non-directive pixel output unit.

(18)

The imaging device according to (17) above, in which the exposure controlling section controls exposure time of the plurality of directive pixel output units on the basis of the non-directive detection signal.

(19)

The imaging device according to (17) or (18) above, in which the exposure controlling section controls a gain for a detection signal outputted from the plurality of directive pixel output units on the basis of the non-directive detection signal.

It is to be noted that the advantageous effects described in the present specification are exemplary to the last and are not restrictive, and other advantageous effects may be applicable.

REFERENCE SIGNS LIST

101 Imaging apparatus, 111 Signal processing controlling section, 121 Imaging device, 121a, 121a' Pixel, 121aA Pixel for restoration, 121aB Pixel for exposure, 121A Light reception face, 121b Light shielding film, 121c On-chip lens, 121e, 121f Photodiode, 122 Restoration section, 123 Control section, 125 Detection section, 126 Association section, 301 Pixel array section, 302 Vertical driving circuit, 303 Column signal processing circuit, 304 Horizontal driving circuit, 306 Control circuit, 401 Imaging apparatus, 411 ND filter, 501b, 501s Pixel output unit

The invention claimed is:

1. An imaging apparatus, comprising:
an imaging device including:
a plurality of directive pixels, wherein
each directive pixel of the plurality of directive pixels is configured to receive incident light from an imaging target, the incident light enters the plurality of directive pixels without intervention of any of an imaging lens and a pinhole, each directive pixel of the plurality of directive pixels has an incident angle directivity, the incident angle directivity for each directive pixel of the plurality of directive pixels is independently set with respect to an incident angle of the incident light, the incident angle directivity indicates a value of a detection signal modulated based on the incident angle of the incident light at the plurality of directive pixels, and the detection signal is obtained from the plurality of directive pixels; and a non-directive pixel configured to receive the incident light which enters the non-directive pixel without the intervention of any of the imaging lens and the pinhole, wherein the non-directive pixel does not have a configuration that provides an incident angle directivity; and a circuitry configured to control exposure of the plurality of directive pixels based on a non-directive detection signal outputted from the non-directive pixel.

2. The imaging apparatus according to claim 1, wherein the non-directive pixel has a light reception sensitivity higher than a light reception sensitivity of each directive pixel of the plurality of directive pixels.

3. The imaging apparatus according to claim 1, wherein the circuitry is further configured to control one of an insertion or an extraction of a Neutral Density (ND) filter between the imaging target and a light reception face of the imaging device based on the non-directive detection signal.

4. The imaging apparatus according to claim 1, wherein the circuitry is further configured to adjust a dimming degree of a variable ND filter that dims the incident light to the imaging device based on the non-directive detection signal.

5. The imaging apparatus according to claim 1, wherein the circuitry is further configured to control an exposure time of each directive pixel of the plurality of directive pixels based on the non-directive detection signal.

6. The imaging apparatus according to claim 1, wherein the circuitry is further configured to a gain for the detection signal outputted from the plurality of directive pixels based on the non-directive detection signal.

7. The imaging apparatus according to claim 1, wherein each directive pixel of the plurality of directive pixels includes:
   a photodiode, and
   a light shielding film configured to intercept incidence of part of the incident light to the photodiode, and
the non-directive pixel includes a photodiode.

8. The imaging apparatus according to claim 1, wherein each directive pixel of the plurality of directive pixels includes a first plurality of photodiodes, the detection signal is outputted based on charge accumulated by some of the first plurality of photodiodes, the non-directive pixel includes a second plurality of photodiodes, and the non-directive detection signal is outputted based on charge accumulated by all of the second plurality of photodiodes.

9. An exposure controlling method, comprising:
receiving, via plurality of directive pixels, incident light from an imaging target, wherein the incident light enters the plurality of directive pixels without intervention of any of an imaging lens and a pinhole, each directive pixel of the plurality of directive pixels has an incident angle directivity, the incident angle directivity for each directive pixel of the plurality of directive pixels is independently set with respect to an incident angle of the incident light, and the incident angle directivity indicates a value of a detection signal modulated based on the incident angle of the incident light at the plurality of directive pixels, and the detection signal is obtained from the plurality of directive pixels;

receiving a non-directive detection signal outputted from a non-directive pixel, wherein the non-directive pixel receives the incident light without the intervention of any of the imaging lens and the pinhole, and the non-directive pixel does not have a configuration that provides an incident angle directivity; and controlling, via a circuitry, exposure of the plurality of directive pixels based on the non-directive detection signal.

10. A non-transitory computer-readable medium having stored thereon, computer-executable instructions which, when executed by a computer, cause the computer to execute operations, the operations comprising:

receiving, via a plurality of directive pixels, incident light from an imaging target, wherein the incident light enters the plurality of directive pixels without intervention of any of an imaging lens and a pinhole, each directive pixel of the plurality of directive pixels has an incident angle directivity, the incident angle directivity for each directive pixel of the plurality of directive pixels is independently set with respect to an incident angle of the incident light, the incident angle directivity indicates a value of a detection signal modulated based on the incident angle of the incident light at the plurality of directive pixels, and the detection signal is obtained from the plurality of directive pixels;

receiving a non-directive detection signal outputted from a non-directive pixel, wherein the non-directive pixel receives the incident light without the intervention of any of the imaging lens and the pinhole, and the non-directive pixel does not have a configuration that provides an incident angle directivity; and controlling, via a circuitry, exposure of the plurality of directive pixels based on the non-directive detection signal.

11. An imaging device, comprising:
a plurality of directive pixels, wherein
   each directive pixel of the plurality of directive pixels is configured to receive incident light from an imaging target,
      the incident light enters the plurality of directive pixels without intervention of any of an imaging lens and a pinhole,
      each directive pixel of the plurality of directive pixels has an incident angle directivity, the incident angle directivity for each directive pixel of the plurality of directive pixels is independently set with respect to an incident angle of the incident light, the incident angle directivity indicates a value of a detection signal modulated based on the incident angle of the incident light at the plurality of directive pixels, and the detection signal is obtained from the plurality of directive pixels; and a non-directive pixel configured to receive the incident light which enters the non-directive pixel without the intervention of any of the imaging lens and the pinhole, wherein the non-directive pixel does not have a configuration that provides an incident angle directivity, the non-directive pixel has a light reception sensitivity higher than the light reception sensitivity of each directive pixel of the plurality of directive pixels, and the non-directive pixel is used for exposure control of the plurality of directive pixels.

12. The imaging device according to claim 11, wherein a detection image, in which an image of the imaging target is not formed, is generated from the detection signal outputted from the plurality of directive pixels.

13. The imaging device according to claim 11, wherein each directive pixel of the plurality of directive pixels includes:

a photodiode, and a light shielding film configured to intercept incidence of part of the incident light to the photodiode, and the non-directive pixel includes a photodiode.

14. The imaging device according to claim 11, wherein each directive pixel of the plurality of directive pixels includes a first plurality of photodiodes, the detection signal is outputted based on charge accumulated by some of the first plurality of photodiodes, the non-directive pixel includes a second plurality of photodiodes, and a non-directive detection signal is outputted based on charge accumulated by all of the second plurality of photodiodes.

15. The imaging device according to claim 11, wherein each directive pixel of the plurality of directive pixels has a color filter, and the non-directive pixel has one of a white or a transparent optical filter.

16. The imaging device according to claim 15, wherein each directive pixel of the plurality of directive has one of a red color filter, a green color filter, or a blue color filter, the plurality of directive pixels is arranged at positions with respect to a specific array, and the non-directive pixel is arranged at a position of at least one directive pixel, of the plurality of directive pixel, with the blue color filter is in the specific array.

17. The imaging device according to claim 11, further comprising:

a circuitry configured to control exposure of the plurality of directive pixels based on a non-directive detection signal outputted from the non-directive pixel.

18. The imaging device according to claim 17, wherein the circuitry is further configured to control an exposure time of the exposure of plurality of directive pixels based on the non-directive detection signal.

19. The imaging device according to claim 17, wherein the circuitry is further configured to control a gain for the detection signal outputted from the plurality of directive pixels based on the non-directive detection signal.

* * * * *